United States Patent
Kusama et al.

(10) Patent No.: US 9,450,517 B2
(45) Date of Patent: Sep. 20, 2016

(54) DRIVING APPARATUS AND ELECTRIC POWER CONVERTER

(71) Applicant: Panasonic Intellectual Property Management Co., Ltd., Osaka (JP)

(72) Inventors: Fumito Kusama, Osaka (JP); Hajime Hida, Osaka (JP); Shun Kazama, Osaka (JP); Kenji Hanamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 201 days.

(21) Appl. No.: 14/530,733

(22) Filed: Nov. 1, 2014

(65) Prior Publication Data

US 2015/0138858 A1    May 21, 2015

(30) Foreign Application Priority Data

Nov. 15, 2013  (JP) ................................ 2013-237117
Nov. 15, 2013  (JP) ................................ 2013-237118

(51) Int. Cl.
*G05F 1/00*  (2006.01)
*H03K 17/56*  (2006.01)
*H02M 7/537*  (2006.01)
*H02M 3/158*  (2006.01)
*H03K 17/0412*  (2006.01)

(52) U.S. Cl.
CPC ............. *H02M 7/537* (2013.01); *H02M 3/158* (2013.01); *H03K 17/04123* (2013.01); *H03K 2217/009* (2013.01); *H03K 2217/0036* (2013.01)

(58) Field of Classification Search
CPC .......... G05F 1/59; G05F 1/595; H02M 1/08; H02M 1/084; H02M 1/0845; H02M 1/4233; H02M 1/4241; H02M 3/142; H02M 3/145; H02M 3/156; H02M 3/158; H02M 3/1582; H02M 3/1584; H02M 2003/1586; H03K 17/04126; H03K 2217/0045
USPC ................ 323/223–226, 268–272, 282, 289; 363/21.02, 98, 124, 132, 136; 327/408, 327/409, 423, 424, 429
See application file for complete search history.

(56) References Cited

U.S. PATENT DOCUMENTS

| | | | | |
|---|---|---|---|---|
| 6,570,416 | B1 * | 5/2003 | Isurin | H03K 17/04123 327/109 |
| 7,969,225 | B2 * | 6/2011 | Ho | H03K 17/567 327/110 |
| 2006/0028261 | A1 * | 2/2006 | Hsieh | H02M 7/53871 327/423 |
| 2013/0162322 | A1 * | 6/2013 | Tao | H03K 17/04123 327/381 |

FOREIGN PATENT DOCUMENTS

JP  10-052061  2/1998

* cited by examiner

*Primary Examiner* — Adolf Berhane
*Assistant Examiner* — Gary Nash
(74) *Attorney, Agent, or Firm* — McDermott Will & Emery LLP

(57) ABSTRACT

A driving apparatus of the present disclosure includes a coil including a second terminal connected to a control terminal of a switching element, a charging switch connected between a first potential line and a first terminal of the coil, a clamp switch connected between the first potential line and the control terminal of the switching element, a charging diode connected between a second potential line and the first terminal of the coil, and a control circuit that outputs a charging control signal for turning on the charging switch and for turning off the charging switch before a potential of the control terminal of the switching element reaches the first potential and a clamp control signal for turning on the clamp switch after the charging switch is turned on.

17 Claims, 33 Drawing Sheets

DRIVING APPARATUS AND ELECTRIC POWER CONVERTER

CROSS REFERENCES TO RELATED APPLICATIONS

This Application claims priority to Japanese Patent Application No. 2013-237117 and No. 2013-237118, filed on Nov. 15, 2013, the contents of which are hereby incorporated by reference.

BACKGROUND

1. Technical Field

The present disclosure relates to a driving apparatus for driving a switching element having a control terminal and to an electric power converter having the driving apparatus.

2. Description of the Related Art

In recent years, driving apparatuses for driving power switching elements having large gate capacitances and used for high power have required a reduction in loss and an improvement in switching speed.

Typical drive systems for switching elements include a resistor-capacitor (RC) system and an inductor-capacitor (LC) system. In the RC system, a resistor provided between a power source and a gate terminal is used as a current-control element. In the LC system, a coil is used as a current-control element (see, for example, Japanese Patent No. 3271525). Power loss of a driving apparatus with the RC system increases as the gate capacitance increases, as the gate voltage increases, or as the switching frequency increases. Power loss of a driving apparatus with the LC system can be reduced even when the gate capacitance is large, because the gate voltage is increased or reduced through LC resonance.

SUMMARY

For known driving apparatuses, there are demands for efficient switching. The present disclosure provides a driving apparatus that can achieve efficient switching.

One aspect of the present disclosure provides a driving apparatus that drives a switching element including a control terminal. The driving apparatus include: a first potential line that applies a first potential; a second potential line that applies a second potential lower than the first potential; a coil including a first terminal and a second terminal, the second terminal being connected to the control terminal of the switching element; a charging switch, connected between the first potential line and the first terminal of the coil, to turn on or off an electrical connection between the first potential line and the coil; a clamp switch, connected between the first potential line and the control terminal of the switching element, to turn on or off an electrical connection between the first potential line and the control terminal of the switching element; a charging diode, connected between the second potential line and the first terminal of the coil, to pass current from the second potential line to the first terminal of the coil; and a control circuit that outputs a charging control signal for turning on or off the charging switch and a clamp control signal for turning on or off the clamp switch. The charging control signal turns on the charging switch, and then turns off the charging switch before a potential of the control terminal of the switching element reaches the first potential. The clamp control signal turns on the clamp switch after the charging switch is turned on.

This comprehensive and specific aspect may be realized as an electric power converter, a motor drive system, a vehicle, an electricity storage system, a control circuit, or a control method or may be realized by any combination thereof.

According to the present disclosure, it is possible to achieve efficient switching.

Additional benefits and advantages of the disclosed embodiments will be apparent from the specification and drawings. The benefits and/or advantages may be individually provided by the various embodiments and features of the specification and drawings, and need not all be provided in order to obtain one or more of the same.

Figure 1:
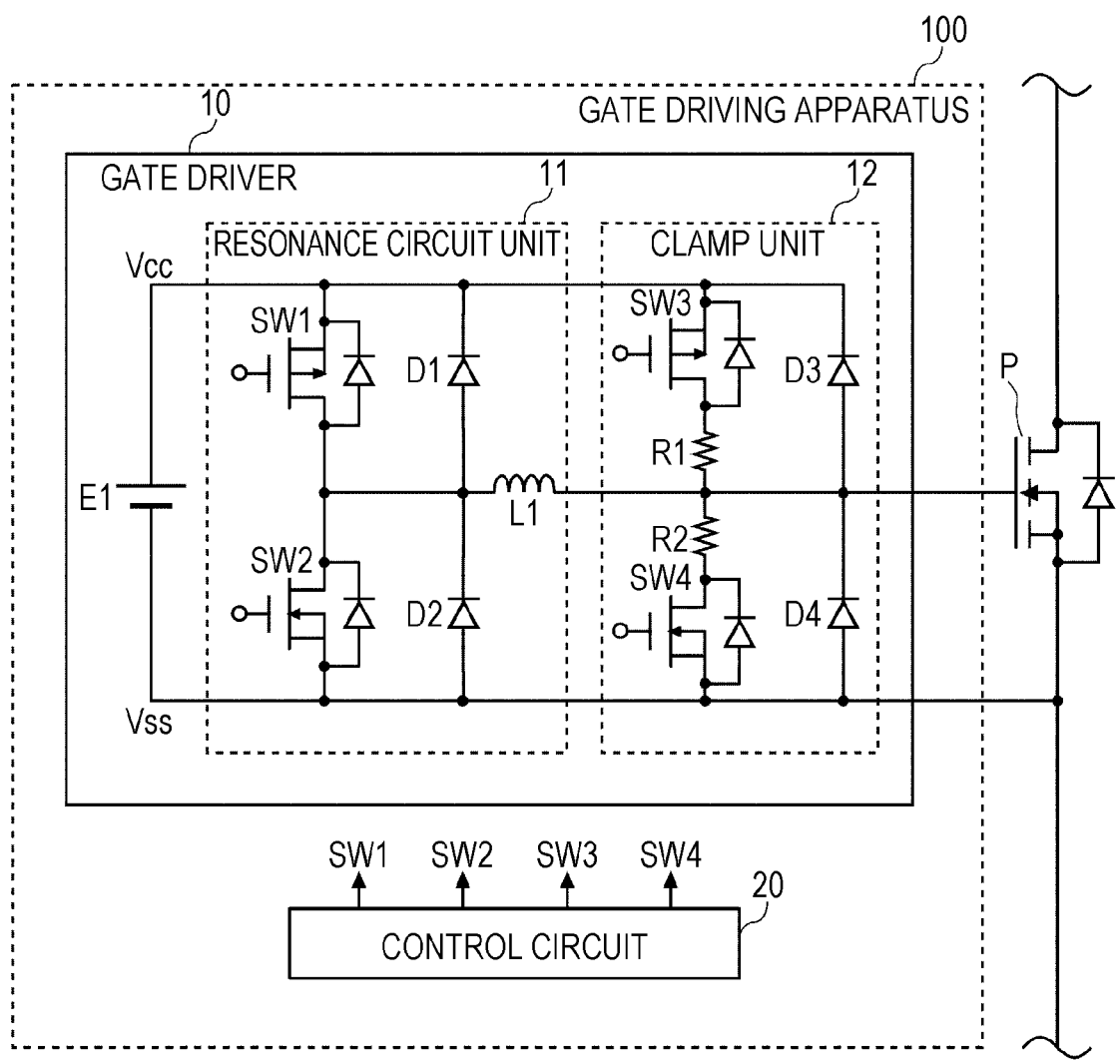
FIG. 1 illustrates an example configuration of a gate driving apparatus according to a first embodiment.

DETAILED DESCRIPTION OF THE DISCLOSURE (Underlying Knowledge Forming Basis of the Present Disclosure)

The present inventors have made intensive and extensive research on a driving apparatus that can achieve efficient switching.

First, the present inventors studied reducing loss of the driving apparatus. In known driving apparatuses using the LC system, a configuration in which a clamp voltage is applied to the gate terminal of a switching element has been proposed in order to stabilize the gate voltage after switching. In this configuration, resonance current, which is generated by energy stored in a resonance coil, may circulate through a path for clamping or regenerate the energy in a power source through a path for clamping. In such a case, since the path through which the circulating current or regenerative current flows has wiring resistance, current flow through the path causes loss.

The present inventors studied a technology for reducing power loss of the driving apparatus, and thus have conceived an aspect of the present disclosure.

Second, present inventors studied reducing loss of the switching element. The switching loss of the switching element can be reduced, for example, by rapidly charging the gate capacitance of the switching element. The charging rate of the gate capacitance can be improved by increasing the gate current supplied to the gate terminal. When an attempt is made to increase the gate current by using a known method, the circuit of the driving apparatus increases in scale.

The present inventors have studied a technology for improving the switching characteristics while suppressing increasing the scale of the circuit in the driving apparatus, and thus have conceived an aspect of the present disclosure.

(Overview of Embodiments)

A driving apparatus according to one aspect of the present disclosure is directed to, for example, a driving apparatus that drives a switching element including a control terminal. The driving apparatus include: a first potential line that applies a first potential; a second potential line that applies a second potential lower than the first potential; a coil including a first terminal and a second terminal, the second terminal being connected to the control terminal of the switching element; a charging switch, connected between the first potential line and the first terminal of the coil, to turn on or off an electrical connection between the first potential line and the coil; a clamp switch, connected between the first potential line and the control terminal of the switching element, to turn on or off an electrical connection between the first potential line and the control terminal of the switching element; a charging diode, connected between the second potential line and the first terminal of the coil, to pass current from the second potential line to the first terminal of the coil; and a control circuit that outputs a charging control signal for turning on or off the charging switch and a clamp control signal for turning on or off the clamp switch. The charging control signal turns on the charging switch, and then turns off the charging switch before a potential of the control terminal of the switching element reaches the first potential. The clamp control signal turns on the clamp switch after the charging switch is turned on.

Since the charging switch is turned off before the potential of the control terminal of the switching element reaches the first potential, unwanted circulating current and regenerative current can be suppressed. As a result, power loss of the driving apparatus can be reduced. This can realize efficient switching.

In the driving apparatus according to one aspect of the present disclosure, for example, the clamp control signal may turn on the clamp switch before a potential of the control terminal of the switching element reaches the first potential.

In the driving apparatus according to one aspect of the present disclosure, for example, the clamp control signal may turn on the clamp switch before the charging switch is turned off.

Current flowing via the charging switch and current flowing via the clamp switch cause electrical charge can flow into the control terminal of the switching element.

Thus, current flowing to the control terminal of the switching element can be increased in the vicinity of the timing at which the switching element is turned on. Since the current is efficiently used to turn on the switching element, efficient switching can be realized.

In the driving apparatus according to one aspect of the present disclosure, for example, the clamp control signal may turn on the clamp switch after the charging switch is turned off.

In the driving apparatus according to one aspect of the present disclosure, for example, electrical charge may be supplied to the control terminal of the switching element through a path via the charging diode and the coil.

In the driving apparatus according to one aspect of the present disclosure, for example, the control circuit may provide a period in which current flowing from the first potential line via the clamp switch and current flowing from the coil flow simultaneously to the control terminal of the switching element.

Thus, the current flowing to the control terminal of the switching element can be increased in the vicinity of the timing at which the switching element is turned on. Since the current is efficiently used to turn on the switching element, efficient switching can be realized.

In the driving apparatus according to one aspect of the present disclosure, for example, the switching element may further include a first conductive terminal, a second conductive terminal, and a capacitor between the control terminal and the first conductive terminal, and the coil and the capacitor may generate resonance current flowing therebetween.

With this arrangement, the resonance current flows to an LC series resonance circuit which includes the coil and the capacitance.

In the driving apparatus according to one aspect of the present disclosure, for example, a relationship given by $t_{ON} < \pi(LC)^{1/2}$ may be satisfied, where C indicates a capacitance of the capacitor, L indicates an inductance of the coil, and $t_{ON}$ indicates a period from when the charging switch is turned on until the charging switch is turned off.

When this relationship is satisfied, no excessive resonance current occurs. Thus, unwanted circulating current and regenerative current can be suppressed, and therefore power loss of the driving apparatus can be reduced. This can realize efficient switching.

In the driving apparatus according to one aspect of the present disclosure, for example, the clamp switch may be a first clamp switch; the clamp control signal may be a first clamp control signal; the driving apparatus may further include a discharging switch connected between the second potential line and the first terminal of the coil to turn on or off an electrical connection between the second potential line and the coil, a second clamp switch connected between the second potential line and the control terminal of the switching element to turn on or off an electrical connection between the second potential line and the control terminal of the switching element, and a discharging diode connected between the first potential line and the first terminal of the coil to pass current from the second potential line to the first terminal of the coil; and the control circuit may further output a discharging control signal for turning on or off the discharging switch and a second clamp control signal for turning on or off the second clamp switch. The discharging control signal may turn on the discharging switch, and then turn off the discharging switch before the potential of the control terminal of the switching element reaches the second potential. The second clamp control signal may turn on the second clamp switch after the discharging switch is turned on.

Since the discharging switch is turned off before the potential of the control terminal of the switching element reaches the second potential, unwanted circulating current and regenerative current can be suppressed. As a result, power loss of the driving apparatus can be reduced. This can realize efficient switching.

In the driving apparatus according to one aspect of the present disclosure, for example, the second clamp control signal may turn on the second clamp switch before the potential of the control terminal of the switching element reaches the second potential.

In the driving apparatus according to one aspect of the present disclosure, for example, the second clamp control signal may turn on the second clamp switch before the discharging switch is turned off.

Current flowing to the discharging switch and current flowing via the second clamp switch pull out the electrical charge from the control terminal of the switching element. Thus, current flowing from the control terminal of the switching element can be increased in the vicinity of the timing at which the switching element is turned off. Since the current is efficiently used to turn off the switching element, efficient switching can be realized.

In the driving apparatus according to one aspect of the present disclosure, for example, the second clamp control signal may turn on the second clamp switch after the discharging switch is turned off.

In the driving apparatus according to one aspect of the present disclosure, for example, the switching element may further include a first conductive terminal and a second conductive terminal, and the second potential line may be connected to the first conductive terminal of the switching element.

In the driving apparatus according to one aspect of the present disclosure, for example, the switching element may further include a first conductive terminal and a second conductive terminal, and the driving apparatus may further include an auxiliary power source provided between the second potential line and the first conductive terminal of the switching element, to set a potential of the first conductive terminal of the switching element higher than a potential of the second potential line.

With this arrangement, the control terminal of the switching element and the second potential line are electrically connected, and thereby a negative voltage is applied between the control terminal of the switching element and the first conductive terminal.

An electric power converter according to one aspect of the present disclosure is, for example, an electric power converter that converts input electric power into output electric power, and includes the switching element and any one of the driving apparatuses that drive the switching element.

A driving apparatus according to another aspect of the present disclosure is directed to, for example, a driving apparatus that drives a switching element including a control terminal. The driving apparatus includes: a first potential line that applies a first potential; a second potential line that applies a second potential lower than the first potential; a coil including a first terminal and a second terminal, the second terminal being connected to the control terminal of the switching element; a discharging switch connected between the second potential line and the first terminal of the coil to turn on or off an electrical connection between the second potential line and the coil; a clamp switch connected between the second potential line and the control terminal of the switching element to turn on or off an electrical connection between the second potential line and the control terminal of the switching element; a discharging diode connected between the first potential line and the first terminal of the coil to pass current from the second potential line to the first terminal of the coil; and a control circuit that outputs a discharging control signal for turning on or off the discharging switch and a clamp control signal for turning on or off the clamp switch. The discharging control signal may turn on the discharging switch, and then turn off the discharging switch before a potential of the control terminal of the switching element reaches the second potential. The clamp control signal may turn on the clamp switch after the discharging switch is turned on.

Since the discharging switch is turned off before the potential of the control terminal of the switching element reaches the second potential, unwanted circulating current and regenerative current can be suppressed. As a result, power loss of the driving apparatus can be reduced. This can realize efficient switching.

The driving apparatus according to one aspect of the present disclosure is directed to, for example, a driving apparatus that drives a switching element including a control terminal, a first conductive terminal, and a second conductive terminal. The driving apparatus includes: an output terminal connected to the control terminal of the switching element; a reference terminal connected to one of the first conductive terminal and the second conductive terminal of the switching element; a resonance unit including a power source for resonance; and a clamp unit that applies a fixed voltage between the output terminal and the reference terminal. An amplitude of a rise waveform of a voltage applied between the control terminal and the reference terminal of the switching element may be smaller than an absolute value of a voltage obtained by subtracting a voltage applied between the control terminal and the reference terminal before starting of resonance from a voltage of the power source for resonance. An absolute value of output current that flows to the output terminal may being to increase when an absolute value of an output voltage applied between the output terminal and the reference terminal begins to increase, the absolute value of the output current may reach a maximum peak before the output voltage reaches the fixed voltage, and the absolute value of the output current may decrease to a value smaller than a value of the maximum peak when the output voltage reaches the fixed voltage.

Embodiments will be described below with reference to the accompanying drawings. In all of the accompanying drawings, the same or corresponding portions are denoted by the same reference numerals, and redundant descriptions may be omitted.

The embodiments described below represent comprehensive or specific examples. Numerical values, shapes, materials, components, the arrangement of components, forms of connection, waveforms, and so on described in the embodiments below are merely examples, and are not intended to limit the present disclosure. Of the components in the embodiments described below, the components not set forth in the independent claims will be described as optional components.

First Embodiment (Overall Configuration of Gate Driving Apparatus)

Figure 3A:
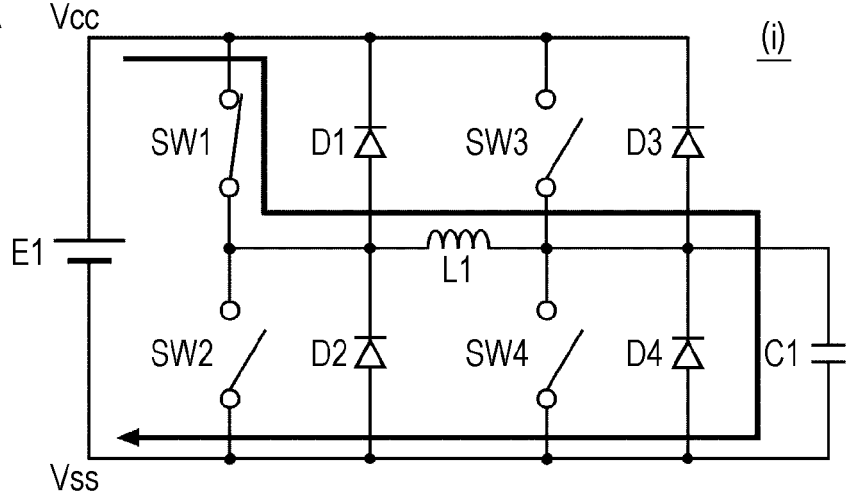
FIGS. 3A to 3C illustrate current paths in the control method illustrated in FIG. 2.

FIG. 1 illustrates an example configuration of a gate driving apparatus 100 according to a first embodiment. The gate driving apparatus 100 drives a voltage-controlled power switching element P in accordance with signals generated by resonance. The voltage-controlled power switching element P may be a power switching element having a gate that can be regarded as a capacitor. The power switching element P may be, for example, a metal-oxide-semiconductor field-effect transistor (MOSFET) or an insulated-gate bipolar transistor (IGBT). In FIG. 3A and the subsequent figures, an input capacitance Ciss of the voltage-controlled power switching element P may be depicted as a capacitor C1 in an equivalent circuit. The capacitor C1 may be constituted by the input capacitance Ciss of the power switching element P and another parasitic capacitor, as described below.

The power switching element P has a control terminal, a first conductive terminal, and a second conductive terminal. For example, when the power switching element P is a MOSFET, the control terminal is a gate terminal, one of the first conductive terminal and the second conductive terminal is a source terminal, and the other is a drain terminal. For example, when the power switching element P is an IGBT, the control terminal is a gate terminal, one of the first conductive terminal and the second conductive terminal is a collector terminal, and the other is an emitter terminal. One of the first conductive terminal and the second conductive terminal also serves as a reference terminal that provides a reference voltage of the control terminal. The description below will be given of an example in which the power switching element P is a MOSFET, the control terminal is a gate terminal, the first conductive terminal is a source terminal, the second conductive terminal is a drain terminal, and the source terminal is a reference terminal. A voltage applied between the gate terminal and the source terminal may also be referred to as a "gate voltage". A voltage applied between the drain terminal and the source terminal may also be referred to as a "drain voltage". However, the power switching element P is not limited to this configuration, and another configuration can also be explained by appropriately replacing the components on the basis of the above description.

The gate driving apparatus 100 includes a gate driver 10 and a control circuit 20. The gate driver 10 and the control circuit 20 may be mounted on the same substrate or may be mounted on different substrates. The gate driver 10 has a power source E1, a resonance circuit unit 11, and a clamp unit 12. The resonance circuit unit 11 has a coil L1 and a recovery unit. The recovery unit includes a first recovery switch SW1, a second recovery switch SW2, a first recovery diode D1, and a second recovery diode D2. The clamp unit 12 includes a first clamp switch SW3, a second clamp switch SW4, a first clamp diode D3, a second clamp diode D4, a first resistor R1, and a second resistor R2.

An input-side terminal of the coil L1 in the resonance circuit unit 11 is connectable to a first reference potential line of the power source E1 via the first recovery switch SW1. The first reference potential line applies a first reference potential Vcc. The input-side terminal of the coil L1 in the resonance circuit unit 11 is also connectable to a second reference potential line of the power source E1 via the second recovery switch SW2. The second reference potential line applies a second reference potential Vss. The first reference potential Vcc is higher than the second reference potential Vss. An output-side terminal of the coil L1 is connected in series with the gate terminal, which is the control terminal of the power switching element P. The second reference potential Vss of the power source E1 and a source potential of the power switching element P are equal to each other. Thus, the coil L1 and the capacitor C1 constitute an LC series resonance circuit.

The first reference potential Vcc is one example of a first potential, and the second reference potential Vss is one example of a second potential. The first reference potential line is one example of a first potential line, and the second reference potential line is one example of a second potential line. In the present disclosure, the first potential line may be any current path having the first potential and does not necessarily have to be a wire. Similarly, the second potential line may be any current path having the second potential and does not necessarily have to be a wire. One example of a non-wire current path is a current path formed by interconnecting terminals of circuit elements.

In the present disclosure, a first recovery switch may be referred to as a "charging switch", and a second recovery switch may be referred to as a "discharging switch". In the present disclosure, in a case other than a middle voltage method described below, a first recovery diode may be referred to as a "discharging diode", and a second recovery diode may be referred to as a "charging diode". In the present disclosure, the input-side terminal of a coil may be referred to as a "first terminal", and the output-side terminal thereof may be referred to as a "second terminal".

The power source E1 supplies the first reference potential Vcc or the second reference potential Vss to the gate terminal of the power switching element P. For example, when the power switching element P is in a turned ON state, the power source E1 fixes the gate potential thereof to the same potential as that of the first reference potential Vcc, and when the power switching element P is in a turned OFF state, the power source E1 fixes the gate potential thereof to the same potential as that of the second reference potential Vss. In other words, in a stable state after the power switching element P has been switched, the power source E1 applies a fixed voltage between the gate terminal and the source terminal of the power switching element P.

In the example illustrated in FIG. 1, the source terminal of the power switching element P has the same potential as the second reference potential Vss. Thus, when the gate potential of the power switching element P is fixed to the first reference potential Vcc, the voltage of the gate terminal, whose reference is the source terminal of the power switching element P, is equal to Vcc−Vss, that is, the voltage of the power source E1. When the gate potential of the power switching element P is fixed to the second reference potential Vss, the voltage of the gate terminal, whose reference is the source terminal of the power switching element P, is 0 V. In the present disclosure, "A and B are at the same potential", "A has the same potential as B" or "the potential of A reaches the potential of B" includes a case in which a small potential difference resulting from, for example, a wiring resistance, the on-resistance of a transistor, and a parasitic resistance of an electrical element occurs between the potential of A and the potential of B. The power source E1 may also be provided external to the gate driving apparatus 100.

The first recovery switch SW1 is provided between the first reference potential line and the input-side terminal of the coil L1. The second recovery switch SW2 is provided between the second reference potential line and the input-side terminal of the coil L1. FIG. 1 illustrates an example in which the first recovery switch SW1 is a p-channel MOSFET and the second recovery switch SW2 is an n-channel MOSFET. The p-channel MOSFET has a parasitic diode in which the direction from the drain to the source thereof is a forward direction. The n-channel MOSFET has a parasitic diode in which the direction from the source to the drain thereof is a forward direction. The first recovery switch SW1 and the second recovery switch SW2 may be, for example, other switching elements, such as bipolar transistors or relays.

The first recovery diode D1 is provided in a reverse direction between the first reference potential line and the input-side terminal of the coil L1. The term "reverse direction" refers to, in a state in which current flows from the first reference potential line to the second reference potential line, a direction in which a cathode terminal of the diode is connected to a higher potential node and an anode terminal of the diode is connected to a lower potential node. That is, the first recovery diode D1 is connected in reverse direction between the first reference potential line and the input-side terminal of the coil L1. The second recovery diode D2 is provided in a reverse direction between the input-side terminal of the coil L1 and the second reference potential line. That is, the second recovery diode D2 is connected in reverse direction between the input-side terminal of the coil L1 and the second reference potential line. In the figures, of two nodes to which the diode is connected, the cathode terminal is connected to the upper node, and the anode terminal is connected to the lower node. When regenerative current or circulating current occurs, current may flow from the second reference potential line toward the first reference potential line. In this case, the first recovery diode D1 and the second recovery diode D2, which are provided in the reverse direction, are electrically connected. The cathode terminal of the first recovery diode D1 is connected to the first reference potential line, and the anode terminal of the second recovery diode D2 is connected to the second reference potential line. The first recovery diode D1 and the second recovery diode D2 may be, for example, Schottky barrier diodes.

The first clamp switch SW3 is provided between the first reference potential line and the output-side terminal of the coil L1. The second clamp switch SW4 is provided between the second reference potential line and the output-side terminal of the coil L1. FIG. 1 illustrates an example in which the first clamp switch SW3 is a p-channel MOSFET and the second clamp switch SW4 is an n-channel MOSFET. The first clamp diode D3 is provided in a reverse direction between the first reference potential Vcc and the output-side terminal of the coil L1. That is, the first clamp diode D3 is connected in reverse direction between the first reference potential line and the output-side terminal of the coil L1. The second clamp diode D4 is provided in a reverse direction between the output-side terminal of the coil L1 and the second reference potential line. That is, the second clamp diode D4 is connected in reverse direction between the output-side terminal of the coil L1 and the second reference potential line. The first clamp diode D3 and the second clamp diode D4 may be, for example, Schottky barrier diodes.

The first resistor R1 is interposed between the first clamp switch SW3 and the output-side terminal of the coil L1. The second resistor R2 is interposed between the output-side terminal of the coil L1 and the second clamp switch SW4. The first resistor R1 and the second resistor R2 serve to suppress ringing between the gate and the source of the power switching element P. The first resistor R1 and the second resistor R2 may also be omitted. In such a case, the gate driver 10 has no ringing-suppression function.

The gate driver 10 has a bridge circuit including the coil L1, the four switches SW1 to SW4, and the four diodes D1 to D4. The first clamp switch SW3 and the first clamp diode D3 are connected in parallel. When the first clamp switch SW3 is in a turned ON state, the gate potential of the power switching element P is clamped to the first reference potential Vcc. When the gate potential of the power switching element P becomes higher than the first reference potential Vcc, current is pulled out from the gate terminal via the first clamp diode D3. When the gate potential of the power switching element P becomes lower than the first reference potential Vcc, current is supplied to the gate terminal via the first clamp switch SW3.

The second clamp switch SW4 and the second clamp diode D4 are connected in parallel. When the second clamp switch SW4 is in a turned ON state, the gate potential of the power switching element P is clamped to the second reference potential Vss. When the gate potential of the power switching element P becomes higher than the second reference potential Vss, current is pulled out from the gate terminal via the second clamp switch SW4. When the gate potential of the power switching element P becomes lower than the second reference potential Vss, current is supplied to the gate terminal via the second clamp diode D4.

When the power switching element P is turned on, the first recovery switch SW1 is turned on to start charging of the capacitor C1 and energy storage in the coil L1. Thereafter, when the first recovery switch SW1 is turned off, the coil L1, the capacitor C1, and the second recovery diode D2 form a closed loop passing therethrough, so that the capacitor C1 is charged with the energy stored in the coil L1.

When the power switching element P is turned off, the second recovery switch SW2 is turned on to start discharging of the capacitor C1, so that discharged energy is stored in the coil L1. Thereafter, when the second recovery switch SW2 is turned off, energy that remains in the coil L1 and the capacitor C1 is regenerated in the power source E1 via the first recovery diode D1.

The control circuit 20 controls the first recovery switch SW1, the second recovery switch SW2, the first clamp switch SW3, and the second clamp switch SW4. Specifically, pulse signals are input to the control terminals (the gate terminals in FIG. 1) of the switches SW1 to SW4 to control the turned-ON/turned-OFF states of the switches SW1 to SW4. A specific example operation will be described below.

Consideration Example

Before describing a control method according to the first embodiment, a description will be given of a consideration example studied by the present inventors.

Figure 2:
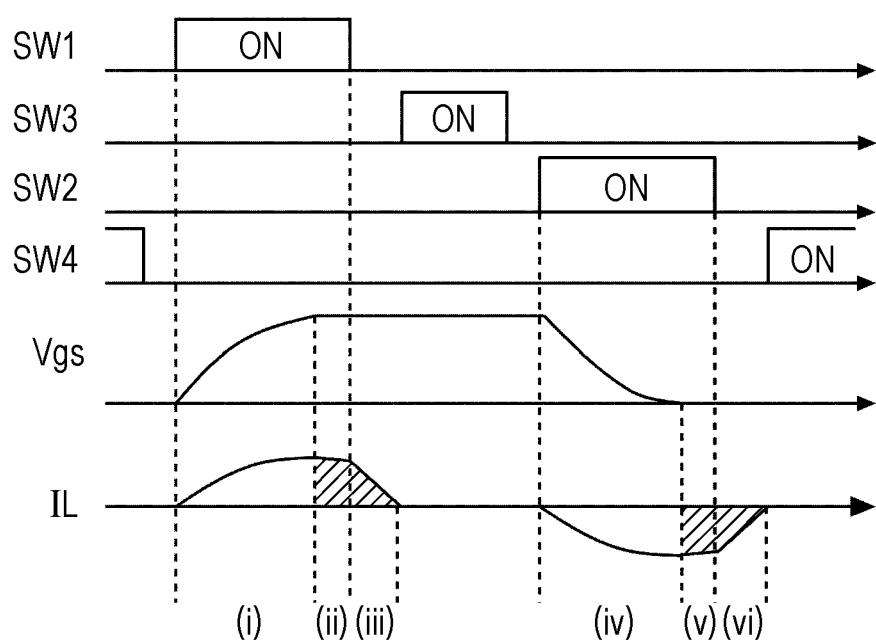
FIG. 2 schematically illustrates a control method according to a consideration example.

FIG. 2 schematically illustrates the temporal waveforms of control signals input to the respective switches SW1 to SW4, the temporal waveform of a gate voltage Vgs, and the temporal waveform of coil current IL according to the consideration example. The gate voltage Vgs refers to a voltage applied from the gate driver 10 between the gate terminal and the source terminal of the power switching element P. In this case, a reference potential of the gate voltage Vgs is the second reference potential Vss. The coil current IL refers to current flowing through the coil L1. In the consideration example, the power switching element P is turned on when the gate voltage Vgs rises from a low level to a high level, and is turned off when the gate voltage Vgs falls from the high level to the low level.

Figure 3B:
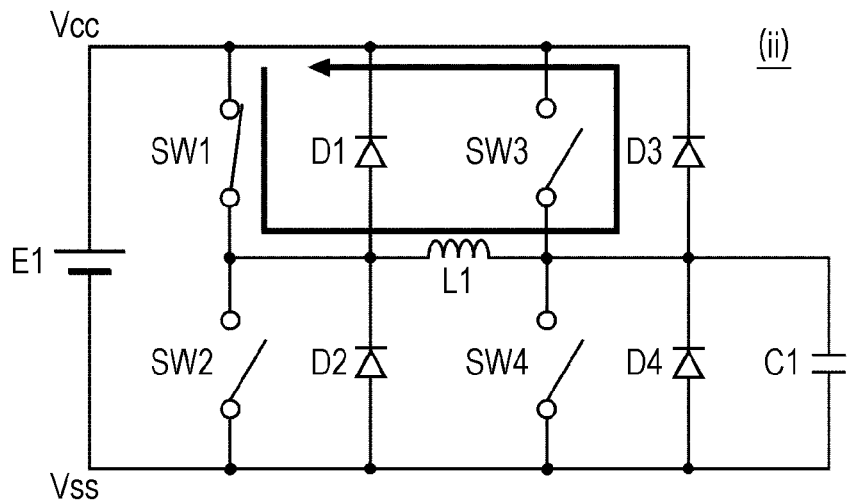
Figure 3C:
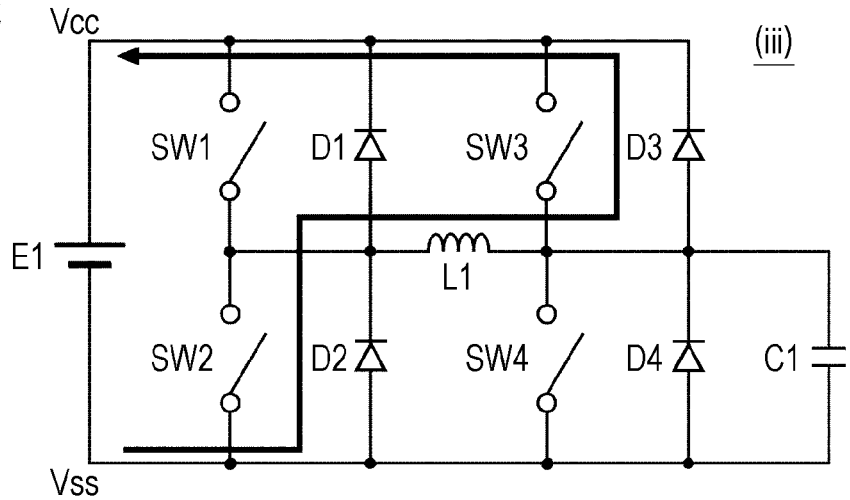
Figure 4A:
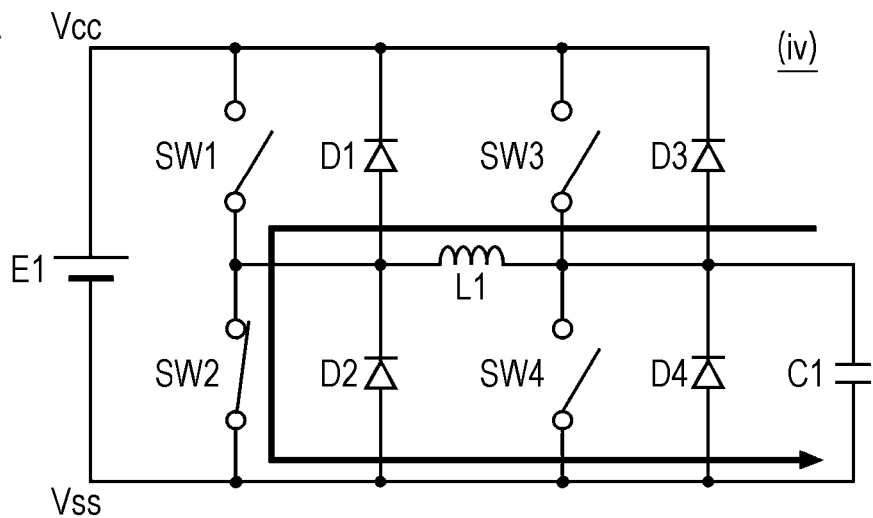
FIGS. 4A to 4C illustrate current paths in the control method illustrated in FIG. 2.
Figure 4B:
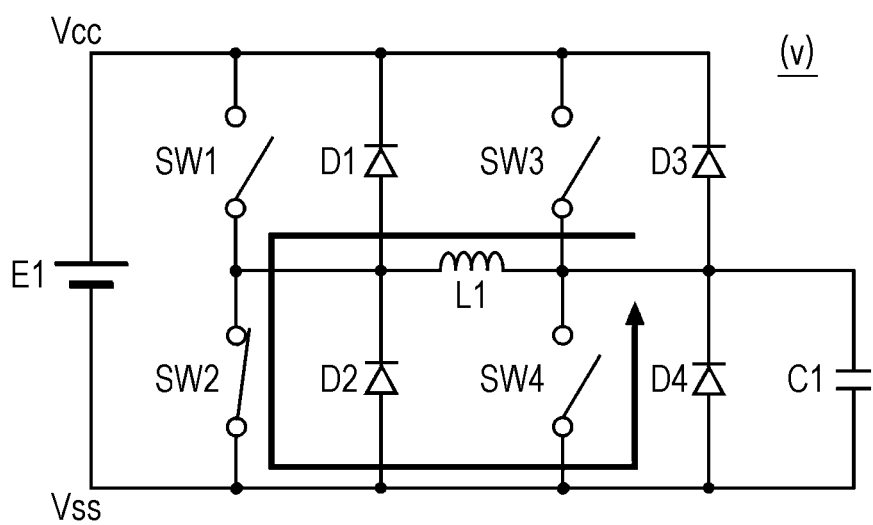
Figure 4C:
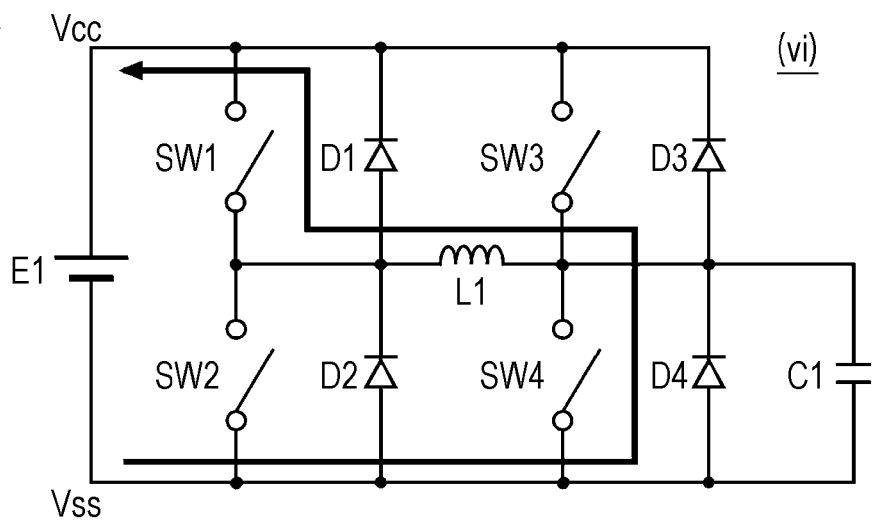

FIGS. 3A, 3B, and 3C illustrate the paths of currents that flow through the gate driver 10 and the input capacitor of the power switching element P in state 1 (i), state 2 (ii), and state 3 (iii), respectively, illustrated in FIG. 2. FIGS. 4A, 4B, and 4C illustrate the paths of currents that flow through the gate driver 10 and the input capacitor of the power switching element P in state 4 (iv), state 5 (v), and state 6 (vi), respectively, illustrated in FIG. 2. In FIGS. 3A to 4C, the switches SW1 to SW4 are depicted by the signs of switches, not the signs of MOSFETs, for ease of understanding the circuit configuration. In FIGS. 3A to 4C, the first resistor R1 and the second resistor R2 are not illustrated.

A case in which the power switching element P is turned on will now be described in connection with FIG. 2.

First, the control circuit 20 turns on the first recovery switch SW1 to thereby bring about a state in which the first recovery switch SW1 is on, and the first clamp switch SW3, the second recovery switch SW2, and the second clamp switch SW4 are off. This state is referred to as "state 1 (i)" or "state 2 (ii)". State 1 (i) is a state before the gate potential reaches the first reference potential Vcc. State 2 (ii) is a state after the gate potential reaches the first reference potential Vcc. The first reference potential Vcc is a fixed potential when the power switching element P is in the turned ON state.

As illustrated in FIG. 3A, in state 1 (i), current flows from the power source E1 to the coil L1 and the capacitor C1 via the first recovery switch SW1. As a result, energy is stored in the coil L1 to charge the capacitor C1. As illustrated in FIG. 2, both the gate voltage Vgs and the coil current IL increase. At this point, since the coil L1 and the capacitor C1 resonate with each other, resonance current flows from the first reference potential line toward the gate terminal of the power switching element P.

As illustrated in FIG. 2, in state 2 (ii), the gate potential reaches the first reference potential Vcc. In this state, the potentials at two opposite ends of the coil L1 reach the first reference potential Vcc. Thus, as illustrated in FIG. 3B, current generated by the energy stored in the coil L1 does not charge the capacitor C1 but circulates via the first clamp diode D3 and the first recovery switch SW1. In this case, with an ideal wire having a wiring resistance of zero, power loss due to the circulating current does not occur. In practice, however, since there is a wiring resistance, power loss due to the circulating current occurs. As illustrated in FIG. 2, the coil current IL in this period is not constant and decreases slightly. A decrease in the coil current IL indicates power loss due to the wiring resistance, the on-resistances of the recovery switches SW1 and SW2, and the on-resistances of the clamp switches SW3 and SW4.

Next, the control circuit 20 turns off the first recovery switch SW1 to thereby bring about state 3 (iii) in which the first recovery switch SW1, the first clamp switch SW3, the second recovery switch SW2, and the second clamp switch SW4 are off. As illustrated in FIG. 3C, the current generated by the energy stored in the coil L1 regenerates the energy in the power source E1 through the path formed by the first clamp diode D3, the power source E1, and the second recovery diode D2. In this case, with an ideal wire having a wiring resistance of zero, power loss due to regenerative current does not occur. In practice, however, since a wiring resistance exists, power loss due to the regenerative current occurs. When the energy stored in the coil L1 is exhausted, no regenerative current flows, so that the coil current IL reaches zero, as illustrated in FIG. 2.

Next, the control circuit 20 turns on the first clamp switch SW3 to bring about a state in which the first clamp switch SW3 is on, and the first recovery switch SW1, the second recovery switch SW2, and the second clamp switch SW4 are off. In this state, the gate potential is fixed to the first reference potential Vcc.

Next, a case in which the power switching element P is turned off will be described in connection with FIG. 2.

First, the control circuit 20 turns on the second recovery switch SW2 to bring about a state in which the second recovery switch SW2 is on, and the first recovery switch SW1, the first clamp switch SW3, and the second clamp switch SW4 are off. This state is referred to as "state 4 (iv)" or "state 5 (v)". State 4 (iv) is a state before the gate potential reaches the second reference potential Vss. State 5 (v) is a state after the gate potential reaches the second reference potential Vss. The second reference potential Vss is a fixed potential when the power switching element P is in the turned OFF state.

As illustrated in FIG. 4A, in state 4 (iv), the capacitor C1 is discharged, so that energy is stored in the coil L1 by current flowing through the coil L1 and the second recovery switch SW2. As illustrated in FIG. 2, the gate voltage Vgs decreases, and the coil current IL increases in a negative direction. At this point, since the coil L1 and the capacitor C1 resonate with each other, resonance current flows from the gate terminal of the power switching element P toward the second reference potential line.

As illustrated in FIG. 2, in state 5 (v), the gate potential has reached the second reference potential Vss. In this state, the potentials at two opposite ends of the coil L1 reach the second reference potential Vss. Thus, as illustrated in FIG. 4B, the current generated by the energy stored in the coil L1 circulates via the second recovery switch SW2 and the second clamp diode D4. This circulating current causes power loss.

Next, the control circuit 20 turns off the second recovery switch SW2 to thereby bring about state 6 (vi) in which the first recovery switch SW1, the first clamp switch SW3, the second recovery switch SW2, and the second clamp switch SW4 are off. As illustrated in FIG. 4C, the current generated by the energy stored in the coil L1 regenerates the energy in the power source E1 through the path formed by the first recovery diode D1, the power source E1, and the second clamp diode D4. This regenerative current causes power loss. When the energy stored in the coil L1 is exhausted, no regenerative current flows, so that the coil current IL reaches zero, as illustrated in FIG. 2.

Next, the control circuit 20 turns on the second clamp switch SW4 to thereby bring about a state in which the second clamp switch SW4 is on, and the first recovery switch SW1, the second recovery switch SW2, and the first clamp switch SW3 are off. In this state, the gate potential is fixed to the second reference potential Vss. In FIG. 2, the hatched areas of the coil current IL indicate a state in which unwanted current, which is not used for charging/discharging of the capacitor C1, flows.

[Control Method 1]

Figure 5:
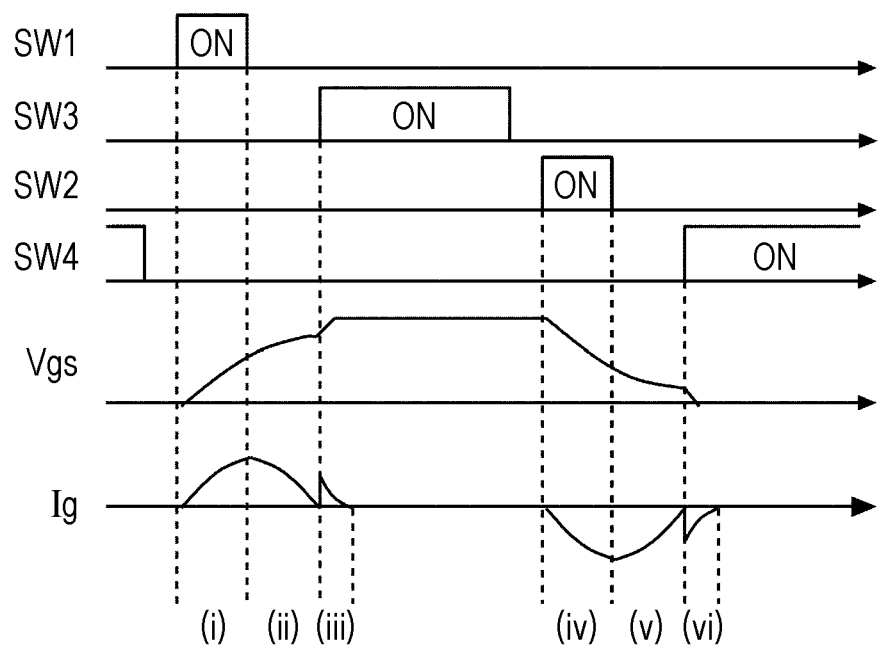
FIG. 5 schematically illustrates one example of control method 1 according to the first embodiment.

FIG. 5 schematically illustrates one example of the temporal waveforms of control signals input to the switches SW1 to SW4, the temporal waveform of the gate voltage Vgs, and the temporal waveform of a gate current Ig according to the first embodiment. The gate voltage Vgs refers to a voltage applied from the gate driver 10 between the gate terminal and the source terminal of the power switching element P. In this case, the reference potential of the gate voltage Vgs is the second reference potential Vss. The gate current Ig refers to current flowing from the gate driver 10 to the gate terminal of the power switching element P.

Figure 6A:
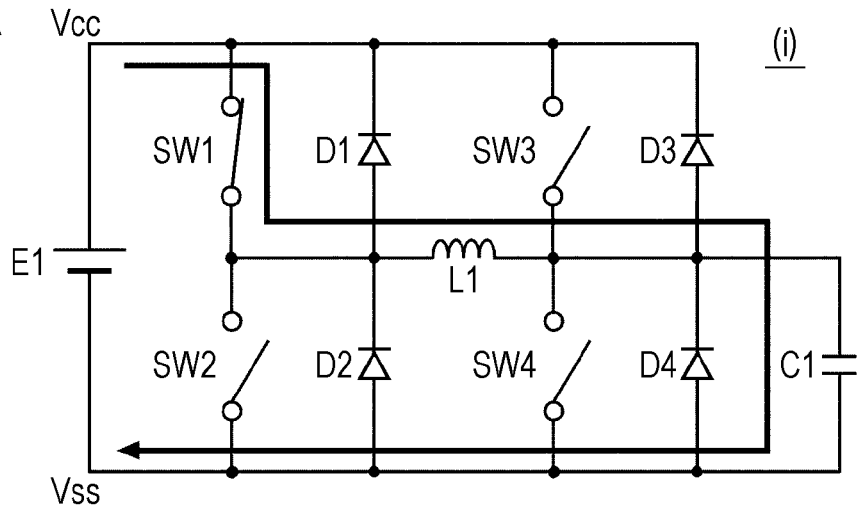
FIGS. 6A to 6C illustrate current paths in control method 1 illustrated in FIG. 5.
Figure 6B:
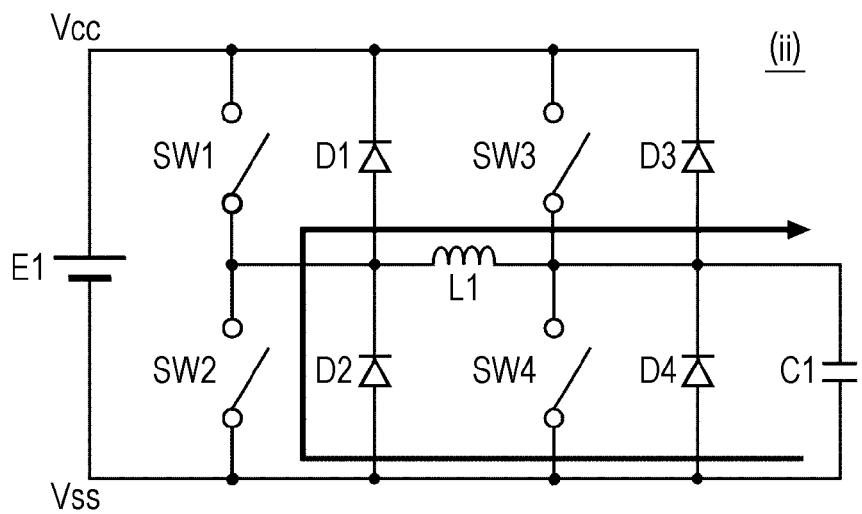
Figure 6C:
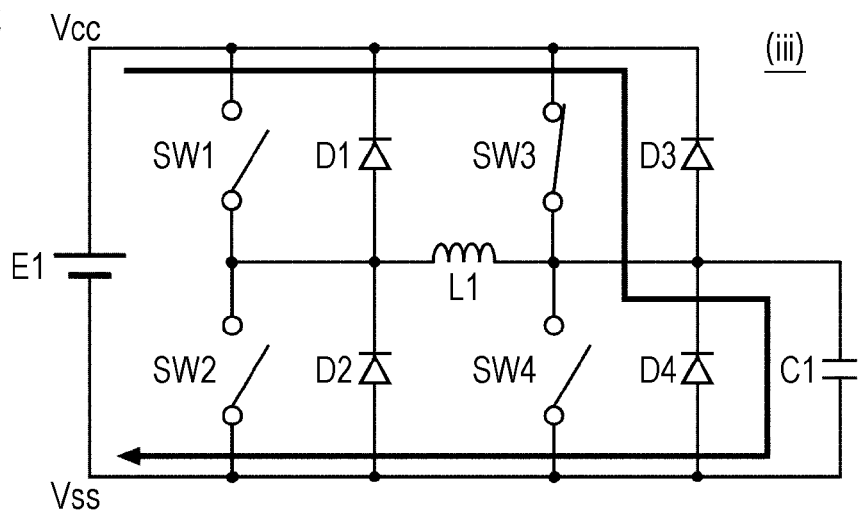
Figure 7A:
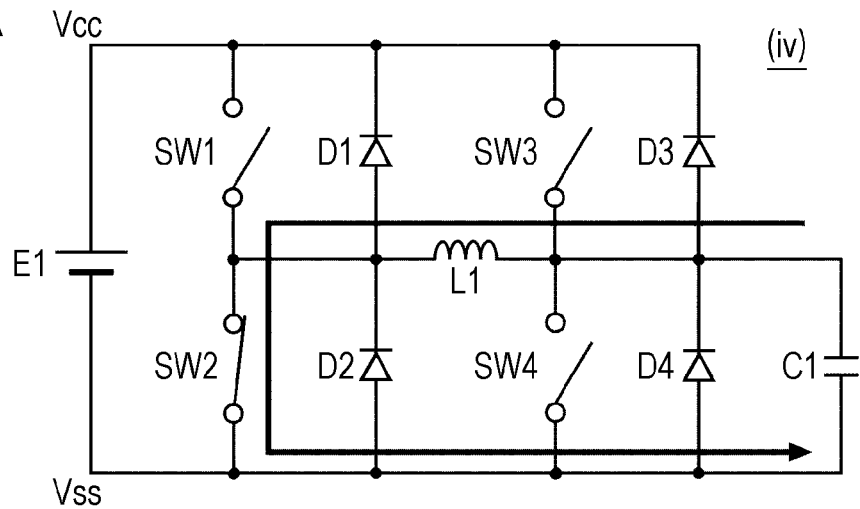
FIGS. 7A to 7C illustrate current paths in control method 1 illustrated in FIG. 5.
Figure 7B:
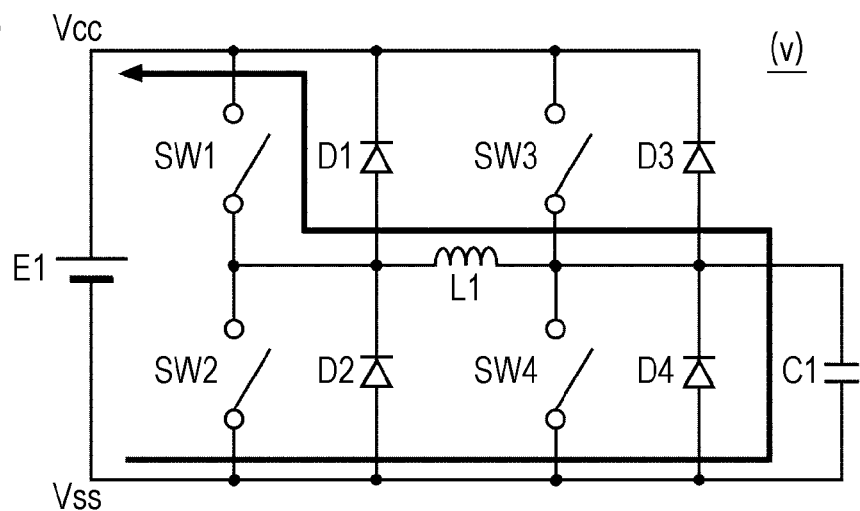
Figure 7C:
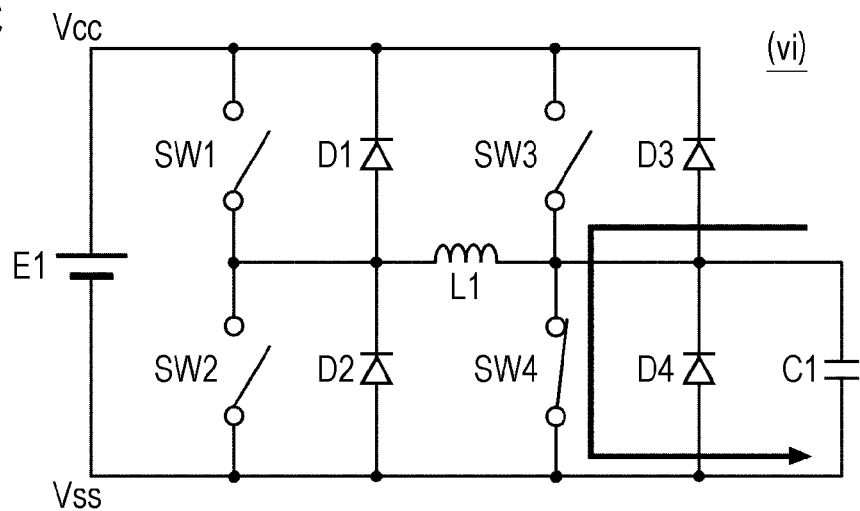

FIGS. 6A, 6B, and 6C illustrate the paths of currents that flow through the gate driver 10 and the input capacitor of the power switching element P in state 1 (i), state 2 (ii), and state 3 (iii), respectively, illustrated in FIG. 5. FIGS. 7A, 7B, and 7C illustrate the paths of currents that flow through the gate driver 10 and the input capacitor of the power switching element P in state 4 (iv), state 5 (v), and state 6 (vi), respectively, illustrated in FIG. 5. In FIGS. 6A to 7C, the switches SW1 to SW4 are depicted by the signs of switches, not the signs of MOSFETs, for ease of understanding the circuit configuration. Also, in FIGS. 6A to 7C, the first resistor R1 and the second resistor R2 are not illustrated.

A case in which the power switching element P is turned on will now be described in connection with FIG. 5.

First, the control circuit 20 turns on the first recovery switch SW1 to thereby bring about state 1 (i) in which the first recovery switch SW1 is on, and the first clamp switch SW3, the second recovery switch SW2, and the second clamp switch SW4 are off. As illustrated in FIG. 6A, in state 1 (i), current flows from the power source E1 to the coil L1 and the capacitor C1 via the first recovery switch SW1. As a result, energy is stored in the coil L1, and the capacitor C1 is charged. As illustrated in FIG. 5, the gate voltage Vgs and the gate current Ig both increase. At this point, since the coil L1 and the capacitor C1 resonate with each other, resonance current flows from the first reference potential line toward the gate terminal of the power switching element P.

Next, before the gate potential reaches the first reference potential Vcc, the control circuit 20 turns off the first recovery switch SW1 to thereby bring about state 2 (ii) in which the first recovery switch SW1, the first clamp switch SW3, the second recovery switch SW2, and the second clamp switch SW4 are off. As illustrated in FIG. 6B, in state 2 (ii), the coil L1, the capacitor C1, and the second recovery diode D2 form a closed loop passing therethrough. The current generated by the energy stored in the coil L1 charges the capacitor C1. That is, resonance current flows from the coil L1 toward the capacitor C1. The current generated by the energy stored in the coil L1 does not become reflux current or regenerative current, and all of the current charges the capacitor C1.

Next, the control circuit 20 turns on the first clamp switch SW3 to thereby bring about state 3 (iii) in which the first clamp switch SW3 is on, and the first recovery switch SW1, the second recovery switch SW2, and the second clamp switch SW4 are off. As illustrated in FIG. 6C, if the gate potential has not reached the first reference potential Vcc at the point when the first clamp switch SW3 is turned on, clamp current flows from the first reference potential Vcc to the gate terminal via the first clamp switch SW3 after the first clamp switch SW3 is turned on. Thereafter, when the gate potential reaches the first reference potential Vcc, no clamp current flows, and the gate potential is fixed to the first reference potential Vcc. If the gate potential has reached the first reference potential Vcc at the point when the first clamp switch SW3 is turned on, as in the consideration example illustrated in FIG. 2, no clamp current flows after the first clamp switch SW3 is turned on.

Next, a description will be given of a case in which the power switching element P is turned off.

First, the control circuit 20 turns on the second recovery switch SW2 to thereby bring about state 4 (iv) in which the second recovery switch SW2 is on, and the first recovery switch SW1, the first clamp switch SW3, and the second clamp switch SW4 are off. As illustrated in FIG. 7A, in state 4 (iv), the capacitor C1 is discharged, so that energy is stored in the coil L1 by current flowing through the coil L1 and the second recovery switch SW2. As illustrated in FIG. 5, the gate voltage Vgs decreases, and the gate current Ig increases in a negative direction. Since the coil L1 and the capacitor C1 resonate with each other, resonance current flows from the gate terminal of the power switching element P toward the second reference potential line.

Next, before the gate potential reaches the second reference potential Vss, the control circuit 20 turns off the second recovery switch SW2 to thereby bring about state 5 (v) in which the first recovery switch SW1, the first clamp switch SW3, the second recovery switch SW2, and the second clamp switch SW4 are off. As illustrated in FIG. 7B, in state 5 (v), the current generated by the energy stored in the coil L1 causes discharging of the capacitor C1, thereby regenerating the energy in the power source E1 via the first recovery diode D1. That is, the resonance current from the capacitor C1 and the coil L1 regenerates the energy in the power source E1 via the first recovery diode D1. In the manner described above, all of the energy stored in the coil L1 is regenerated in the power source E1.

Next, the control circuit 20 turns on the second clamp switch SW4 to thereby bring about state 6 (vi) in which the second clamp switch SW4 is on, and the first recovery switch SW1, the second recovery switch SW2, and the first clamp switch SW3 are off. As illustrated in FIG. 7C, if the gate potential has not reached the second reference potential Vss at the point when the second clamp switch SW4 is turned on, clamp current flows from the capacitor C1 to the second reference potential Vss via the second clamp switch SW4 after the second clamp switch SW4 is turned on. Thereafter, when the gate potential reaches the second reference potential Vss, no clamp current flows, and the gate potential is fixed to the second reference potential Vss. If the gate potential has reached the second reference potential Vss when the second clamp switch SW4 is turned on, as in the consideration example illustrated in FIG. 2, no clamp current flows when the second clamp switch SW4 is turned on.

Comparison Between Consideration Example and Example 1

Figure 8:
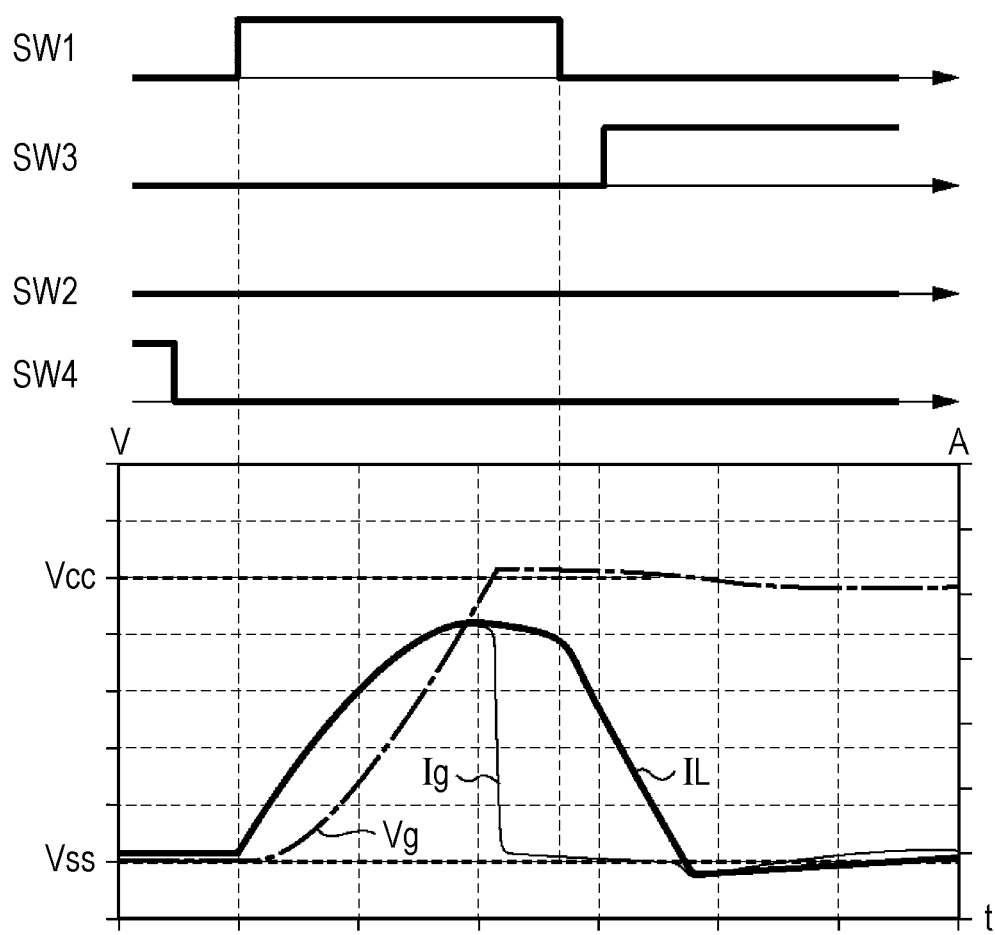
FIG. 8 illustrates a simulation result according to the consideration example.
Figure 9:
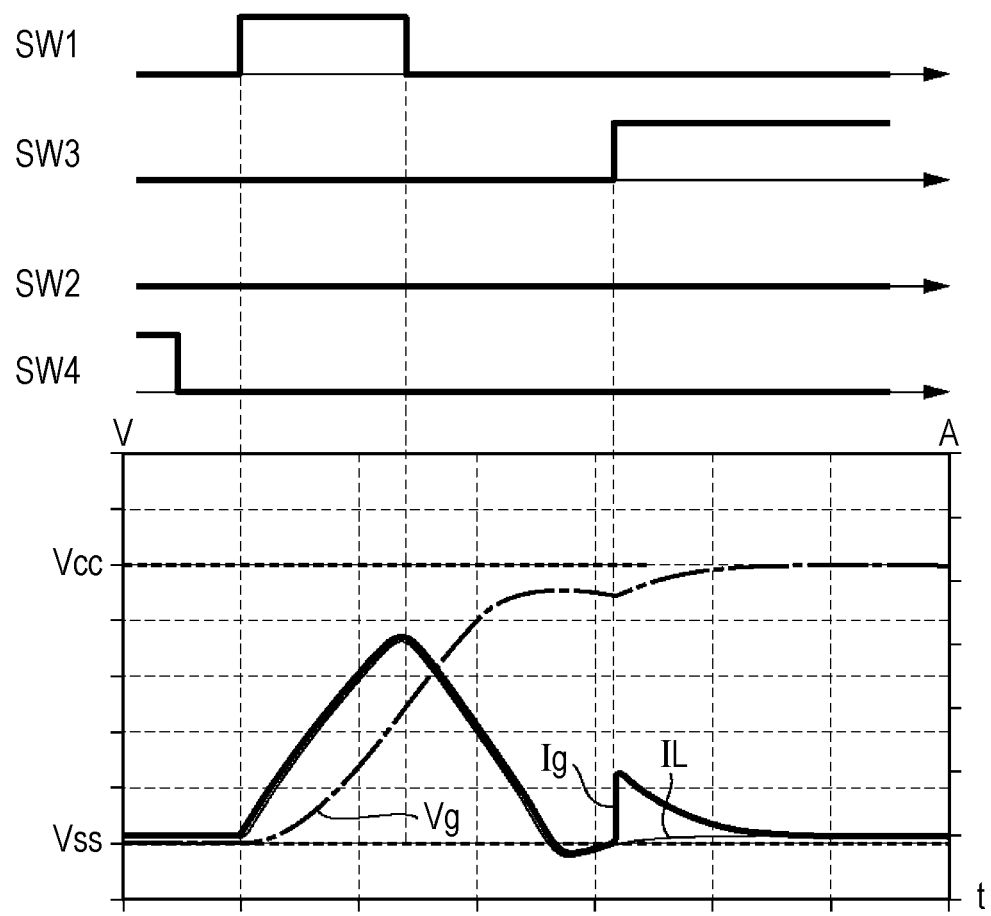
FIG. 9 illustrates a simulation result according to Example 1 of the first embodiment.

FIG. 8 illustrates one example of a simulation result according to the consideration example. FIG. 9 illustrates one example of a simulation result according to Example 1 of the first embodiment. FIGS. 8 and 9 illustrate relationships of the gate voltage Vgs, the coil current IL, and the gate current Ig. An experiment was performed based on the following premise. A power switching element P to be driven was a power module having a 100 A class drain current Id. The first reference potential Vcc was set to 20 V, and the second reference potential Vss was set to −5 V. The inductance value of the coil L1 was set to hundreds of nanohenries, the resistance value of the gate resistance was set to several ohms, and the capacitance value of the capacitor C1 was set to tens of nanofarads.

The difference between Example 1 and the consideration example is the timing at which the first recovery switch SW1 was turned off. In Example 1, after the first recovery switch SW1 was turned on and before the gate potential reached the first reference potential Vcc, the control circuit 20 turned off the first recovery switch SW1. On the other hand, in the consideration example, the control circuit 20 turned off the first recovery switch SW1 after the gate potential reached the first reference potential Vcc. The first reference potential Vcc is a fixed potential for fixing the power switching element P to the turned ON state.

If the turned ON time of the first recovery switch SW1 is increased, it is possible to ensure that the gate potential reaches the fixed potential. However, if the turned ON time of the first recovery switch SW1 is increased, excessive energy is stored in the coil L1, so that excessive current is likely to flow from the coil L1 as circulating current or regenerative current. In FIG. 8, there is a period in which the gate current Ig and the coil current IL do not match each other. This period corresponds to a period in which the coil current IL flows as circulating current or regenerative current and the coil current IL does not charge the capacitor C1. When the circulating current or regenerative current flows in the manner described above, loss occurs because of resistance components in the current path.

In an ideal LC series resonance circuit in which no resistance component exists, in the case when current begins to flow from a coil to a capacitor at the point when a node potential between the coil and the capacitor reaches one-half of the input potential, an excess or shortage of current does not occur to charge the capacitor. Thus, in Example 1, at the point when the gate potential reaches one-half of the first reference potential Vcc with reference to the second reference potential Vss, the first recovery switch SW1 is turned off, and thereby the capacitor C1 starts to be charged with the current flowing through the coil L1. The period until the node potential between the coil and the capacitor reaches one-half of the input potential after the node potential begins to increase corresponds to one-sixth of the resonance period T. The resonance period T is represented by $2\pi\sqrt{(LC)}$. C represents a parasitic capacitance that exists between the gate and the source. For example, the capacitance C may be the total of the gate-source capacitance of the power switching element P and the capacitance of another capacitor. The gate-source capacitance of the power switching element P varies according to a drain voltage Vds in practice, but is defined as a capacitance when the drain voltage Vds is 0 V. The inductance L is an inductance in a closed loop including the capacitor C. For example, the inductance L is the total of the inductance of the coil L1 and an inductance due to wires in the closed loop.

In Example 1, the control circuit 20 turned off the first recovery switch SW1 at the point when about one-sixth of the resonance period passed after the first recovery switch SW1 was turned on (i.e., at the point when the gate potential reached about one-half of the potential of the first reference potential Vcc). In contrast, in the consideration example, the control circuit 20 turned off the first recovery switch SW1 at the point when about 30% of the resonance period passed after the first recovery switch SW1 was turned on. This is because, in the consideration example, the time until the gate potential reaches the first reference potential Vcc varies greatly depending on the resistance.

In Example 1, when a set period passed after the first recovery switch SW1 was turned off, the control circuit 20 turned on the first clamp switch SW3. In Example 1, the first clamp switch SW3 was turned on after the resonance current had reached zero. As a result of turning on of the first clamp switch SW3, the gate potential of the power switching element P was clamped to the first reference potential Vcc. The timing at which the first clamp switch SW3 is turned on may be before the resonance current reaches zero.

In Example 1, the first recovery switch SW1 was turned off before the gate potential of the power switching element P reached the first reference potential Vcc. Thus, only with the resonance current, the gate potential of the power switching element P was not successfully made to reach the first reference potential Vcc. Specifically, in the example illustrated in FIGS. 5 and 9, only with the resonance current based on the first reference potential Vcc and the resonance current based on the energy stored in the coil L1, the gate potential was not successfully made to reach the first reference potential Vcc. Thus, as a result of turning on of the first clamp switch SW3, clamp current flowed from the first reference potential line to the gate terminal of the power switching element P via the first clamp switch SW3, and thereby electrical charge was supplied to the gate terminal until the gate potential reached the first reference potential Vcc.

Since the consideration example and Example 1 differ from each other in the turned ON time from when the first recovery switch SW1 is turned on until it is turned off, the temporal waveforms of the gate current Ig differ from each other. In the consideration example, the gate current Ig exhibited its peak value at the point when the gate potential reached the first reference potential Vcc. On the other hand, in Example 1, the gate current Ig exhibited its peak value before the gate potential reached the first reference potential Vcc, and the gate current Ig had already decreased from the peak value at the point when the gate potential reached the first reference potential Vcc.

The gate current Ig in Example 1 will be described below in more detail. An operation for turning on the power switching element P was initiated by turning on the first recovery switch SW1. The absolute value of the gate current Ig continued to increase from when the first recovery switch SW1 was turned on. Before the gate potential reached the first reference potential Vcc, the absolute value of the gate current Ig had reached its maximum peak value. After reaching the maximum peak value, the absolute value of the gate current Ig decreased. Thereafter, the absolute value of the gate current Ig increased again and reached a peak value that was smaller than the maximum peak value. Thereafter, the absolute value of the gate current Ig decreased again.

In Example 1, before the gate potential reached the first reference potential Vcc, the first recovery switch SW1 was turned off, and then, after the gate current Ig decreased, the first clamp switch SW3 was turned on. Thus, two mountains appeared in the temporal waveform of the gate current Ig. Of the peaks of the two mountains, the first peak was larger than the second peak. If the gate potential has reached the first reference potential Vcc at the point when the first clamp switch SW3 is turned on, no clamp current flows after the first clamp switch SW3 is turned on, and thus one mountain appears. In any case, since the resonance current is larger than the clamp current, the peak of the mountain that appears first is predicted to reach the maximum peak value of the gate current Ig.

The absolute value of the gate current Ig when the gate potential reaches the first reference potential Vcc may be smaller than two-thirds of the maximum peak value of the absolute value of the gate current Ig. The absolute value of the gate current Ig when the gate potential reaches the first reference potential Vcc may be smaller than one-half of the maximum peak value of the absolute value of the gate current Ig. The absolute value of the gate current Ig when the gate potential reaches the first reference potential Vcc may be substantially zero. In this case, the regenerative current is completely suppressed.

In the consideration example and Example 1, the control circuit 20 controls the on/off states of the first recovery switch SW1, the second recovery switch SW2, the first clamp switch SW3, and the second clamp switch SW4. As a result of the control, the gate voltage Vgs and the gate current Ig are supplied to the gate terminal of the power switching element P. The timings at which the first recovery switch SW1, the second recovery switch SW2, the first clamp switch SW3, and the second clamp switch SW4 are turned on or off may also be determined based on theoretical values or values resulting from an experiment or simulation. Information indicating the timings may also be recorded in the control circuit 20 in advance. Unlike Example 1, for instance, the gate driving apparatus 100 may have a detecting unit for detecting the gate voltage Vgs and/or the gate current Ig. In this case, the detecting unit may feed back the detection value to the control circuit 20. Furthermore, the control circuit 20 may determine the on/off timings of the first recovery switch SW1, the second recovery switch SW2, the first clamp switch SW3, and the second clamp switch SW4, based on the detection values.

Figure 10:
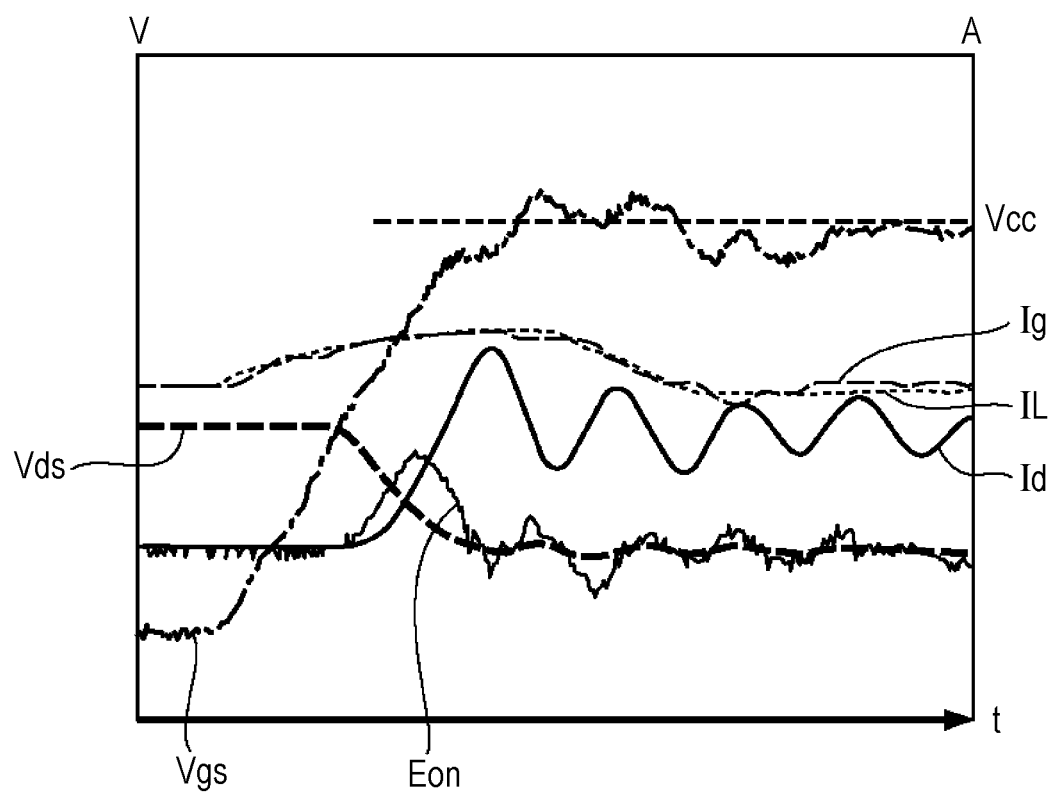
FIG. 10 is a graph illustrating an experimental result according to the consideration example.
Figure 11:
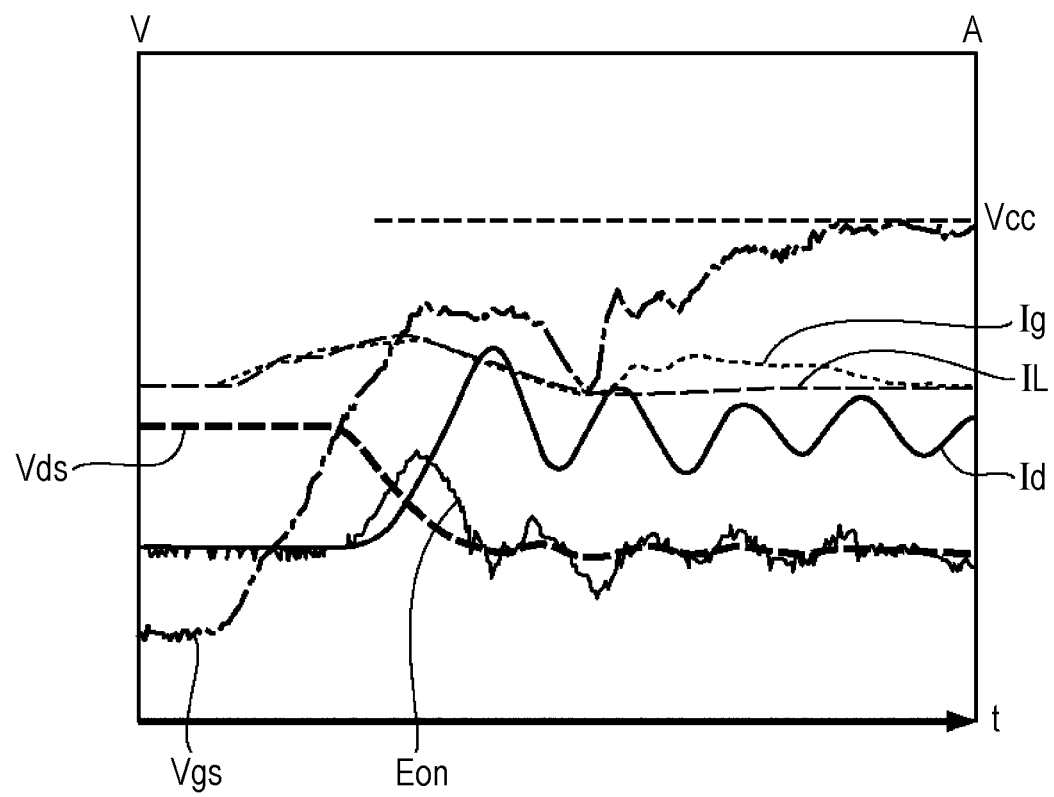
FIG. 11 is a graph illustrating an experimental result according to Example 1 of the first embodiment.

FIG. 10 illustrates details of an experimental result in a consideration example of a control method. FIG. 11 illustrates details of an experimental result in Example 1 of a control method 1 according to the first embodiment. FIGS. 10 and 11 illustrate relationships of the drain voltage Vds, the drain current Id, and turn-on loss Eon, in addition to the gate voltage Vgs, the coil current IL, and the gate current Ig. The experimental result illustrated in FIG. 10 corresponds to the simulation result illustrated in FIG. 8, and the experimental result illustrated in FIG. 11 corresponds to the simulation result illustrated in FIG. 9.

For example, when the gate voltage Vgs exceeds a threshold voltage Vth, the power switching element P is turned on. The higher the rate of change in the gate voltage per unit time, $\Delta Vgs/\Delta t$, in the vicinity in which the gate voltage Vgs exceeds the threshold voltage Vth is, the higher the switching speed of the power switching element P is. In addition, the larger the gate current Ig is, the higher the rate of change in the gate voltage per unit time, $\Delta Vgs/\Delta t$, is.

A more specific description will be given below. When the input capacitance Ciss of the power switching element P is an ideal capacitor, the following equation holds:

$$Ig = Ciss \cdot \Delta Vgs/\Delta t \qquad (1).$$

The rate of change in the gate voltage per unit time, $\Delta Vgs/\Delta t$, is proportional to the gate current Ig. In an actual power switching element P, the input capacitance Ciss depends on the drain voltage Vds. Therefore, the rate of change in the gate voltage per unit time, $\Delta Vgs/\Delta t$, and the gate current Ig are not exactly proportional to each other. However, the rate of change in the gate voltage per unit time, $\Delta Vgs/\Delta t$, and the gate current Ig have a relationship similar to a proportional relationship. The higher the gate voltage Vgs is, the lower the on-resistance of the power switching element P is. Thus, as the gate current Ig during switching is increased, the rate of change in the gate voltage per unit time, $\Delta Vgs/\Delta t$, increases, thereby making it possible to quickly reduce the on-resistance of the power switching element P.

In FIGS. 10 and 11, the timing at which the power switching element P is turned on corresponds to the time when the turn-on loss Eon reaches its maximum. In the consideration example illustrated in FIG. 10, the timing at which the power switching element is turned on and the timing at which the gate current Ig reaches its peak were temporally separated from each other. Specifically, the power switching element P was turned on by the gate voltage Vgs exceeding the threshold voltage Vth, and then the gate current Ig reached its maximum because of the resonance current. On the other hand, in Example 1 illustrated in FIG. 11, the gate current Ig reached its maximum peak in the vicinity of the timing at which the power switching element was turned on.

A comparison between the experimental result according to the consideration example illustrated in FIG. 10 and the experimental result according to Example 1 illustrated in FIG. 11 shows that the rates of change in the drain voltage per unit time, ΔVds/Δt, were substantially the same. The turn-on losses Eon of the two experimental results were also substantially the same. The gate-source ringing voltages of the two experimental results were also substantially the same. Driver loss Pdrv, which is loss of the gate driver 10, in Example 1 was lower than that in the consideration example.

As described above, the consideration example and Example 1 differ from each other in the timing at which the first recovery switch SW1 is turned off. The ratio of the turned ON time of the first recovery switch SW1 to the resonance period may hereinafter be referred to as "The ratio of the turned ON time to the resonance period". The ratio of the turned ON time to the resonance period in Example 1 was one sixth (≈16.7%), and that in the consideration example was 30%.

Figure 12:
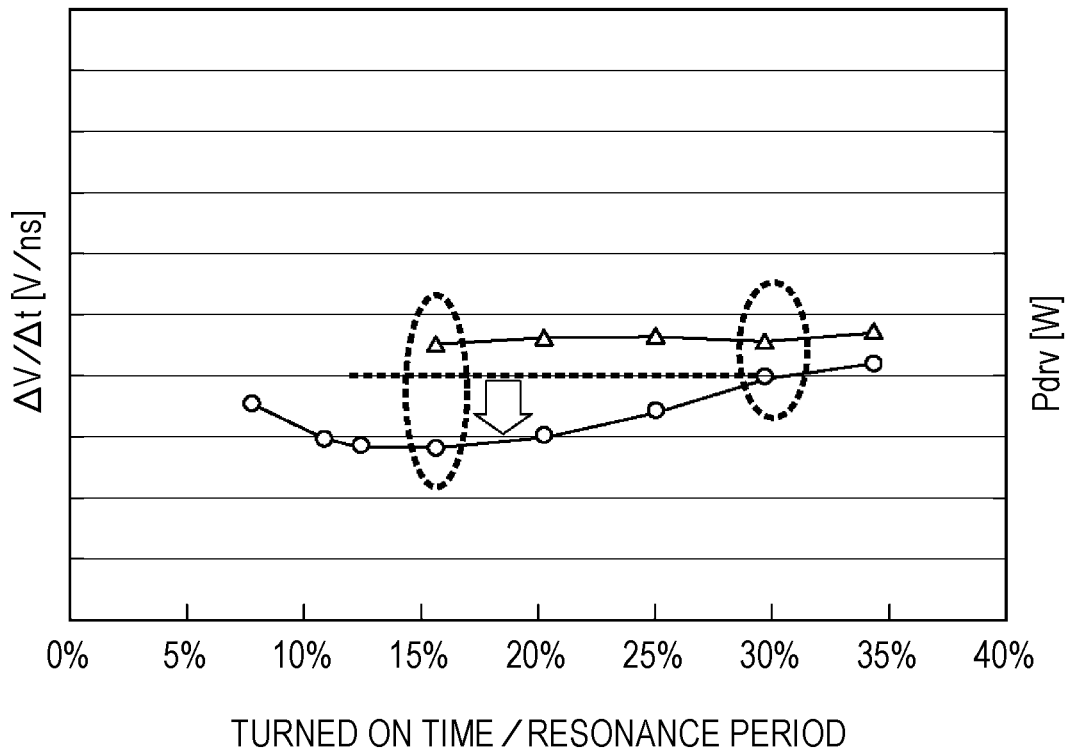
FIG. 12 is a graph illustrating relationships of the ratio of a turned ON time to resonance period, the rate of change in a drain voltage per unit time, and driver loss.

FIG. 12 illustrates one example of relationships of the ratio of the turned ON time to the resonance period, the rate of change in the drain voltage per unit time, ΔVds/Δt, and the driver loss Pdrv. A line graph plotted with triangle marks represents the rate of change in the drain voltage per unit time, ΔVds/Δt, and a line graph plotted with circle marks represents the driver loss Pdrv. The rate of change in the drain voltage per unit time, ΔVds/Δt, is one index indicating switching characteristics when the gate driving apparatus 100 switches the power switching element P. Thus, a gate driving apparatus in which the rate of change in the drain voltage per unit time, ΔVds/Δt, is high and the driver loss Pdrv is small is a high-quality gate driving apparatus.

The rate of change in the drain voltage per unit time, ΔVds/Δt, was stable at a certain value, in a range in which the ratio of the turned ON time to the resonance period was 15% or more. In this range, the driver loss Pdrv increased as the ratio of the turned ON time to the resonance period increased. This is probably because the larger the unwanted circulating current and regenerative current are, the larger the ratio of the turned ON time to the resonance period is. On the other hand, in a range in which the ratio of the turned ON time to the resonance period was smaller than 15%, the driver loss Pdrv increased as the ratio of the turned ON time to the resonance period decreased. This is because, if the ratio of the turned ON time to the resonance period is too small, the potential that can be reached with the resonance current becomes low, and loss due to the clamp current increases.

As described above, the ratio of the turned ON time to the resonance period in the consideration example was 30%, and that in Example 1 was 16.7%. As illustrated in FIG. 12, the rates of change in the drain voltage per unit time, ΔVds/Δt, in the case when the ratio of the turned ON time to the resonance period was 16.7% were substantially the same as that in the case when the ratio was 30%. On the other hand, the driver loss Pdrv in the case when in which the ratio of the turned ON time to the resonance period was 16.7% was considerably smaller than that in the case in which the ratio was 30%. In the example illustrated in FIG. 12, the driver loss Pdrv in the case in which the ratio was 16.7% was about 17% smaller than the driver loss Pdrv in the case in which the ratio was 30%.

Thus, compared with the driving method according to the consideration example, the driving method according to Example 1 can considerably reduce the driver loss and can also reduce the ringing voltage, while exhibiting equivalent switching characteristics. In the driving method according to Example 1, the driver loss can be reduced in order to prevent the occurrence of unwanted circulating current and regenerative current. The reason why the switching characteristics are equivalent is that, in the driving method according to Example 1, the power switching element P is turned on in the vicinity of the timing at which the gate current Ig reaches its maximum. This allows the gate current Ig to be efficiently used.

[Relationship between Resonance Voltage and Gate Voltage]

The power source for resonance, the coil being included in the driving apparatus, and the input capacitor of the power switching element constitute an LC series resonance circuit. The "power source for resonance" refers to a power source included in a closed loop during resonance. The voltage of the input capacitor of the power switching element corresponds to the gate voltage. The description below will be given of a relationship between the amplitude of the resonance voltage and the amplitude of the gate voltage.

First, a description will be given of the amplitude of the resonance voltage. When resonance is started, resonance current begins to flow to the gate terminal of the power switching element. The resonance voltage begins to vary with a temporal waveform which has the amplitude of a substantive resonance source voltage with reference to a potential applied by the power source for resonance. That is, if the resonant phenomenon is continued without blocking the current in the closed loop, the gate voltage of the power switching element can vary in twice the range of a substantive resonance source voltage.

The "substantive resonance source voltage" as used herein refers to a value obtained by adding or subtracting the gate voltage immediately before the start of the resonance to or from the voltage supplied by the power source for resonance. For example, if the initial gate voltage applied to the input capacitor of the power switching element immediately before the gate voltage rises has a positive polarity, the initial gate voltage cancels the voltage supplied by the power source for resonance. That is, when the gate voltage rises, the substantive resonance source voltage has a value obtained by subtracting the initial gate voltage from the voltage supplied by the power source for resonance. For example, if the initial gate voltage applied to the input capacitor of the power switching element immediately before the falling of the gate voltage has a positive polarity, the initial gate voltage is added to the voltage supplied by the power source for resonance. That is, when the gate voltage falls, the substantive resonance source voltage has a value obtained by adding the initial gate voltage to the voltage supplied by the power source for resonance. The substantive resonance source voltage is equal to the voltage applied between both terminals of the coil immediately after the start of the resonance. In the LC series resonance circuit, a value of the voltage applied to both terminals of the coil is equal to the amplitude of the resonance voltage applied to the capacitor.

Next, a description will be given of the amplitude of the gate voltage. The potential of the control terminal of the power switching element switches between the second reference potential Vss and the first reference potential Vcc. Viewed from a different perspective, the gate voltage of the power switching element varies with an amplitude, given by (Vcc−Vss)×½, with reference to the intermediate value of the first reference potential Vcc and the second reference potential Vss. In the present disclosure, this amplitude may be referred to as "amplitude of the gate voltage".

When the substantive resonance source voltage is higher than or equal to the amplitude of the gate voltage, the resonance current causes the potential of the power switching element to change from one of the reference potentials to the other reference potential. However, when the substantive resonance source voltage is higher than the amplitude of the gate voltage, excessive current can occur. For example, as illustrated in FIG. 1, when the voltage supplied by the power source for resonance is Vcc−Vss, excessive current can occur.

In the consideration example illustrated in FIG. 2, excessive current flows through the recovery unit as circulating current and regenerative current, as described above. In this case, however, power loss occurs. In the example of the control method according to the first embodiment illustrated in FIG. 5, the first recovery switch SW1 is turned off before the voltage of the input capacitor reaches Vcc−Vss. Thus, neither circulating current nor regenerative current occurs, so that no power loss occurs. That is, the first embodiment can be used when the substantive resonance source voltage is higher than the amplitude of the gate voltage.

Another conceivable method is that the substantive resonance source voltage is made equal to the amplitude of the gate voltage to thereby prevent the occurrence of excessive current. For example, the driving apparatus illustrated in FIG. 13 has a power source E1, which applies a first reference potential Vcc and a second reference potential Vss, and an auxiliary power source E2 for resonance, which applies a half of the voltage of the power source E1, that is, (Vcc−Vss)×½. In this case, at the point when the voltage applied to the input capacitor C1 reaches (Vcc−Vss)×½, the storage of energy in the coil is completed, and then the energy stored in the coil begins to be released. In other words, even when the first recovery switch SW1 is not turned off, the resonance current supplied to the power switching element decays. Thus, if the power source for resonance continues to supply the voltage to the LC series resonance circuit, the resonance current flowing through the control terminal of the power switching element decays to the vicinity of 0. Hence, in this case, neither circulating current nor regenerative current occurs. In the present disclosure, a method in which the voltage from the power source for resonance continues to be supplied to the LC series resonance circuit until the resonance current that flows through the control terminal of the power switching element decays to the vicinity of 0 is referred to as a "middle voltage method".

The description below will be given of a difference between a driving method according to the first embodiment and a driving method according to the middle voltage method.

Figure 13:
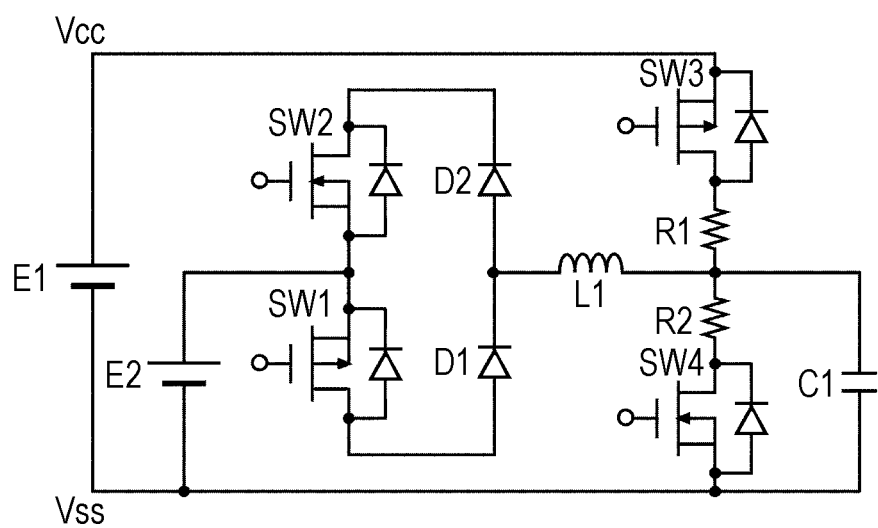
FIG. 13 illustrates an example configuration of a gate driver operated by a middle voltage method.

FIG. 13 illustrates the configuration of a gate driver operated by the middle voltage method and an input capacitor C1 of a switching element P. The gate driver illustrated in FIG. 13 and the gate driver 10 illustrated in FIG. 1 differ from each other in the configuration. Compared with the gate driver 10 in the first embodiment illustrated in FIG. 1, the gate driver illustrated in FIG. 13 is different in that it has an auxiliary power source E2 and does not have the first clamp diode D3 and the second clamp diode D4. The auxiliary power source E2 generates a potential that is a half of the first reference potential Vcc generated by the power source E1. Hereinafter, the potential generated by the auxiliary power source E2 may be referred to as a "third reference potential", and a current path through which the third reference potential is supplied may be referred to as a "third reference potential line". In the example illustrated in FIG. 13, the reference potential of the lower potential-side of the auxiliary power source E2 is equal to the second reference potential Vss.

The third reference potential line is connected to a node between the first recovery switch SW1 and the second recovery switch SW2, and the auxiliary power source E2 serves as a power source for resonance.

One end of the first recovery switch SW1 is connected to the third reference potential line, and another end of the first recovery switch SW1 is connected to an anode terminal of the first recovery diode D1. A cathode terminal of the first recovery diode D1 is connected to the input-side terminal of the coil L1. In the example illustrated in FIG. 13, the first recovery switch SW1 is a p-channel MOSFET, the source terminal of the p-channel MOSFET is connected to the third reference potential line, and the drain terminal thereof is connected to the anode terminal of the first recovery diode D1. In the example illustrated in FIG. 13, the anode terminal of the first recovery diode D1 is connected to the drain terminal of the p-channel MOSFET, and the cathode terminal of the first recovery diode D1 is connected to the input-side terminal of the coil L1.

One end of the second recovery switch SW2 is connected to the third reference potential line, and another end of the second recovery switch SW2 is connected to a cathode terminal of the second recovery diode D2. An anode terminal of the second recovery diode D2 is connected to the input-side terminal of the coil L1. In the example illustrated in FIG. 13, the second recovery switch SW2 is an n-channel MOSFET, the source terminal of the n-channel MOSFET is connected to the third reference potential line, and the drain terminal of the n-channel MOSFET is connected to the cathode terminal of the second recovery diode D2. In the example illustrated in FIG. 13, the cathode terminal of the second recovery diode D2 is connected to the drain terminal of the n-channel MOSFET, and the anode terminal of the second recovery diode D2 is connected to the input-side terminal of the coil L1.

The first recovery switch SW1 and the first recovery diode D1 may also be provided in series between the third reference potential line and the input-side terminal of the coil L1. For example, the first recovery diode D1 may also be provided between the first recovery switch SW1 and the third reference potential line. The second recovery switch SW2 and the second recovery diode D2 may be provided in series between the third reference potential line and the input-side terminal of the coil L1. For example, the second recovery diode D2 may also be provided between the second recovery switch SW2 and the third reference potential line. In the gate driver according to the middle voltage method, a first recovery diode may be referred to as a "charging diode", and a second recovery diode may be referred to as a "discharging diode".

A description will be given of a case in which the power switching element P is turned on in the middle voltage method. First, the first recovery switch SW1 is turned on, so that energy is stored in the coil L1 and the capacitor C1 is charged. Since the voltage of the auxiliary power source E2 is a half of the voltage of the power source E1, the storage of energy in the coil L1 is completed when the gate potential reaches the third reference potential, which is a half of the first reference potential Vcc. Thereafter, the energy stored in the coil L1 begins to be released. Thus, the resonance current begins to decrease when the gate potential reaches the third reference potential, regardless of whether the first recovery switch SW1 is turned off. Next, in the vicinity in which the resonance current reaches zero, the first clamp switch SW3 is turned on, so that the clamp current flows to the gate terminal of the power switching element P. Thus, in the middle voltage method, since excessive energy is not stored in the coil L1 and excessive resonance current does not flow, neither unwanted circulating current nor regenerative current flows. A case in which the power switching element P is turned off can also be described in the same manner.

Figure 14:
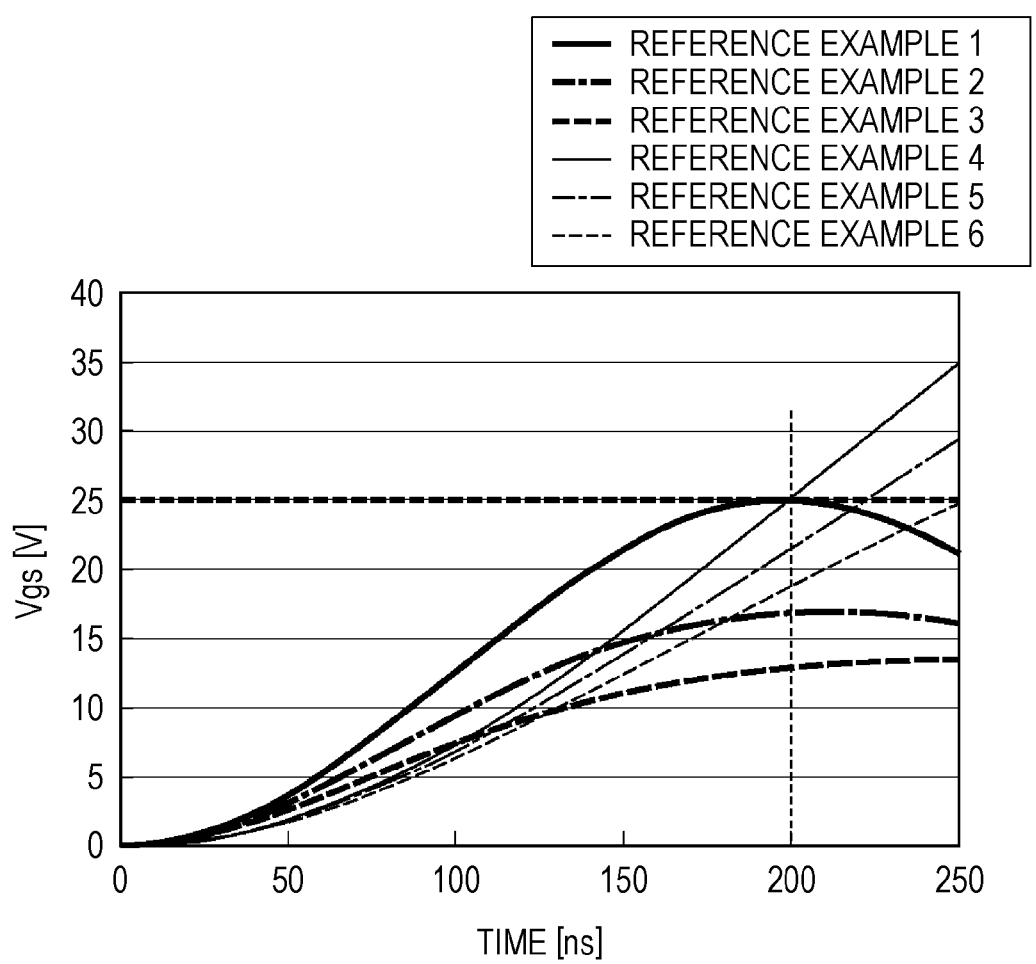
FIG. 14 is a graph illustrating one example of a turned ON time versus a gate voltage in reference examples 1 to 6.

FIG. 14 illustrates an elapsed time from when the first recovery switch SW1 is turned on versus the gate voltage Vgs in reference examples 1 to 6. In reference examples 1 to 3, a circuit in which a resistor Rs was additionally connected in series with the input capacitor C1 in the circuit illustrated in FIG. 13 was assumed, and temporal changes in the gate voltage Vgs after the first recovery switch SW1 in this circuit was turned on were simulated. The resistance values of the resistor Rs in reference examples 1, 2, and 3 were set to 0Ω, 1Ω, and 2Ω, respectively. In reference example 4 to 6, a circuit in which a resistor Rs was additionally connected in series with the input capacitor C1 in the circuit illustrated in FIG. 1 was assumed, and temporal changes in the gate voltage Vgs after the first recovery switch SW1 in this circuit was turned on were simulated. The resistance values of the resistor Rs in reference examples 4, 5, and 6 were set to 0Ω, 1Ω, and 2Ω, respectively. Reference examples 4, 5 and 6 differ from the control method 1 of the first embodiment in that the first recovery switch SW1 is also maintained in the turned ON state after the gate voltage Vg reaches the fixed voltage. In reference examples 1 to 6, the fixed voltages of the gate voltage Vgs were all set to 25 V. In reference examples 1 to 6, the resistor Rs corresponds to, for example, the resistance components of the coil L1 or wires in the gate driver 10 or a resistance in the power switching element P.

As illustrated in FIG. 14, in reference examples 1 to 3 and reference examples 4 to 6, the larger the resistance value of the resistor Rs was, the later the timing at which the gate voltage Vgs reached the fixed voltage level was.

In reference examples 2 and 3, the gate voltage Vgs did not reach the fixed voltage. This is because, in the gate drive circuit illustrated in FIG. 13, twice the voltage supplied to the power source for resonance E2 is equal to the fixed voltage. In this case, it is difficult to make the gate voltage Vgs to reach the fixed voltage, when loss occurs due to the resistor Rs. In the cases of reference examples 1 to 3 controlled by the middle voltage method, for example, when the first clamp switch SW3 is turned on, electrical charge is supplied to the input capacitor C1 due to the clamp current, so that the gate voltage Vgs can reach the fixed voltage. However, loss in the clamp unit 12 increases as the clamp current increases.

On the other hand, in reference example 4 to 6, the gate voltages Vgs reached the fixed voltage, although the timings are different from each other. This is because, in the gate driving apparatus 100 illustrated in FIG. 1, twice the voltage supplied by the power source for resonance E1 is sufficiently higher than the fixed voltage. Thus, the results of reference example 4 to 6 support the following advantage of the gate driving apparatus 100 in the first embodiment. That is, according to the gate driving apparatus 100 in the first embodiment, even if the parasitic resistor Rs is provided therein, the timing at which the first recovery switch SW1 is turned off is controlled, to thereby make it possible to generate resonance current that is sufficient to make the gate potential to approach the fixed potential. A similar advantage is also offered when the power switching element P is turned off. That is, according to the gate driving apparatus 100 in the first embodiment, even if the parasitic resistor Rs is provided, the timing at which the second recovery switch SW2 is turned off is controlled, thereby making it possible to generate resonance current that is sufficient to make the gate potential to approach the fixed potential.

In the case of the control method in the middle voltage method, the ratio of the turned ON time to the resonance period is one-half or more. On the other hand, in the case of the control method of the first embodiment, it is sufficient that the ratio of the turned ON time to the resonance period is one-sixth or more. That is, according to the control method of the first embodiment, the first recovery switch SW1 can be turned off after the first recovery switch SW1 is turned on and then one-sixth of the resonance period passes and before one-half of the resonance period passes.

[Effect]

Since the driving method according to the first embodiment can reduce unwanted circulating current and regenerative current, it is possible to reduce power loss of the gate driving apparatus 100. In the driving method according to the first embodiment, the gate current Ig can reach its maximum peak value in the vicinity in which the gate voltage Vgs exceeds the threshold voltage Vth. Thus, since the gate current Ig is efficiently used, the switching characteristics of the power switching element P can be maintained or enhanced.

(Various Modified Examples of First Embodiment)

The description below will be given of a modified example of the gate driving apparatus 100 according to the first embodiment. Hereinafter, descriptions and illustrations may be omitted with respect to portions that are the same as or similar to those in the driving apparatus 100 illustrated in FIG. 1 and those in the control method illustrated in FIG. 5. For example, FIGS. 15 to 21, 23, and 24 each illustrate a gate driver 10 and an input capacitor C1 of a power switching element. For example, gate driving apparatuses 100 illustrated in FIGS. 15 to 20 can be operated by the control method illustrated in FIG. 5.

Figure 15:
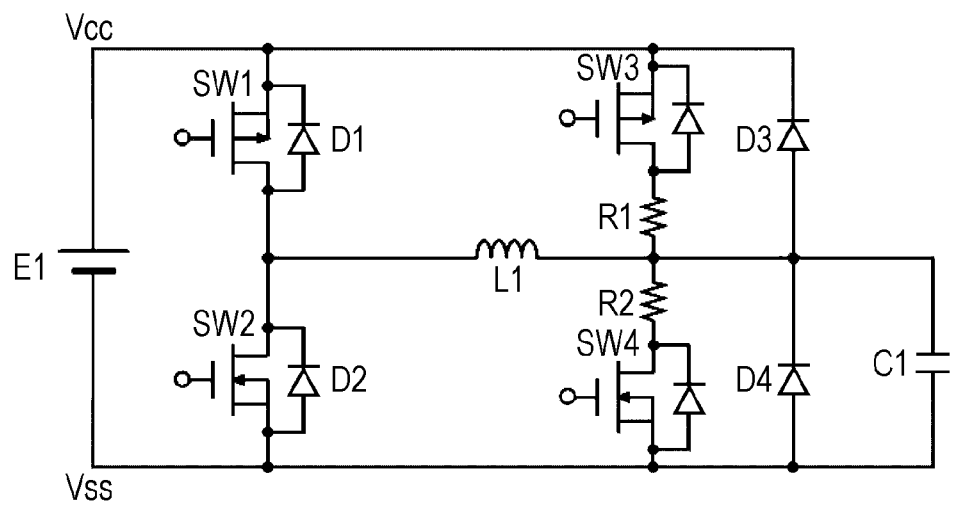
FIG. 15 is a graph illustrating the configuration of a gate driving apparatus according to modified example 1 of the first embodiment.

FIG. 15 illustrates the configuration of a gate driving apparatus 100 according to modified example 1 of the first embodiment. In the gate driving apparatus 100 according to modified example 1, the first recovery diode D1 and the second recovery diode D2 are omitted, compared with the gate driving apparatus 100 illustrated in FIG. 1. In the gate driving apparatus 100 according to modified example 1, the first recovery switch SW1 is a first MOSFET, the second recovery switch SW2 is a second MOSFET, the first recovery diode D1 is a body diode of the first MOSFET, and the second recovery diode D2 is a body diode of the second MOSFET. As illustrated in FIG. 1, when the body diode of a MOSFET and another diode are used together, current preferentially flows to the diode having better characteristics.

Figure 16:
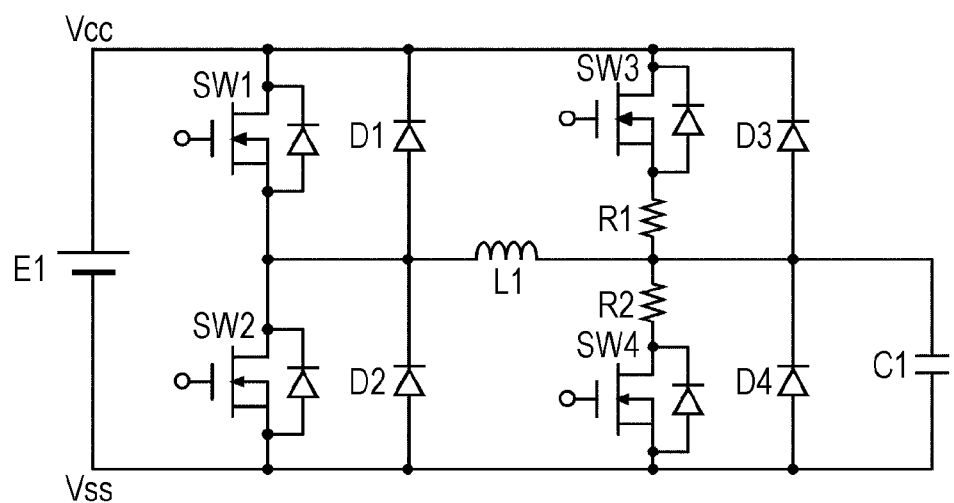
FIG. 16 illustrates the configuration of a gate driving apparatus according to modified example 2 of the first embodiment.

FIG. 16 illustrates the configuration of a gate driving apparatus 100 according to modified example 2 of the first embodiment. In the gate driving apparatus 100 according to modified example 2, the first recovery switch SW1 and the first clamp switch SW3 are n-channel MOSFETs.

Figure 17:
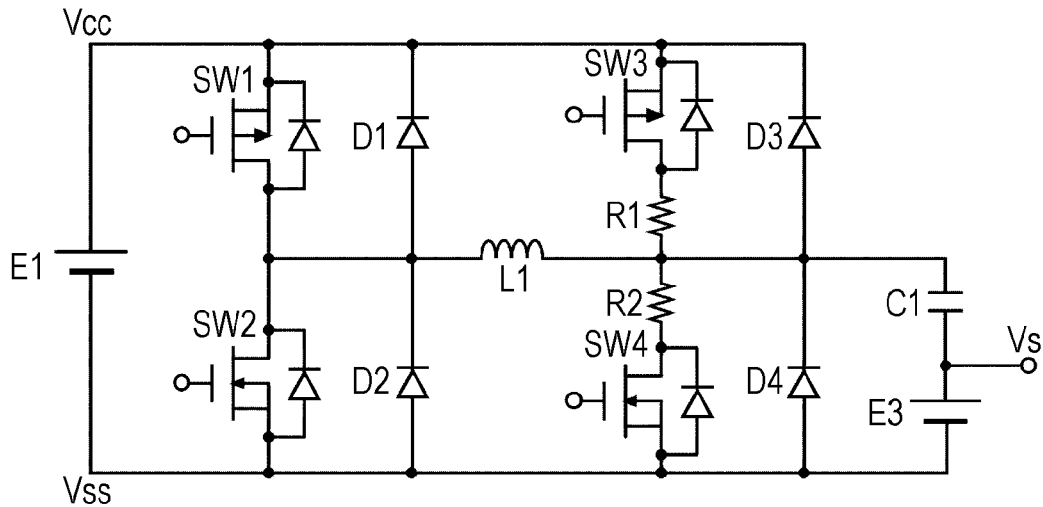
FIG. 17 illustrates the configuration of a gate driving apparatus according to modified example 3 of the first embodiment.

FIG. 17 illustrates the configuration of a gate driving apparatus 100 according to modified example 3 of the first embodiment. In the gate driving apparatus 100 according to modified example 3, the second reference potential Vss of the power source E1 is set to a negative potential. An auxiliary power source E3 is provided between the source terminal of the power switching element P and the second reference potential line. Thus, the potential of the auxiliary power source E3, not the second reference potential Vss from the second reference potential line, is supplied to the source terminal of the power switching element P. In the example in FIG. 17, the first reference potential Vcc of the power source E1 may be 20 V, the second reference potential Vss may be −5 V, and the voltage supplied by the auxiliary power source E3 may be 5 V. In this case, the gate driving apparatus 100 according to modified example 3 can apply a gate voltage of −5 V between the gate and the source of the power switching element P. For example, when the power switching element P is a normally-ON power device or a power device having a small threshold value, the gate driving apparatus 100 according to modified example 3 can apply a negative bias between the gate and the source of the power switching element P. That is, after the power switching element P is turned off, the gate driving apparatus 100 according to modified example 3 can fix the voltage between the gate and the source of the power switching element to a negative voltage.

Figure 18:
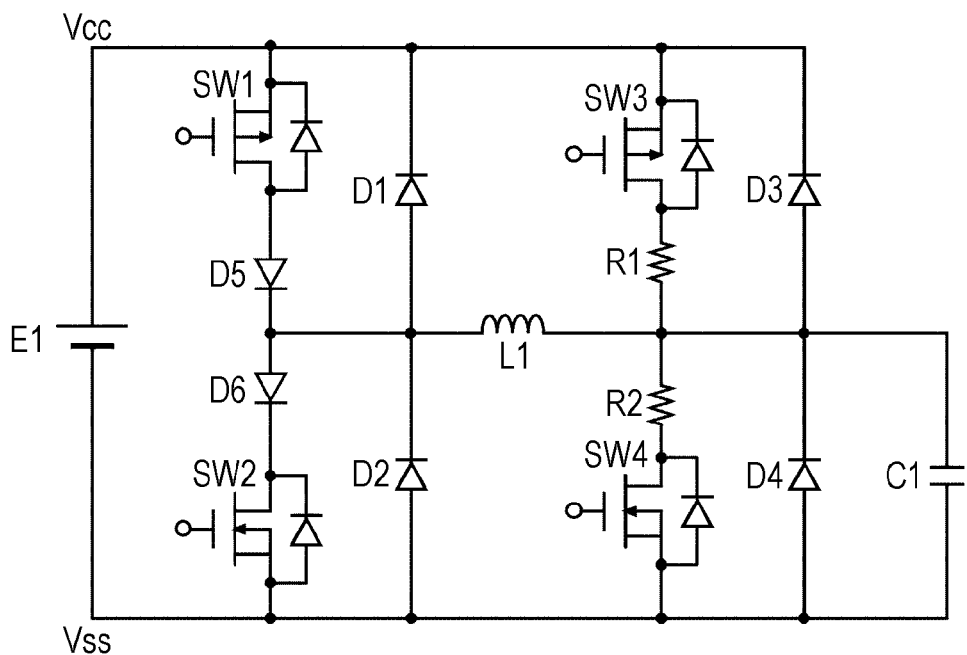
FIG. 18 illustrates the configuration of a gate driving apparatus according to modified example 4 of the first embodiment.

FIG. 18 illustrates the configuration of a gate driving apparatus 100 according to modified example 4 of the first embodiment. The gate driving apparatus 100 according to modified example 4 includes a diode D5 for reverse-flow blocking and a diode D6 for reverse-flow blocking. The diode D5 for reverse-flow blocking is provided between the first recovery switch SW1 and the input-side terminal of the coil L1, and the diode D6 for reverse-flow blocking is provided between the second recovery switch SW2 and the input-side terminal of the coil L1. The diode D5 for reverse-flow blocking can block current flowing to the body diode of the first recovery switch SW1 and can pass the current to the first recovery diode D1 exclusively. The diode D6 for reverse-flow blocking can block current flowing to the body diode of the second recovery switch SW2 and can pass the current to the second recovery diode D2 exclusively.

Figure 19:
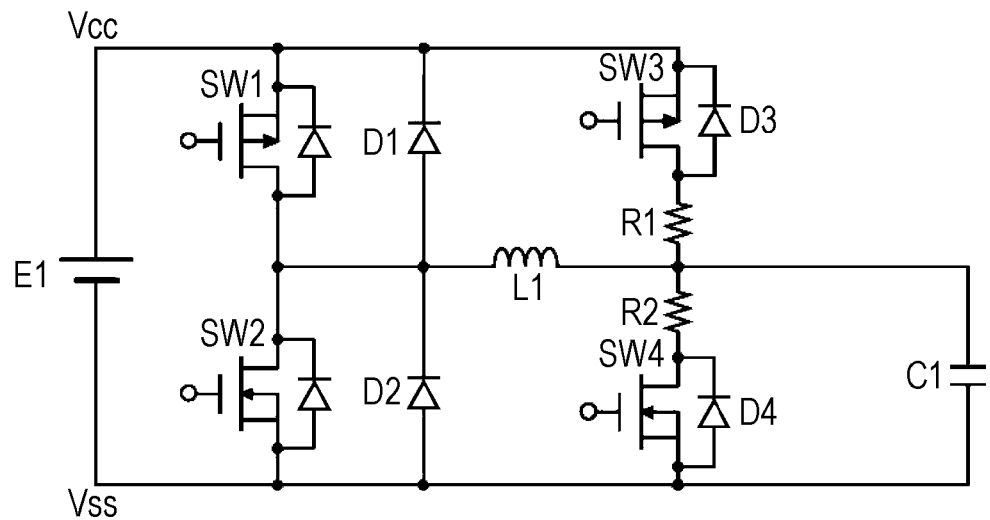
FIG. 19 illustrates the configuration of a gate driving apparatus according to modified example 5 of the first embodiment.

FIG. 19 illustrates the configuration of a gate driving apparatus 100 according to modified example 5 of the first embodiment. In the gate driving apparatus 100 according to modified example 5, the first clamp diode D3 and the second clamp diode D4 are omitted, compared with the gate driving apparatus 100 illustrated in FIG. 1. When the first clamp switch SW3 is a third MOSFET, the first clamp diode D3 is a body diode of a first MOSFET. When the second clamp switch SW4 is a fourth MOSFET, the second clamp diode D4 is a body diode of a second MOSFET. When the body diode of a MOSFET and another diode are used together, as illustrated in FIG. 1, current preferentially flows to a diode having favorable characteristics.

Figure 20:
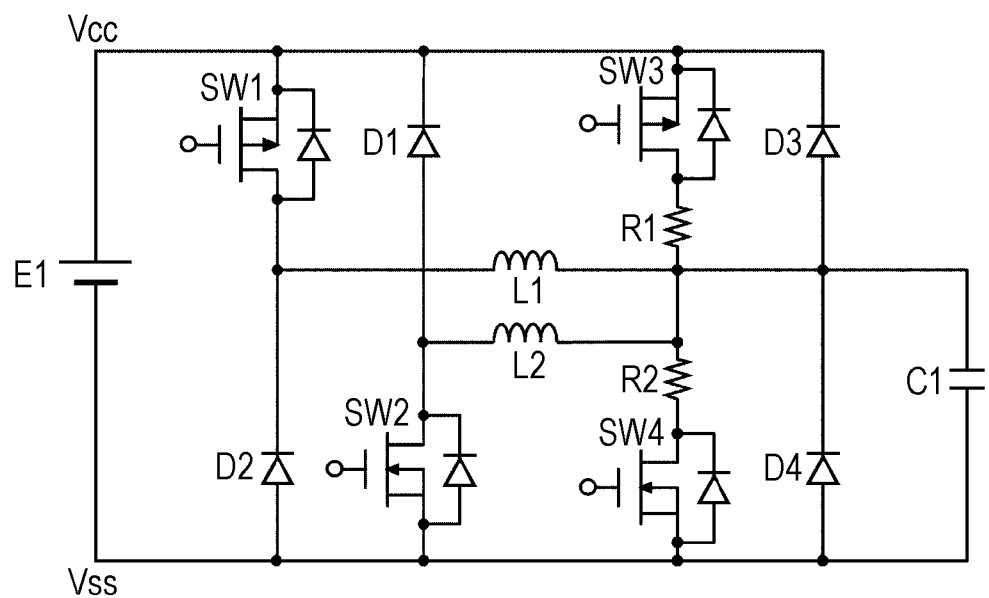
FIG. 20 illustrates the configuration of a gate driving apparatus according to modified example 6 of the first embodiment.

FIG. 20 illustrates the configuration of a gate driving apparatus 100 according to modified example 6 of the first embodiment. The gate driving apparatus 100 according to modified example 6 has a first coil L1 and a second coil L2. Thus, the rise waveform and the fall waveform of the gate voltage Vgs can be different from each other. Specifically, a first recovery switch SW1 is connected between an input-side terminal of the first coil L1 and a first reference potential line, and a second recovery diode D2 is connected in a reverse direction between the input-side terminal of the first coil L1 and the second reference potential line. An output-side terminal of the first coil L1 is connected to the gate terminal of the power switching element P. The first recovery diode D1 is connected in a reverse direction between the input-side terminal of the second coil L2 and the first reference potential line, and the second recovery switch SW2 is connected between the input-side terminal of the second coil L2 and the second reference potential line. The output-side terminal of the second coil L2 is connected to the gate terminal of the power switching element P. In this configuration, the rise waveform and the fall waveform of the gate voltage Vgs are different from each other, when the inductance values of the coil L1 and the coil L2 are made different from each other.

Figure 21:
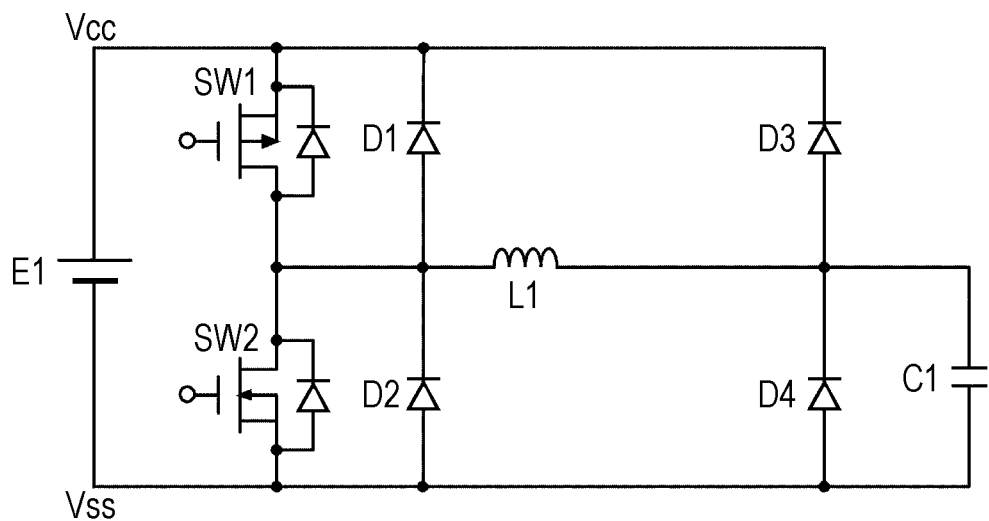
FIG. 21 illustrates the configuration of a gate driving apparatus according to modified example 7 of the first embodiment.

FIG. 21 illustrates the configuration of a gate driving apparatus 100 according to modified example 7 of the first embodiment. In the gate driving apparatus 100 according to modified example 7, the first clamp switch SW3 and the second clamp switch SW4 are omitted, compared with the gate driving apparatus 100 illustrated in FIG. 1. The gate driving apparatus 100 according to modified example 7 cannot additionally pass clamp current to the gate terminal of the power switching element P. Thus, in the gate drive circuit according to modified example 7, resonance current that is sufficient for the gate voltage Vgs to reach a fixed voltage is supplied to the gate terminal of the power switching element P.

Figure 22:
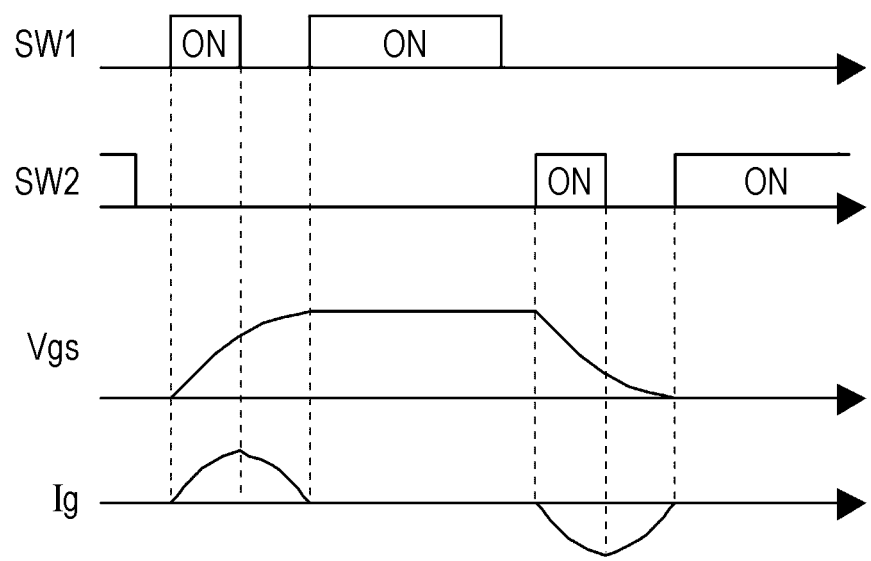
FIG. 22 schematically illustrates one example of a control method according to modified example 7 of the first embodiment.

FIG. 22 schematically illustrates one example of the temporal waveforms of control signals input to the switches SW1 and SW2, the temporal waveform of the gate voltage Vgs, and the temporal waveform of the gate current Ig according to modified example 7 of the first embodiment. A comparison between the waveform of the gate current Ig illustrated in FIG. 22 and the waveform of the gate current Ig illustrated in FIG. 5 shows that the gate current Ig illustrated in FIG. 22 does not have the second mountain due to the clamp current. The waveform of the gate voltage Vgs illustrated in FIG. 22 rises more rapidly than that in FIG. 5. This is because relatively large resonance current flows in the gate driving apparatus 100 according to modified example 7.

Figure 23:
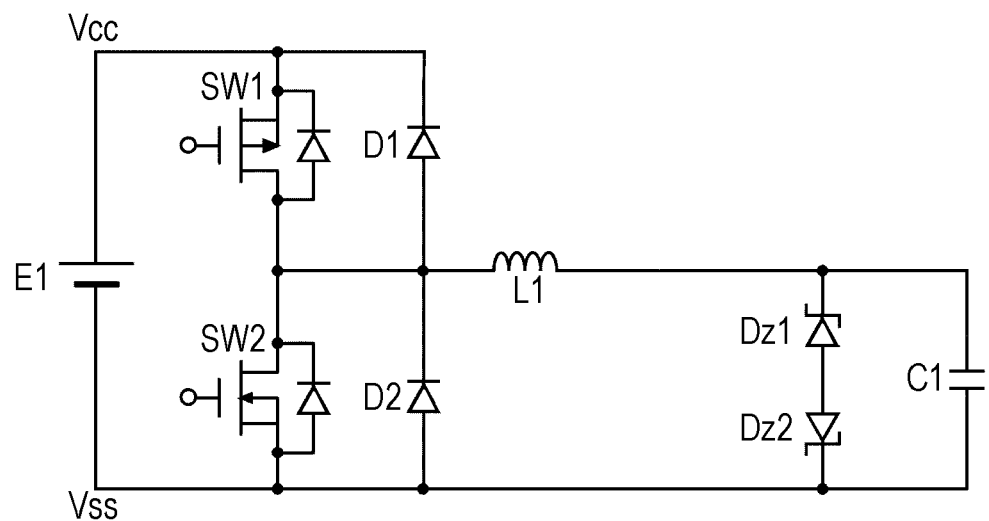
FIG. 23 illustrates the configuration of a gate driving apparatus according to modified example 8 of the first embodiment.

FIG. 23 illustrates the configuration of a gate driving apparatus 100 according to modified example 8 of the first embodiment. In the gate driving apparatus 100 according to modified example 8, the first clamp switch SW3, the second clamp switch SW4, the first clamp diode D3, and the second clamp diode D4 are omitted, and a first Zener diode Dz1 and a second Zener diode Dz2 are added, compared with the gate driving apparatus 100 illustrated in FIG. 1. Specifically, a cathode terminal of the first Zener diode Dz1 is connected to the output-side terminal of the coil L1, an anode terminal of the second Zener diode Dz2 is connected to an anode terminal of the first Zener diode Dz1, and the second reference potential line is connected to a cathode terminal of the second Zener diode Dz2. The gate driving apparatus 100 according to modified example 8 can be operated by the control method illustrated in FIG. 22. This can offer advantages that are similar to those of modified example 7.

Figure 24:
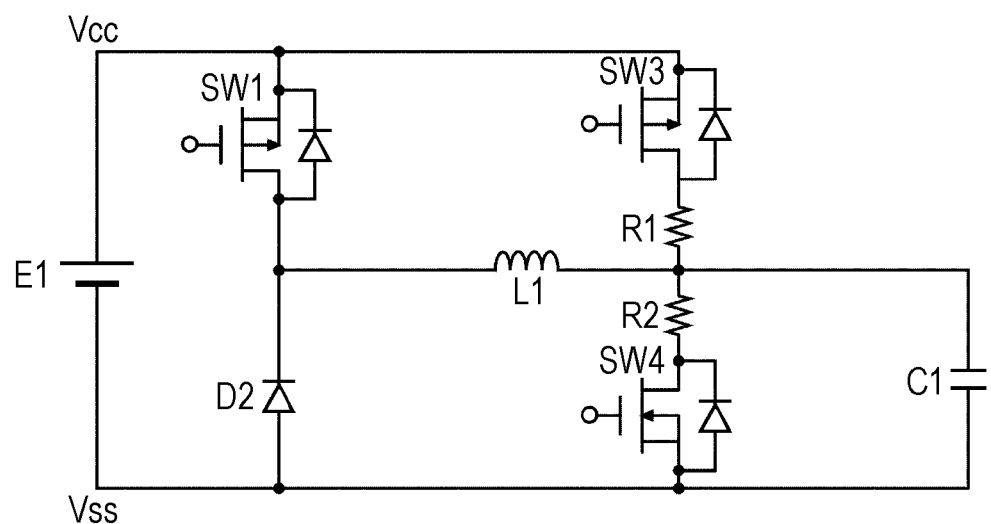
FIG. 24 illustrates the configuration of a gate driving apparatus according to modified example 9 of the first embodiment.

FIG. 24 illustrates the configuration of a gate driving apparatus 100 according to modified example 9 of the first embodiment. In the gate driving apparatus 100 according to modified example 9, the second recovery switch SW2 and the first recovery diode D1 are omitted, compared with the gate driving apparatus 100 illustrated in FIG. 1.

Figure 25:
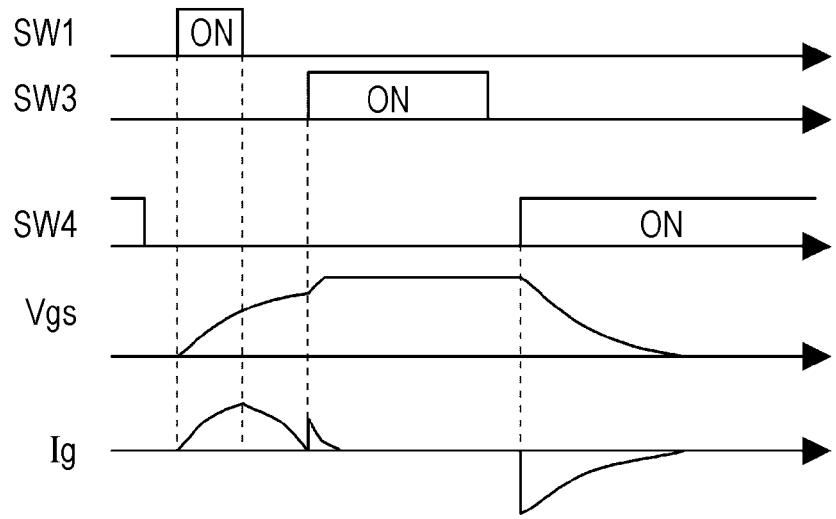
FIG. 25 schematically illustrates a control method according to modified example 9 of the first embodiment.

FIG. 25 schematically illustrates one example of the temporal waveforms of control signals input to the switches SW1, SW3, and SW4, the temporal waveform of the gate voltage Vgs, and the temporal waveform of the gate current Ig according to modified example 9 of the first embodiment. The waveforms of the control signals input to the first recovery switch SW1 and the first clamp switch SW3, the rise waveform of the gate voltage Vgs, and the waveform of the gate current Ig at the time of rising, the waveforms being illustrated in FIG. 25, are analogous to those in the example illustrated in FIG. 5. On the other hand, the waveform of the control signal input to the second clamp switch SW4, the fall waveform of the gate voltage Vgs, and the waveform of the gate current Ig at the time of falling, the waveforms being illustrated in FIG. 25, are different from those in the example illustrated in FIG. 5. Specifically, in modified example 9, after the second clamp switch SW4 is turned on, the fall waveform of the gate voltage Vgs decreases according to an RC time constant. The gate driving apparatus 100 according to modified example 9 may have a configuration in which the first recovery switch SW1 and the second recovery diode D2 are omitted from the gate driving apparatus 100 illustrated in FIG. 1. In this case, the rise waveform of the gate voltage Vgs increases according to the RC time constant.

Of the gate driving apparatuses 100 according to modified examples 1 to 9 of the first embodiment, the gate driving apparatuses 100 in which at least one electrical element is omitted from the gate driving apparatus 100 illustrated in FIG. 1 can reduce the circuit area and the cost, compared with the example illustrated in FIG. 1.

Second Embodiment

A description will be given of a gate driving apparatus and a driving method according to a second embodiment. In the second embodiment, only portions that are different from those in the first embodiment are described, and descriptions of substantially the same portions as those in the first embodiment may be omitted.

A gate driving apparatus 100 according to the second embodiment has, for example, the configuration illustrated in FIG. 1, and a gate driver 10 may be operated by a control method different from that in FIG. 5.

[Control Method 2]

Figure 26:
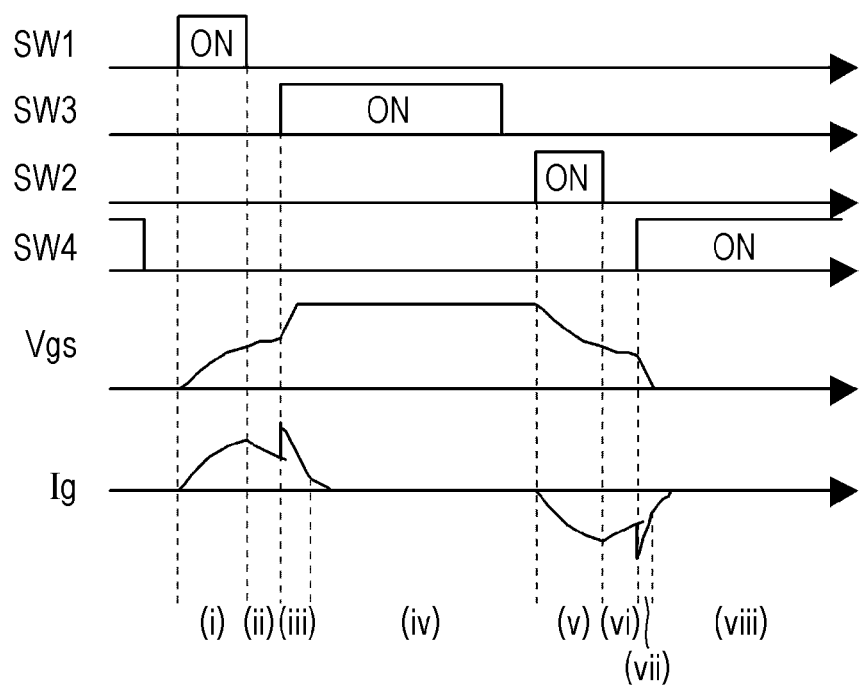
FIG. 26 schematically illustrates one example of control method 2 according to a second embodiment.

FIG. 26 schematically illustrates a first example of the temporal waveforms of control signals input to the respective switches SW1 to SW4, the temporal waveform of the gate voltage Vgs, and the temporal waveform of the gate current Ig according to the second embodiment. The gate voltage Vgs refers to a voltage applied from the gate driver 10 between the gate terminal and the source terminal of the power switching element P. In this case, the reference potential of the gate voltage Vgs is the second reference potential Vss. The gate current Ig refers to a current flowing from the gate driver 10 to the gate terminal of the power switching element P.

FIGS. 27A, 27B, 27C, and 27D illustrate the paths of currents that flow through the gate driver 10 and the input capacitor of the power switching element P in state 1 (i), state 2 (ii), state 3 (iii), and state 4 (iv), respectively, illustrated in FIG. 26. FIGS. 28A, 28B, 28C, and 28D illustrate the paths of currents that flow through the gate driver 10 and the input capacitor of the power switching element P in state 5 (v), state 6 (vi), state 7 (vii), and state 8 (viii), respectively, illustrated in FIG. 26. In FIGS. 28A to 28D and 29, the switches SW1 to SW4 are depicted by the signs of switches, not the signs of MOSFETs, for ease of understanding the circuit configuration. Also, the first resistor R1 and the second resistor R2 are not illustrated.

A case in which the power switching element P is turned on will be described in connection with FIG. 26.

Figure 27A:
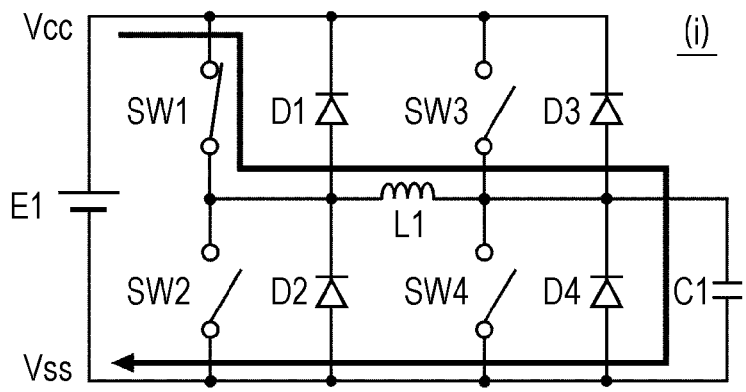
FIGS. 27A to 27D illustrate current paths in control method 2 illustrated in FIG. 26.

First, the control circuit 20 turns on the first recovery switch SW1 to thereby bring about state 1 (i) in which the first recovery switch SW1 is on, and the first clamp switch SW3, the second recovery switch SW2, and the second clamp switch SW4 are off. As illustrated in FIG. 27A, in state 1 (i), current flows from the power source E1 to the coil L1 and the capacitor C1 via the first recovery switch SW1. As a result, energy is stored in the coil L1, and the capacitor C1 is charged. As illustrated in FIG. 26, the gate voltage Vgs and the gate current Ig both increased. At this point, since the coil L1 and the capacitor C1 resonate with each other, resonance current flows from the first reference potential line toward the gate terminal of the power switching element P.

Figure 27B:
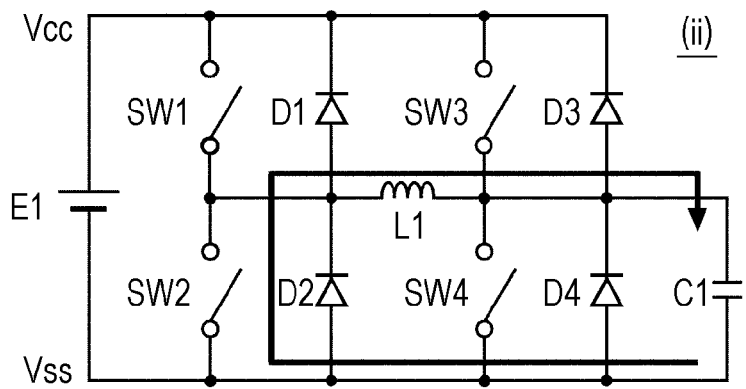

Next, before the gate potential reaches the first reference potential Vcc, the control circuit 20 turns off the first recovery switch SW1 to thereby bring about state 2 (ii) in which the first recovery switch SW1, the first clamp switch SW3, the second recovery switch SW2, and the second clamp switch SW4 are off. As illustrated in FIG. 27B, in state 2 (ii), the coil L1, the capacitor C1, and the second recovery diode D2 form a closed loop passing therethrough. The current generated by the energy stored in the coil L1 charges the capacitor C1. That is, resonance current flows from the coil L1 toward the capacitor C1.

Figure 27C:
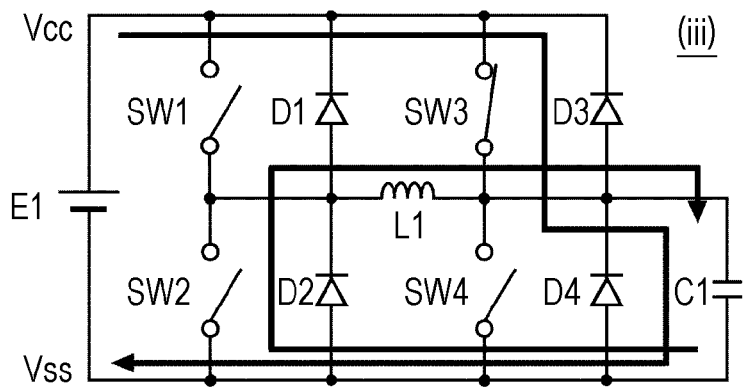

Next, while the resonance current flows, the control circuit 20 turns on the first clamp switch SW3 to thereby bring about state 3 (iii) in which the first clamp switch SW3 is on, and the first recovery switch SW1, the second recovery switch SW2, and the second clamp switch SW4 are off. At the point when the first clamp switch SW3 is turned on, the gate potential has not reached the first reference potential Vcc. Thus, as illustrated in FIG. 27C, the resonance current flows to the capacitor C1 via the second recovery diode D2 and the coil L1, and the clamp current flows from the first reference potential line to the capacitor C1 via the first clamp switch SW3. Accordingly, in state 3 (iii), the resonance current and the clamp current are simultaneously supplied to the gate terminal of the power switching element P. The path through which the clamp current flows is different from the path through which the resonance current flows.

Figure 27D:
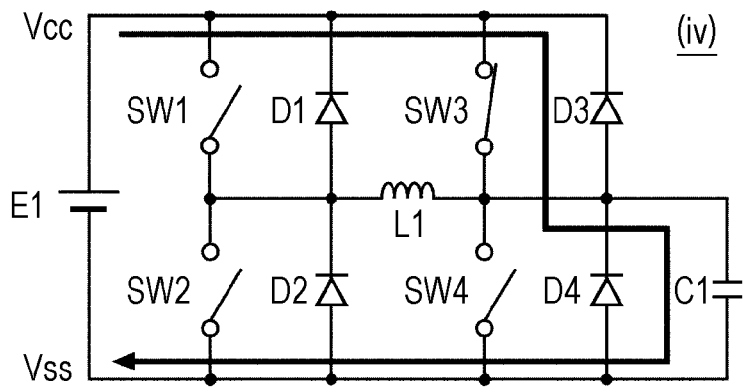

If the gate potential has not reached the first reference potential Vcc even when the energy stored in the coil L1 is exhausted, the clamp current flows through a path from the first reference potential line to the gate terminal of the power switching element P via the first clamp switch SW3, as illustrated in FIG. 27D. When the gate potential reaches the first reference potential Vcc, no clamp current flows, and the gate potential is fixed to the first reference potential Vcc. This state is referred to as "state 4 (iv)".

Next, a description will be given of a case in which the power switching element P is turned off.

Figure 28A:
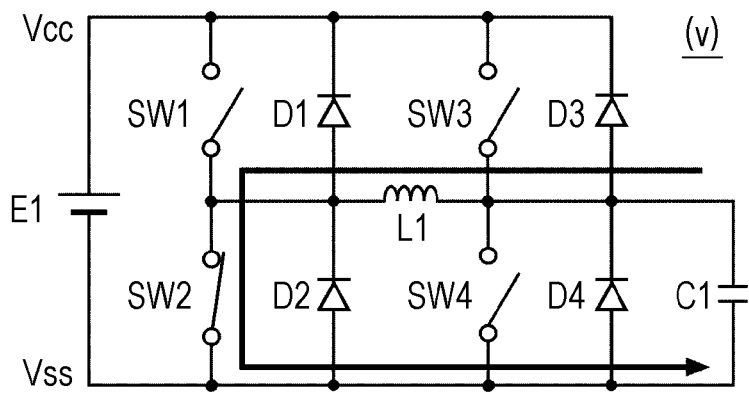
FIGS. 28A to 28D illustrate current paths in control method 2 illustrated in FIG. 26.

First, the control circuit 20 turns on the second recovery switch SW2 to thereby bring about state 5 (v) in which the second recovery switch SW2 is on, and the first recovery switch SW1, the first clamp switch SW3, and the second clamp switch SW4 are off. As illustrated in FIG. 28A, in state 5 (v), the capacitor C1 is discharged, so that energy is stored in the coil L1 by current flowing through the coil L1 and the second recovery switch SW2. As illustrated in FIG. 26, the gate voltage Vgs decreases, and the gate current Ig increases in a negative direction. Since the coil L1 and the capacitor C1 resonate with each other, resonance current flows from the gate terminal of the power switching element P toward the second reference potential line.

Figure 28B:
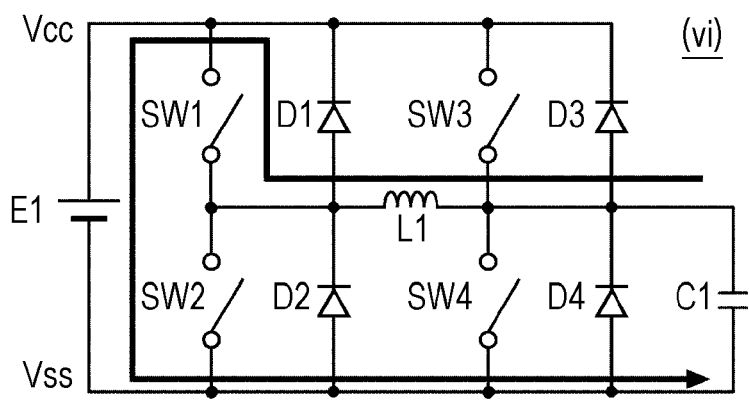

Next, before the gate potential reaches the second reference potential Vss, the control circuit 20 turns off the second recovery switch SW2 to thereby bring about state 6 (vi) in which the first recovery switch SW1, the first clamp switch SW3, the second recovery switch SW2, and the second clamp switch SW4 are off. As illustrated in FIG. 28B, in state 6 (vi), the current generated by the energy stored in the coil L1 causes discharging of the capacitor C1, thereby regenerating the energy in the power source E1 via the first recovery diode D1. That is, the resonance current from the capacitor C1 and the coil L1 regenerates the energy in the power source E1 via the first recovery diode D1.

Figure 28C:
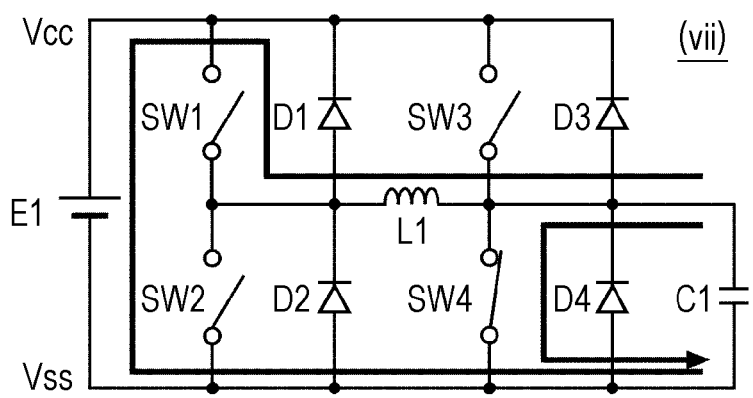

Next, while the resonance current flows, the control circuit 20 turns on the second clamp switch SW4 to thereby bring about state 7 (vii) in which the second clamp switch SW4 is on, and the first recovery switch SW1, the second recovery switch SW2, and the first clamp switch SW3 are off. At the point when the second clamp switch SW4 is turned on, the gate potential has not reached the second reference potential Vss. Thus, as illustrated in FIG. 28C, the resonance current flows from the capacitor C1 to the power source E1 via the coil L1 and the first recovery diode D1, and the clamp current flows from the capacitor C1 to the second reference potential Vss via the second clamp switch SW4. Accordingly, in state 7 (vii), the resonance current and the clamp current simultaneously pull out the electrical charge from the gate terminal.

Figure 28D:
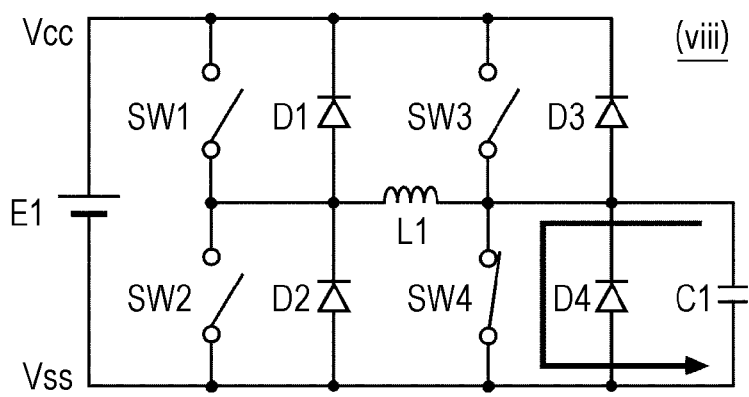

If the gate potential has not reached the second reference potential Vss even when the energy stored in the coil L1 is exhausted, the clamp current flows through a path from the gate terminal to the second reference potential line via the second clamp switch SW4, as illustrated in FIG. 28D. When the gate potential reaches the second reference potential Vss, no clamp current flows, and the gate potential is fixed to the second reference potential Vss. This state is referred to as "state 8 (viii)".

As described above, in control method 2 according to the second embodiment, when the power switching element P is turned on and/or is turned off, there is a period in which the resonance current and the clamp current flow simultaneously to the gate terminal of the power switching element P.

[Control Method 3]

Figure 29:
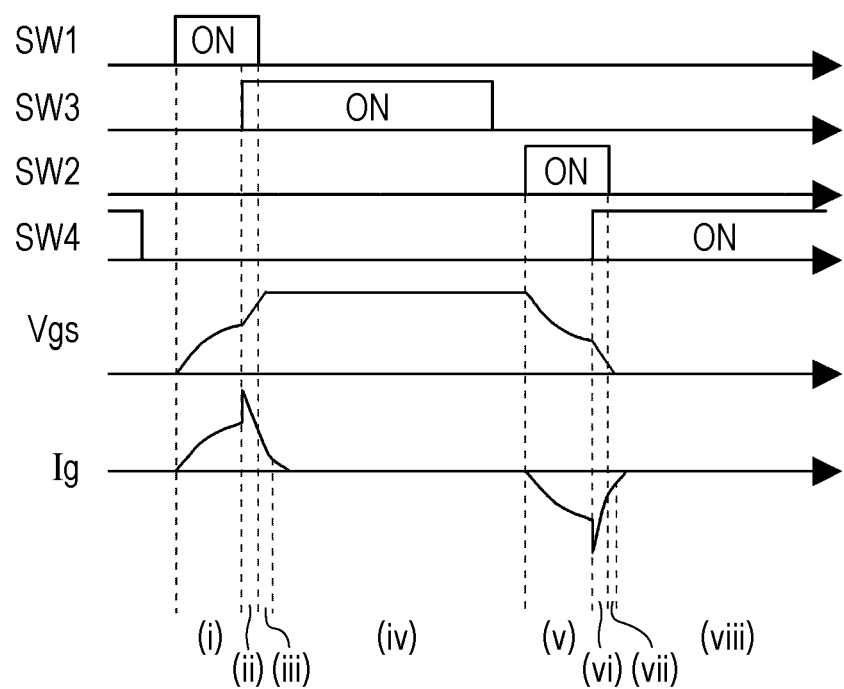
FIG. 29 schematically illustrates one example of control method 3 according to the second embodiment.

FIG. 29 schematically illustrates a second example of the temporal waveforms of control signals input to the respective switches SW1 to SW4, the temporal waveform of the gate voltage Vgs, and the temporal waveform of the gate current Ig according to the second embodiment. FIGS. 30A, 30B, 30C, and 30D illustrate the paths of currents that flow through the gate driver 10 and the input capacitor of the power switching element P in state 1 (i), state 2 (ii), state 3 (iii), and state 4 (iv), respectively, illustrated in FIG. 29. FIGS. 31A, 31B, 31C, and 31D illustrate the paths of currents that flow through the gate driver 10 and the input capacitor of the power switching element P in state 5 (v), state 6 (vi), state 7 (vii), and state 8 (viii), respectively, illustrated in FIG. 29.

A case in which the power switching element P is turned on will be described in connection with FIG. 29.

Figure 30A:
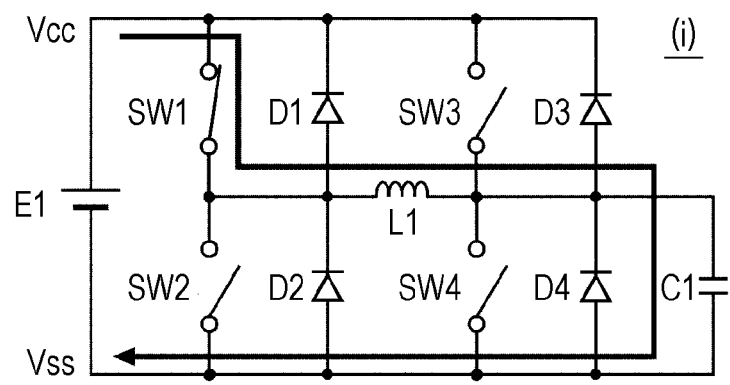
FIGS. 30A to 30D illustrate current paths in control method 3 illustrated in FIG. 29.

First, the control circuit 20 turns on the first recovery switch SW1 to thereby bring about state 1 (i) in which the first recovery switch SW1 is on, and the first clamp switch SW3, the second recovery switch SW2, and the second clamp switch SW4 are off. As illustrated in FIG. 30A, in state 1 (i), current flows from the power source E1 to the coil L1 and the capacitor C1 via the first recovery switch SW1. As a result, energy is stored in the coil L1, and the capacitor C1 is charged.

Figure 30B:
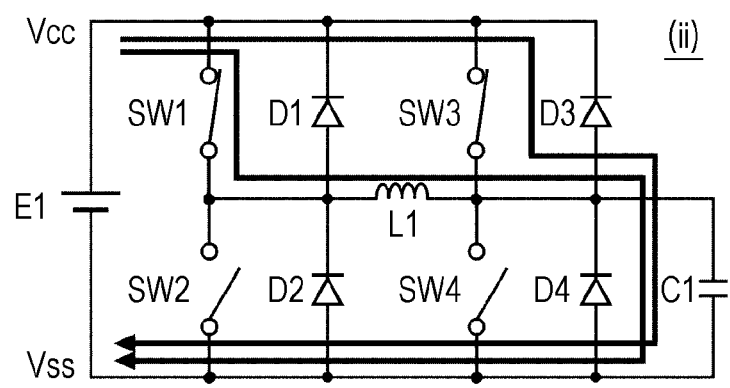

Next, before the gate potential reaches the first reference potential Vcc and before the first recovery switch SW1 is turned off, the control circuit 20 turns on the first clamp switch SW3 to thereby bring about state 2 (ii) in which the first recovery switch SW1 and the first clamp switch SW3 are on and the second recovery switch SW2 and the second clamp switch SW4 are off. As illustrated in FIG. 30B, in state 2 (ii), the resonance current flowing from the power source E1 to the capacitor C1 via the first recovery switch SW1 and the coil L1 and the clamp current flowing from the power source E1 to the capacitor C1 via the first clamp switch SW3 are simultaneously supplied to the gate terminal.

Figure 30C:
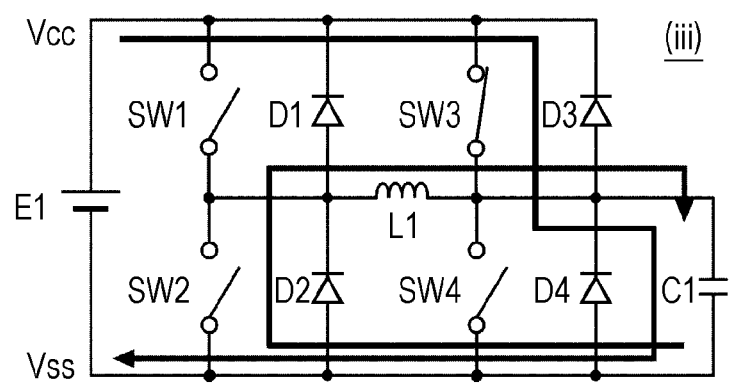

Next, while the resonance current and the clamp current flow, the control circuit 20 turns off the first recovery switch SW1 to bring about state 3 (iii) in which the first clamp switch SW3 is on, and the first recovery switch SW1, the second recovery switch SW2, and the second clamp switch SW4 are off. Since the gate potential has not reached the first reference potential Vcc at the point when the first recovery switch SW1 is turned off, the resonance current and the clamp current are simultaneously supplied to the gate terminal of the power switching element P, as illustrated in FIG. 30C. At the point when the first recovery switch SW1 is turned off, the gate potential may reach the first reference potential Vcc. In this case, the gate current Ig does not flow to the gate terminal.

Figure 30D:
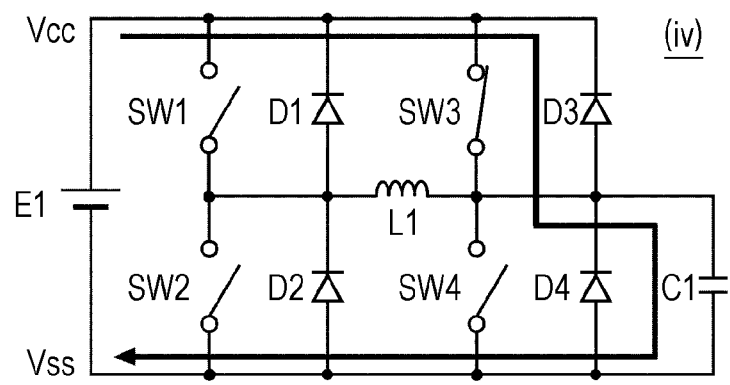

If the gate potential has not reached the first reference potential Vcc even when the energy stored in the coil L1 is exhausted, the clamp current flows through a path from the first reference potential line to the gate terminal of the power switching element P via the first clamp switch SW3, as illustrated in FIG. 30D. When the gate potential reaches the first reference potential Vcc, no clamp current flows, and the gate potential is fixed to the first reference potential Vcc. This state is referred to as "state 4 (iv)".

Next, a description will be given of a case in which the power switching element P is turned off.

Figure 31A:
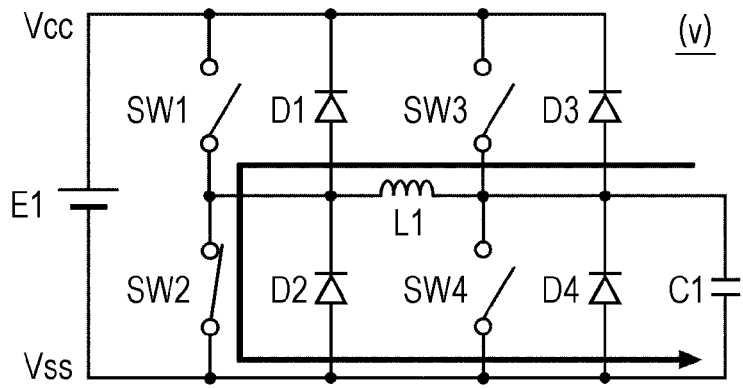
FIGS. 31A to 31D illustrate current paths in control method 3 illustrated in FIG. 29.

First, the control circuit 20 turns on the second recovery switch SW2 to thereby bring about state 5 (v) in which the second recovery switch SW2 is on, and the first recovery switch SW1, the first clamp switch SW3, and the second clamp switch SW4 are off. As illustrated in FIG. 31A, in state 5 (v), the capacitor C1 is discharged, so that energy is stored in the coil L1 by current flowing through the coil L1 and the second recovery switch SW2.

Figure 31B:
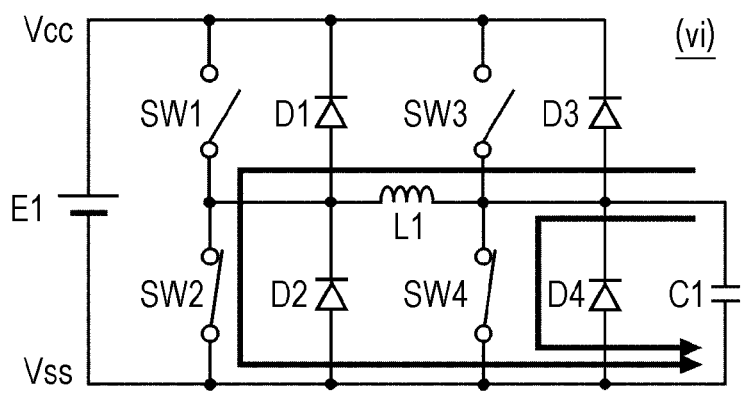

Next, before the gate potential reaches the second reference potential Vss and before the second recovery switch SW2 is turned off, the control circuit 20 turns on the second clamp switch SW4 to thereby bring about state 6 (vi) in which the first recovery switch SW1 and the first clamp switch SW3 are off and the second recovery switch SW2 and the second clamp switch SW4 are on. As illustrated in FIG. 31B, in state 6 (vi), the resonance current flows from the capacitor C1 to the second reference potential line via the coil L1 and the second recovery switch SW2, and the clamp current flows from the capacitor C1 to the second reference potential line via the second clamp switch SW4. Accordingly, in state 6 (vi), the resonance current and the clamp current simultaneously pull out the electrical charge from the gate terminal.

Figure 31C:
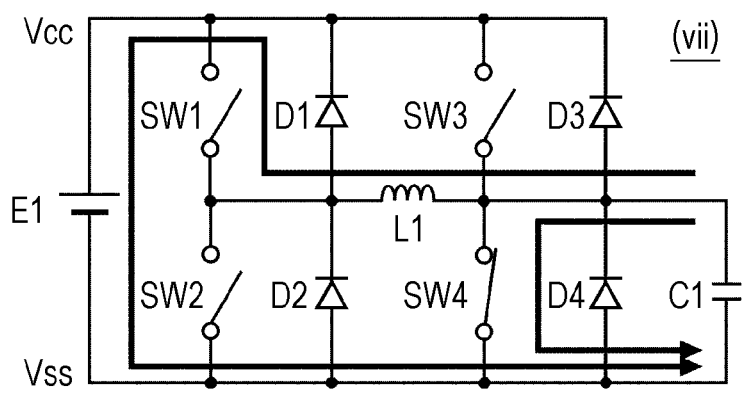

Next, while the resonance current and the clamp current flow, the control circuit 20 turns off the second recovery switch SW2 to thereby bring about state 7 (vii) in which the second clamp switch SW4 is on, and the first recovery switch SW1, the second recovery switch SW2, and the first clamp switch SW3 are off. Since the gate potential has not reached the second reference potential Vss at the point when the second recovery switch SW2 is turned off, the resonance current and the clamp current simultaneously pull out the electrical charge from the gate terminal, as illustrated in FIG. 31C. At the point when the first recovery switch SW1 is turned off, the gate potential may reach the second reference potential Vss. In this case, the gate current Ig does not flow from the gate terminal.

Figure 31D:
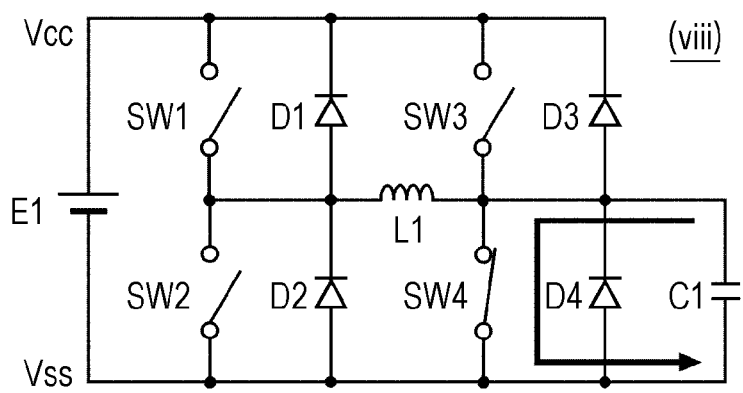

If the gate potential has not reached the second reference potential Vss even when the energy stored in the coil L1 is exhausted, the clamp current flows through a path from the gate terminal to the second reference potential Vss via the second clamp switch SW4, as illustrated in FIG. 31D. When the gate potential reaches the second reference potential Vss, no clamp current flows, and the gate potential is fixed to the second reference potential Vss. This state is referred to as "state 8 (viii)".

Comparison of Consideration Example, Example 2 and Example 3

The description below will be given of comparison of the consideration example illustrated in FIG. 8 with Example 2 of control method 2 and Example 3 of control method 3.

Figure 32:
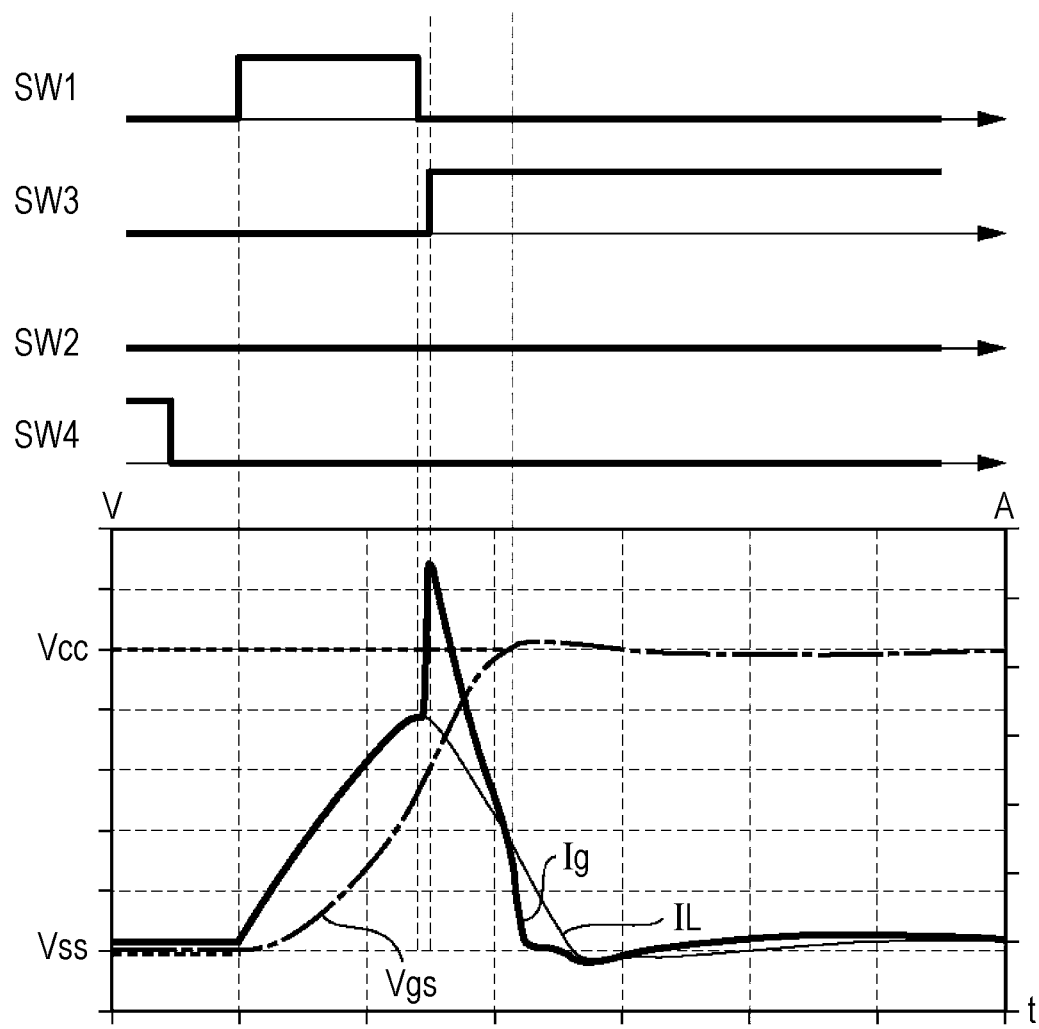
FIG. 32 illustrates a simulation result according to Example 2 of the second embodiment.
Figure 33:
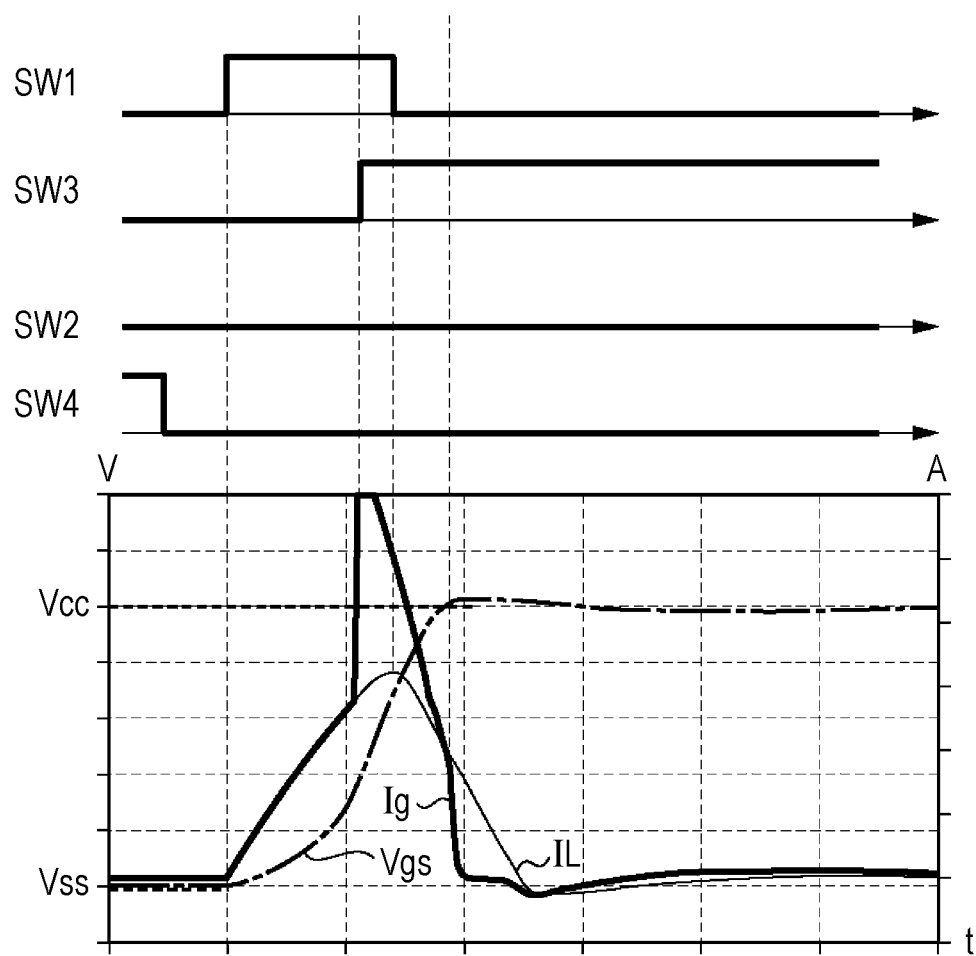
FIG. 33 illustrates a simulation result according to Example 3 of the second embodiment.

FIG. 32 illustrates one example of a simulation result according to Example 2 of the second embodiment. FIG. 33 illustrates one example of a simulation result according to Example 3 of the second embodiment. FIGS. 32 and 33 illustrate relationships of the gate voltage Vgs, the coil current IL, and the gate current Ig. An experiment was performed based on the following premise. A power switching element P to be driven was a power module having a 100 A class drain current Id. The first reference potential Vcc was set to 20 V, and the second reference potential Vss was set to −5 V. The inductance value of the coil L1 was set to hundreds of nanohenries, the resistance value of the gate resistance was set to several ohms, and the capacitance value of the capacitor C1 was set to tens of nanofarads.

Example 2, Example 3, and the consideration example are different from each other in the timing at which the first recovery switch SW1 is turned off and the timing at which the first clamp switch SW3 is turned on. In examples 2 and 3, after the first recovery switch SW1 was turned on and before the gate potential reached the first reference potential Vcc, the control circuit 20 turned off the first recovery switch SW1. In examples 2 and 3, the control circuit 20 turned on the first clamp switch SW3 at a timing that is close to the timing at which the first recovery switch SW1 was turned off. Specifically, in Example 2, after the first recovery switch SW1 was turned off, the control circuit 20 turned on the first clamp switch SW3. In Example 3, before the first recovery switch SW1 was turned off, the control circuit 20 turned on the first clamp switch SW3. In the second embodiment, when turning off the first recovery switch SW1, the control circuit 20 may simultaneously turn on the first clamp switch SW3.

On the other hand, in the consideration example, after the gate potential reached the first reference potential Vcc, the control circuit 20 turned off the first recovery switch SW1 and then turned on the first clamp switch SW3, as illustrated in FIG. 8.

Since the timing at which the first recovery switch SW1 is turned off and the timing at which the first clamp switch SW3 is turned on are different from each other, the waveforms of the gate current Ig in the consideration example, Example 2, and Example 3 differed from each other. In the consideration example, the gate current Ig exhibited its peak value at the point when the gate potential reached the first reference potential Vcc. On the other hand, in examples 2 and 3, before the gate potential reached the first reference potential Vcc, the gate current Ig exhibited its peak value, and at the point when the gate potential reached the first reference potential Vcc, the gate current Ig had already decreased from the peak value.

The gate current Ig in examples 2 and 3 will be described below in more detail. In examples 2 and 3, the rate of increase in the absolute value of the gate current Ig had changed in a plurality of stages, until the absolute value of the gate current Ig reached the maximum peak value. Also, in examples 2 and 3, the rate of increase in the absolute value of the gate current Ig reached its maximum in the stage immediately before the absolute value of the gate current Ig reached the maximum peak value. On the other hand, in the consideration example, the rate of increase in the absolute value of the gate current Ig did not reach its maximum in the stage immediately before the absolute value of the gate current Ig reached the maximum peak value. Also, the maximum peak value of the absolute value of the gate current Ig in examples 2 and 3 became larger than that in the consideration example.

The absolute value of the gate current Ig when the gate potential reaches the first reference potential Vcc may be smaller than two-thirds of the maximum peak value of the absolute value of the gate current Ig. The absolute value of the gate current Ig when the gate potential reaches the first reference potential Vcc may be smaller than a half of the maximum peak value of the absolute value of the gate current Ig. The absolute value of the gate current Ig when the gate potential reaches the first reference potential Vcc may be substantially zero.

In the consideration example and examples 2 and 3, the control circuit 20 controls the on/off states of the first recovery switch SW1, the second recovery switch SW2, the first clamp switch SW3, and the second clamp switch SW4. As a result of the control, the gate voltage Vgs and the gate current Ig are supplied to the gate terminal of the power switching element P. The timings at which the first recovery switch SW1, the second recovery switch SW2, the first clamp switch SW3, and the second clamp switch SW4 are turned on or off may also be determined based on theoretical values or values resulting from an experiment or simulation. Information indicating the timings may also be recorded in the control circuit 20 in advance. Unlike examples 2 and 3, for example, the gate driving apparatus 100 may have a detecting unit for detecting the gate voltage Vgs and/or the gate current Ig. In this case, the detecting unit may feed back the detection value to the control circuit 20. Furthermore, the control circuit 20 may determine the on/off timings of the first recovery switch SW1, the second recovery switch SW2, the first clamp switch SW3, and the second clamp switch SW4, based on the detection values.

Figure 34:
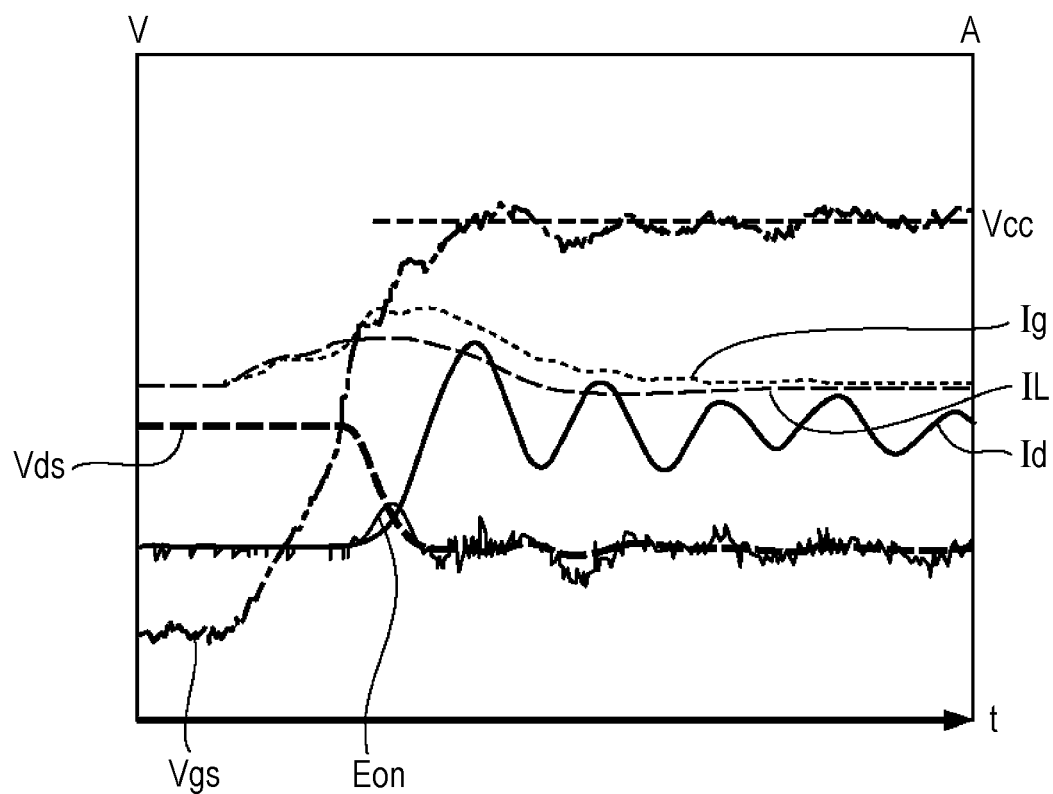
FIG. 34 is a graph illustrating an experimental result according to Example 2 of the second embodiment.

FIG. 34 illustrates details of the experimental result of Example 2 in control method 2 according to the second embodiment. FIG. 34 illustrates relationships of the drain voltage Vds, the drain current Id, and the turn-on loss Eon, in addition to the gate voltage Vgs, the coil current IL, and the gate current Ig. The experimental result illustrated in FIG. 34 corresponds to the simulation result illustrated in FIG. 32.

In FIG. 34, the timing at which the power switching element P is turned on corresponds to the time at which the turn-on loss Eon reaches its maximum. In Example 2 illustrated in FIG. 34, the gate current Ig reaches its maximum peak in the vicinity of the timing at which the power switching element P is turned on. This is thought to be because the resonance current and the clamp current flowed simultaneously to the gate terminal in the vicinity of the timing at which the power switching element P was turned on.

A comparison between the experimental result according to the consideration example illustrated in FIG. 10 and the experimental result according to Example 2 illustrated in FIG. 34 showed that the rate of change in the drain voltage per unit time, $\Delta Vds/\Delta t$, in Example 2 was prominently higher than that in the consideration example. The turn-on loss Eon in Example 2 was prominently smaller than that in the consideration example. The gate-source ringing voltage in Example 2 was slightly lower than that in the consideration example.

As described above, the consideration example and Example 2 differ from each other in the timing at which the first clamp switch SW3 is turned on. The time from when the first recovery switch SW1 is turned on until the first clamp switch SW3 is turned on may be referred to as an "unclamp time". The unclamp time in Example 2 was considerably smaller than that in the consideration example. The ratio of the unclamp time to resonance period in Example 2 was considerably smaller than that in the consideration example. The resonance period T is represented by $2\pi\sqrt{(LC)}$. C indicates a parasitic capacitance between the gate and the source. For example, the capacitance C may also be a total of the gate-source capacitance of the power switching element P and the capacitance of another capacitor. The gate-source capacitance of the power switching element P varies according to a drain voltage Vds in practice, but is defined as a capacitance when the drain voltage Vds is 0 V. The inductance L is also an inductance in a closed loop including the capacitor C. For example, the inductance L is a total of the inductance of the coil L1 and the inductance due to wires in the closed loop. In Example 2, the ratio of the unclamp time to resonance period was set to about 12%.

Figure 35:
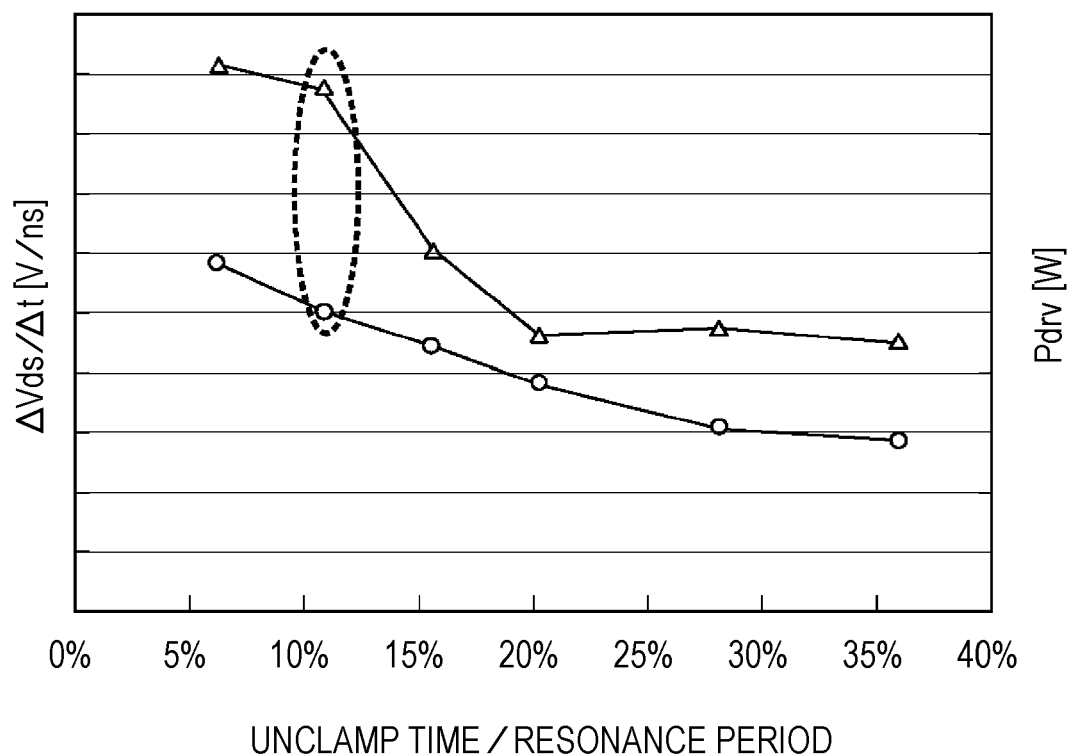
FIG. 35 is a graph illustrating relationships of the ratio of an unclamp time to resonance period, the rate of change in a drain voltage per unit time, and driver loss.

FIG. 35 illustrates one example of relationships of the ratio of the unclamp time to resonance period, the rate of change in the drain voltage per unit time, $\Delta Vds/\Delta t$, and the driver loss Pdrv. A line graph plotted with triangle marks represents the rate of change in the drain voltage per unit time, $\Delta Vds/\Delta t$, and a line graph plotted with circle marks represents the driver loss Pdrv. The rate of change in the drain voltage per unit time, $\Delta Vds/\Delta t$, is one index indicating switching characteristics when the gate driving apparatus 100 switches the power switching element P. Thus, a gate driving apparatus in which the rate of change in the drain voltage per unit time, $\Delta Vds/\Delta t$, is high and the driver loss Pdrv is small is a high-quality gate driving apparatus.

The rate of change in the drain voltage per unit time, $\Delta Vds/\Delta t$, increases as the unclamp time decreases. As the unclamp time decreases, the supply of the clamp current begins at an earlier timing, and thus the gate current Ig increases more rapidly. As a result, the switching characteristics of the power switching element P can be enhanced. In a range in which the ratio of the unclamp time to resonance period was smaller than 20%, the rate of change in the drain voltage per unit time, $\Delta Vds/\Delta t$, increased rapidly as the unclamp time decreased. As the unclamp time decreased, the driver loss Pdrv increased. This is because the earlier the unclamp time was, the more current due to the RC system flowed.

Compared with the consideration example, the rate of change in the drain voltage per unit time, $\Delta Vds/\Delta t$, in Example 2 increased considerably, because the unclamp time was considerably small. The switching characteristics of the power switching element P in Example 2 are better than those in the consideration example. The turn-on loss Eon in Example 2 was considerably smaller than that in the consideration example. The gate-source ringing voltage in Example 2 was lower than that in the consideration example.

According to examples 2 and 3, since the resonance current and the clamp current are simultaneously supplied to the gate terminal of the power switching element P, the maximum peak of the absolute value of the gate current Ig occurs in the vicinity of the timing at which the power switching element P is turned on. Also, the gradient of the gate current Ig becomes largest in the vicinity of the timing at which the power switching element P is turned on. The gradient of the gate current Ig becoming largest means that the rate of change in the gate current per unit time, $\Delta Ig/\Delta t$, becomes largest.

[Effect]

In control methods 2 and 3 according to the second embodiment, the absolute value of the gate current Ig exhibits its peak in the vicinity of the timing at which the power switching element P performs switching. Thus, since the gate current Ig is efficiently used, the switching loss of the power switching element P can be reduced, and the switching speed can be increased. Since the absolute value of the gate current Ig increases at an effective timing, unwanted circulating current or regenerative current is less likely to occur, and the power loss of the gate driving apparatus 100 can be reduced.

In control method 3 according to the second embodiment, the first clamp switch SW3 is turned on before the first recovery switch SW1 is turned off. Accordingly, while the resonance current flowing to the gate terminal of the power switching element P increases, the clamp current begins to flow to the gate terminal. Therefore, the maximum peak of the absolute value of the gate current Ig becomes larger than that in control method 2. As a result, according to control method 3, the rate of change in the gate voltage per unit time, $\Delta Vgs/\Delta t$, in the vicinity of the timing at which the power switching element P is turned on can be further increased, compared with control method 2.

Various Modified Examples of Second Embodiment

The description below will be given of modified examples of the gate driving apparatus 100 according to the second embodiment. Hereinafter, descriptions and illustrations of portions that are the same as or similar to those in the driving apparatus 100 illustrated in FIG. 1 and those of the control method illustrated in FIGS. 26 and 29 may be omitted. For example, FIGS. 13, 15 to 20, 24, and 38 illustrate, of the gate driving apparatus 100, only the gate driver 10 and the input capacitor C1 of the power switching element. For example, the gate driving apparatus 100 illustrated in FIGS. 15 to 20 can be operated by, for example, the control method illustrated in FIGS. 26 and 29.

Control methods 2 and 3 according to the second embodiment can be applied to the gate driving apparatus 100 illustrated in FIGS. 15 to 20, instead of the gate driving apparatus 100 illustrated in FIG. 1. That is, modified examples 1 to 6 of the second embodiment can be implemented by the circuits described above in modified examples 1 to 6 of the first embodiment.

The configuration of a gate driving apparatus 100 in modified example 7 of the second embodiment can be applied to the gate driving apparatus 100 illustrated in FIG. 24, instead of the gate driving apparatus 100 illustrated in FIG. 1. That is, modified example 7 of the second embodiment can be implemented by the circuit described above in modified example 9 of the first embodiment.

Figure 36:
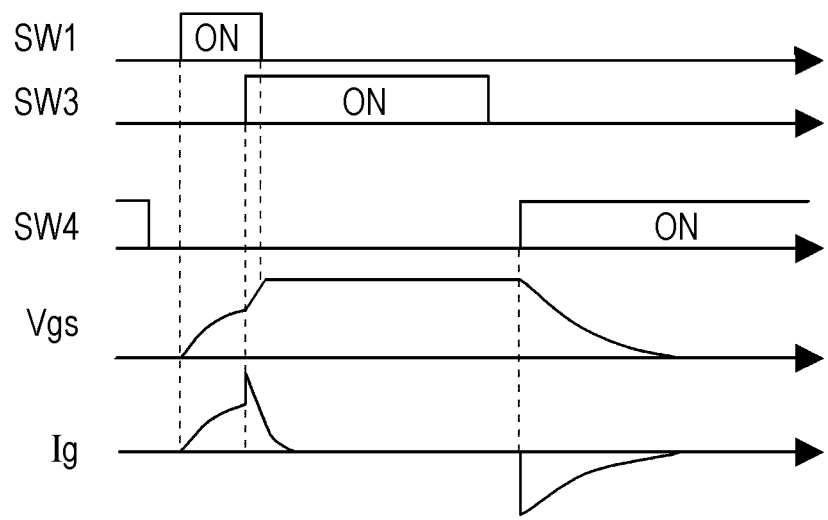
FIG. 36 schematically illustrates one example of a control method according to modified example 7 of the second embodiment.

FIG. 36 schematically illustrates one example of the temporal waveforms of control signals input to the switches SW1, SW3, and SW4, the temporal waveform of the gate voltage Vgs, and the temporal waveform of the gate current Ig according to modified example 7 of the second embodiment. The waveforms of the control signals input to the first recovery switch SW1 and the first clamp switch SW3, the rise waveform of the gate voltage Vgs, and the waveform of the gate current Ig at the time of rising, the waveforms being illustrated in FIG. 36, are analogous to those in the example illustrated in FIG. 29. On the other hand, the waveform of the control signal input to the second clamp switch SW4, the fall waveform of the gate voltage Vgs, and the waveform of the gate current Ig at the time of falling, the waveforms being illustrated in FIG. 36, are different from those in the example illustrated in FIG. 29. Specifically, in modified example 7, after the second clamp switch SW4 is turned on, the fall waveform of the gate voltage Vgs decreases according to an RC time constant. The gate driving apparatus 100 according to modified example 7 may have a configuration in which the first recovery switch SW1 and the second recovery diode D2 are omitted from the gate driving apparatus 100 illustrated in FIG. 1. In this case, the rise waveform of the gate voltage Vgs increases according to the RC time constant.

A gate driving apparatus 100 according to modified example 8 of the second embodiment can be applied to the gate driving apparatus 100 illustrated in FIG. 13, instead of the gate driving apparatus 100 illustrated in FIG. 1.

Figure 37:
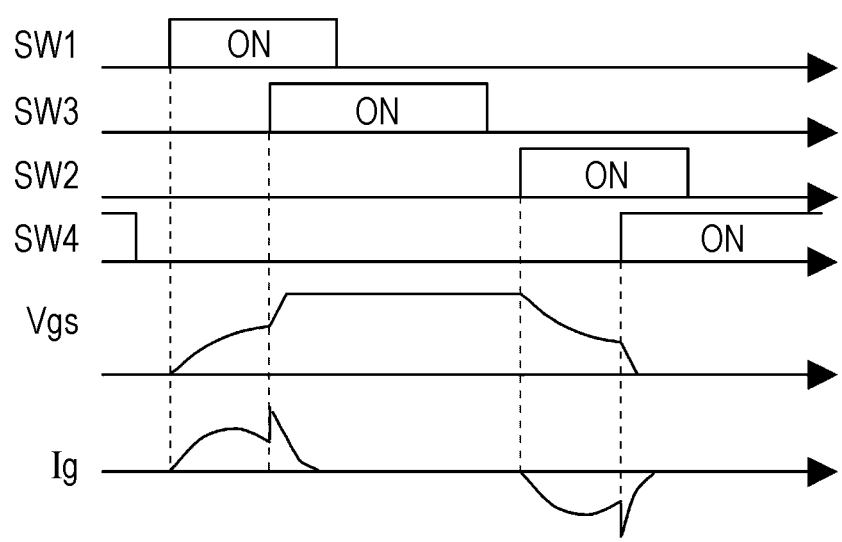
FIG. 37 schematically illustrates one example of a control method according to modified example 8 of the second embodiment.

FIG. 37 schematically illustrates one example of the temporal waveforms of control signals input to the switches SW1 to SW4, the temporal waveform of the gate voltage Vgs, and the temporal waveform of the gate current Ig according to modified example 8 of the second embodiment. In a control method illustrated in FIG. 37, the first clamp switch SW3 is turned on at an earlier timing than that in the control method of the middle voltage method described above. A description will be given of a case in which the power switching element P is turned on. First, the first recovery switch SW1 is turned on, so that energy is stored in the coil L1 and the capacitor C1 is charged. The voltage of the auxiliary power source E2 illustrated in FIG. 13 is a half of the voltage of the power source E1. Thus, when the gate potential reaches the third reference potential, which is a half of the first reference potential Vcc, storage of energy in the coil L1 is completed, so that the energy stored in the coil L1 begins to be released. Thus, the resonance current begins to decrease when the gate potential reaches the third reference potential, regardless of whether the first recovery switch SW1 is turned off. Next, in the vicinity in which the gate voltage Vgs exceeds the threshold voltage Vth, the first clamp switch SW3 is turned on. As a result, charge current flows to the gate terminal. Thus, in the middle voltage method, since no excessive energy is stored in the coil L1 and no excessive resonance current flows, neither unwanted circulating current nor regenerative current flows. A case in which the power switching element P is turned off can also be described in the same manner.

Figure 38:
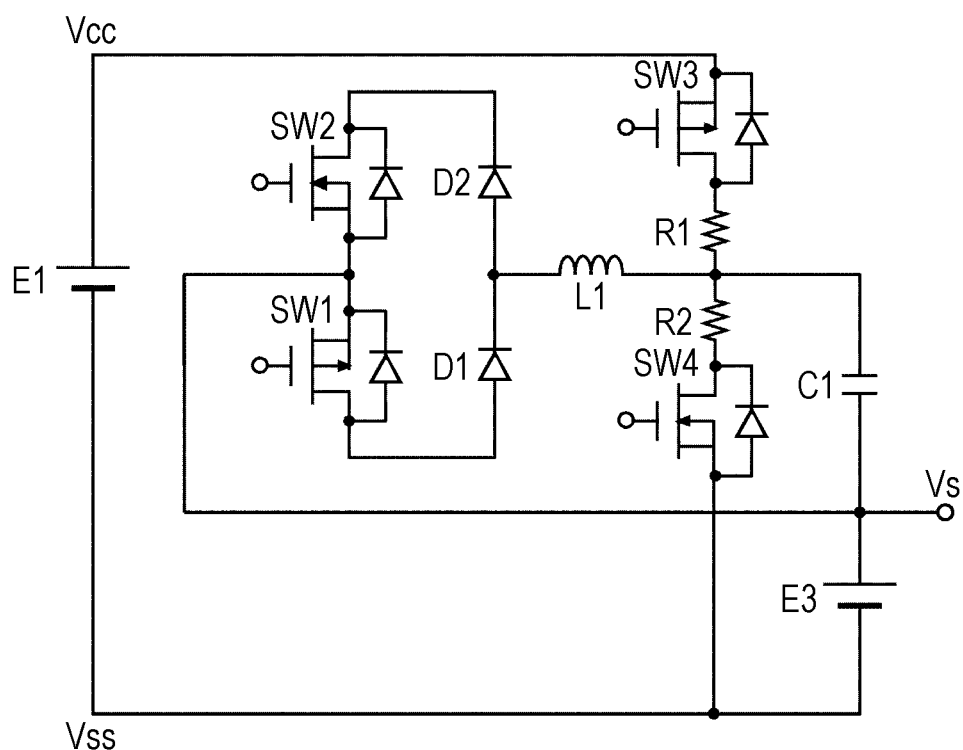
FIG. 38 illustrates the configuration of a gate driving apparatus according to modified example 9 of the second embodiment.

FIG. 38 illustrates the configuration of a gate driving apparatus 100 according to modified example 9 of the second embodiment. In the gate driving apparatus 100 according to modified example 9, the power source E1 of the second reference potential Vss is set to a negative potential. An auxiliary power source E3 is provided between the source terminal of the power switching element P and the second reference potential line. Thus, the potential of the auxiliary power source E3, not the second reference potential Vss from the second reference potential line, is supplied to the source terminal of the power switching element P. Also, a third reference potential line is connected to the auxiliary power source E3 and the source terminal. In the example in FIG. 38, the first reference potential Vcc of the power source E1 may be 20 V, the second reference potential Vss may be −5 V, and the voltage supplied by the auxiliary power source E3 may be 5 V. In this case, the gate driving apparatus 100 according to modified example 9 can apply a gate voltage of −5 V between the gate and the source of the power switching element P. The gate driving apparatus 100 according to modified example 9 can be operated by, for example, the control method illustrated in FIG. 37.

Figure 39:
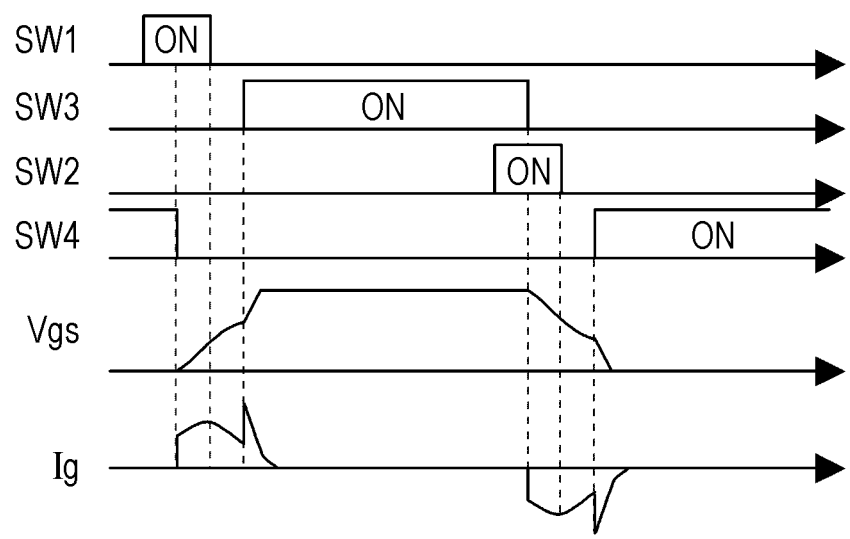
FIG. 39 schematically illustrates one example of a control method according to modified example 10 of the second embodiment.

FIG. 39 illustrates the temporal waveforms of control signals input to the respective switches SW1 to SW4, the temporal waveform of the gate voltage Vgs, and the temporal waveform of the gate current Ig according to modified example 10. A control method in modified example 10 can be applied to, for example, the gate driving apparatus 100 illustrated in FIG. 1. In the control method in modified example 10, the coil L1 is precharged, and then current is supplied to the gate terminal of the power switching element P.

A description will be given of a case in which the power switching element P is turned on. First, the control circuit 20 brings about a state in which the first recovery switch SW1 and the second clamp switch SW4 are on and the second recovery switch SW2 and the first clamp switch SW3 are off. As a result, energy is stored in the coil L1. In this state, the capacitor C1 is not charged. Next, the control circuit 20 turns off the second clamp switch SW4. This initiates charging of the capacitor C1. At this point, since energy has been stored in the coil L1 in advance, the gate current Ig rises earlier. When the power switching element P is turned off, the coil L1 is pre-charged with energy, so that the rising of the gate current Ig in a negative direction occurs earlier. The first recovery switch SW1 may be turned off after the first clamp switch SW3 is turned on.

Of the gate driving apparatuses 100 according to modified examples 1 to 9 of the second embodiment, the gate driving apparatuses 100 in which at least one electrical element is omitted from the configuration of the gate driving apparatus 100 illustrated in FIG. 1 can reduce the circuit area and the cost, compared with the example illustrated in FIG. 1.

Third Embodiment

A power converting circuit according to a third embodiment includes the gate driving apparatus 100 and the power switching element P according to the first or second embodiment. The description below will be given of an example in which the power converting circuit is a DC-DC converter and an example in which the power converting circuit is an inverter. In particular, the DC-DC converter or the inverter is mounted, for example, in a vehicle or an electricity storage system.

Figure 40:
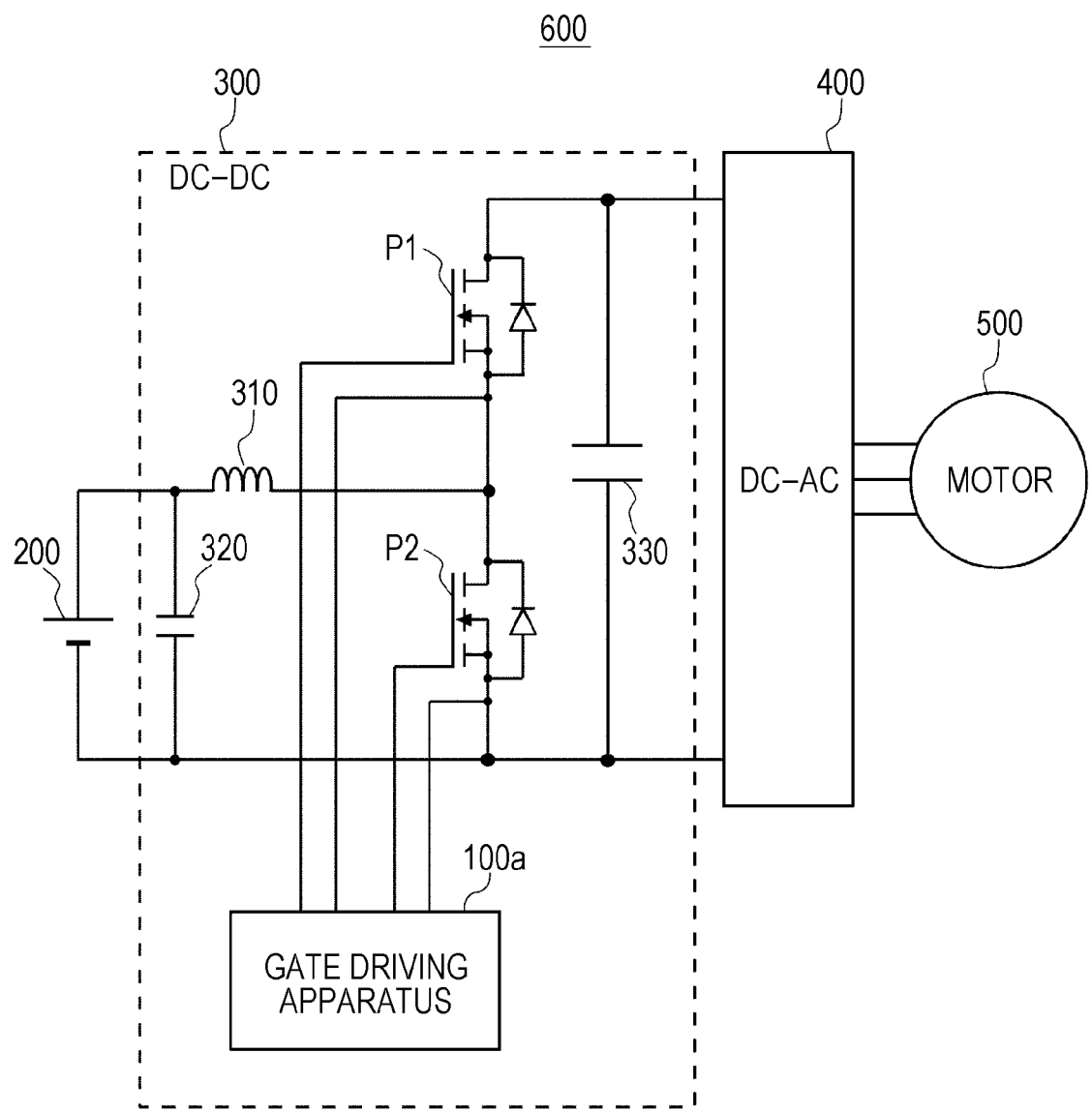
FIG. 40 illustrates a first example configuration of a motor drive system according to a third embodiment.

FIG. 40 illustrates a first example configuration of a motor drive system 600 including the gate driving apparatus 100 according to the first or second embodiment. The motor drive system 600 includes a battery 200, a DC-DC converter 300, an inverter (a DC-AC converter) 400, and a motor 500.

The DC-DC converter 300 has a coil 310, a capacitor 320, a high-side power switching element P1, a low-side power switching element P2, a capacitor 330, and a gate driving apparatus 100a. The high-side power switching element P1 and the low-side power switching element P2 are implemented by, for example, MOSFETs or IGBTs. The high-side power switching element P1 and the low-side power switching element P2 are driven by the gate driving apparatus 100a. The gate driving apparatus 100a is, for example, the gate driving apparatus 100 according to the first or second embodiment described above.

First, a description will be given of a voltage-increasing operation. The gate driving apparatus 100a controls the on/off state of the low-side power switching element P2, so that energy in the battery 200 moves to the capacitor 330 via the coil 310. The voltage of the capacitor 330 is increased relative to the voltage of the battery 200. The increased voltage is converted into an AC voltage by the inverter 400, and then the motor 500 is driven by the AC voltage.

Next, a description will be given of a voltage-reducing operation. AC power generated by the motor 500 is converted into DC power by the inverter 400, and then the DC power is stored in the capacitor 330. The gate driving apparatus 100a performs on/off control on the high-side power switching element P1, so that the energy stored in the capacitor 330 moves to the battery 200 via the coil 310. The voltage of the battery 200 is reduced relative to the voltage of the capacitor 330.

The gate driving apparatus 100a receives control signals from the control circuit 20, and then supplies drive signals to the gate terminals of the high-side power switching element P1 and the low-side power switching element P2. The high-side power switching element P1 and the low-side power switching element P2 are turned on/off by, for example, pulse width modulation (PWM) control.

Figure 41:
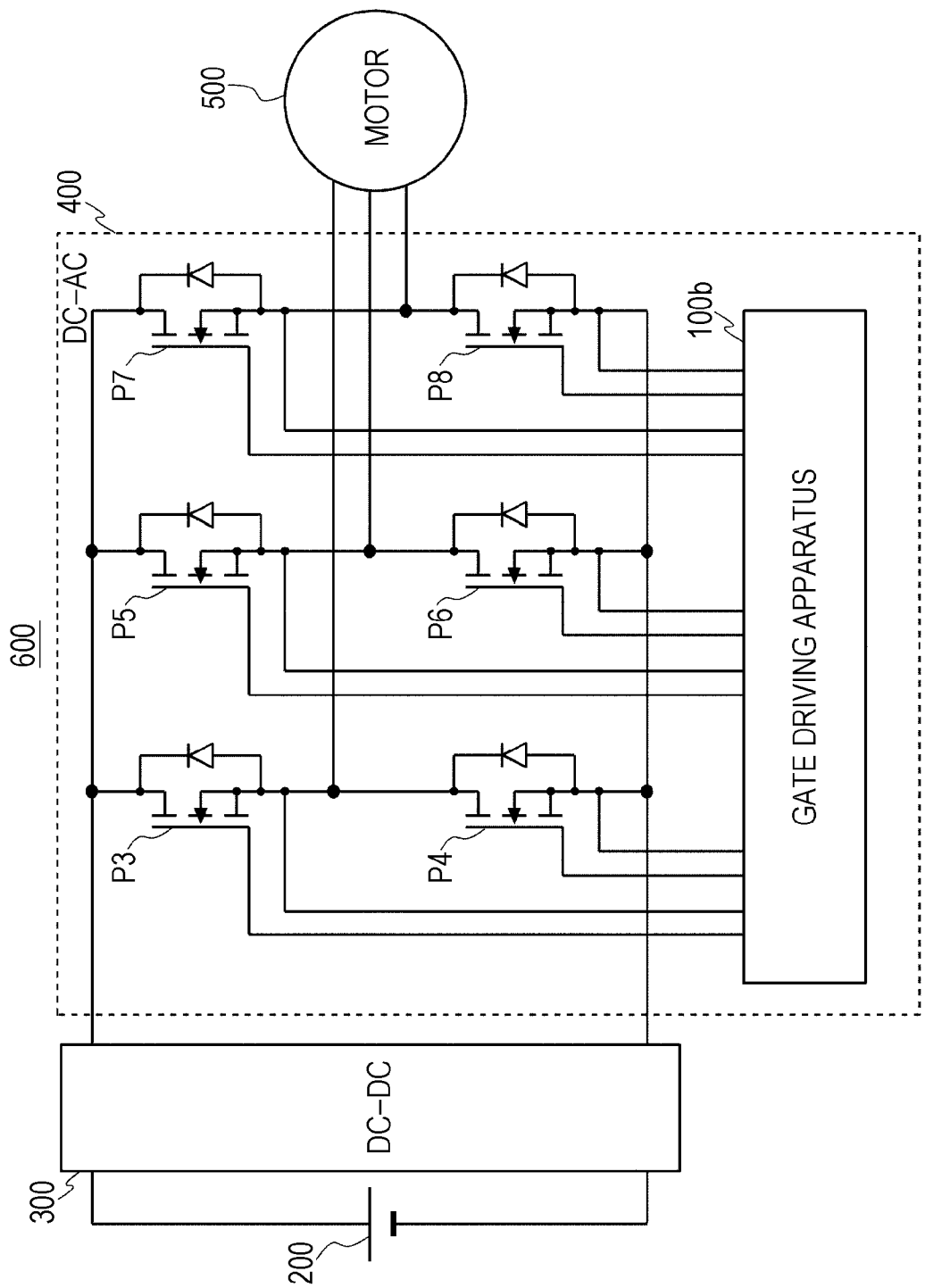
FIG. 41 illustrates a second example configuration of the motor drive system according to the third embodiment.

FIG. 41 illustrates a second example configuration of the motor drive system 600 including the gate driving apparatus 100 according to the first or second embodiment. In the second example configuration, the gate driving apparatus 100 according to the first or second embodiment is included in an inverter 400.

FIG. 41 illustrates an example of a three-phase inverter in which three legs are connected in parallel. The inverter 400 illustrated in FIG. 41 includes a U-phase high-side power switching element P3, a U-phase low-side power switching element P4, a V-phase high-side power switching element P5, a V-phase low-side power switching element P6, a W-phase high-side power switching element P7, a W-phase low-side power switching element P8, and a gate driving apparatus 100b. The six power switching elements P3 to P8 are connected in a three-phase configuration. The six power switching elements P3 to P8, connected in the bridge configuration, are implemented by, for example, MOSFETs or IGBTs. The power switching elements P3 to P8 are driven by the gate driving apparatus 100b. The gate driving apparatus 100b is implemented by, for example, the gate driving apparatus 100 according to the first or second embodiment.

The six power switching elements P3 to P8, connected in the three-phase bridge configuration, are switched in accordance with drive signals supplied from the gate driving apparatus 100b. Through the switching, the six power switching elements P3 to P8 converts DC power, supplied from a DC-DC converter 300, into AC power having a variable voltage and a variable frequency, and then supplies the AC power to a motor 500.

The gate driving apparatus 100b receives PWM control signals from the control circuit 20, and then supplies drive signals to the gate terminals of the six power switching elements P3 to P8 connected in the three-phase bridge configuration. The six power switching elements P3 to P8 are turned on/off by, for example, PWM control.

The first example configuration illustrated in FIG. 40 and the second example configuration illustrated in FIG. 41 can be used in combination. That is, in the motor drive system 600, the DC-DC converter 300 and the inverter 400 may each have the gate driving apparatus 100 according to the first or second embodiment. When the voltage of the battery 200 and the voltage of the inverter 400 are designed to be the same, the DC-DC converter 300 may also be omitted.

Figure 42:
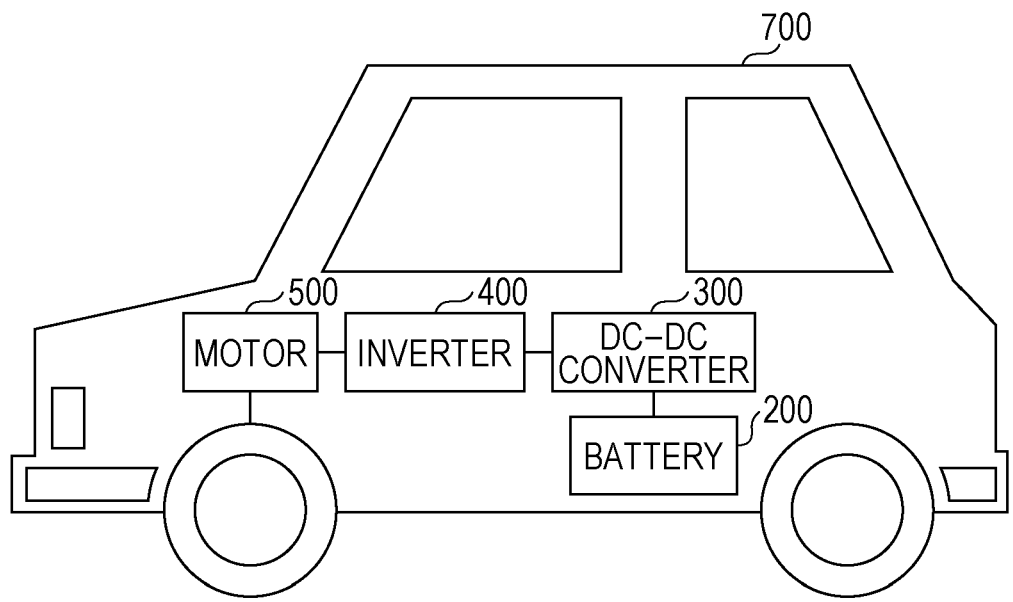
FIG. 42 illustrates an example configuration of a vehicle according to the third embodiment.

FIG. 42 illustrates an example configuration of a vehicle 700 on which the motor drive system 600 illustrated in FIG. 40 or 41 is mounted. The vehicle 700 illustrated in FIG. 42 is, for example, a hybrid vehicle (HV), a plug-in hybrid vehicle (PHV), or an electric vehicle (EV) having the motor 500 for driving. The motor 500 is not limited to a self-propelled high-power motor and may be a drive assisting motor installed in a mild hybrid vehicle. The motor 500 is, for example, a synchronous electric motor.

The vehicle 700 illustrated in FIG. 42 has a battery 200, a DC-DC converter 300, an inverter 400, and a motor 500. The battery 200 may be, for example, a battery, such as a lithium-ion battery or a nickel metal hydride battery. The battery 200, the DC-DC converter 300, the inverter 400, and the motor 500 may have the configuration illustrated in FIG. 40 or 41. When the vehicle 700 has an energy regeneration function during deceleration, the DC-DC converter 300 and the inverter 400 may be a bidirectional DC-DC converter and an inverter.

In the vehicle 700, control signals may also be supplied from an electronic control unit (ECU) to the gate driving apparatus 100a in FIG. 40 or the gate driving apparatus 100b in FIG. 41 via a controller area network (CAN).

Figure 43:
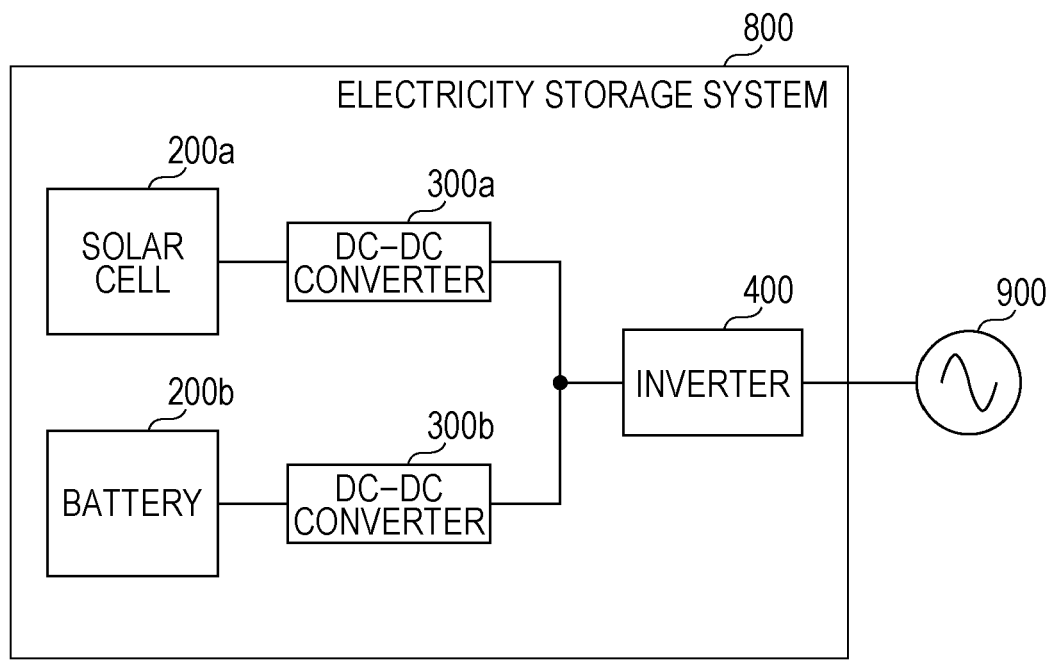
FIG. 43 illustrates an example configuration of an electricity storage system according to the third embodiment.

FIG. 43 illustrates an example configuration of an electricity storage system 800 including the gate driving apparatus 100 according to the first or second embodiment. The electricity storage system 800 illustrated in FIG. 43 includes a solar cell 200a, a battery 200b, a DC-DC converter 300a, a DC-DC converter 300b, and an inverter 400. DC power generated by the solar cell 200a is converted into DC power having a predetermined voltage by the DC-DC converter 300a. The DC power is converted by the inverter 400 into AC power, which is output to a system 900. Alternatively, the DC power is converted by the DC-DC converter 300b into DC power having a voltage for electricity storage, and then the DC power is then stored in the battery 200b.

At least one of the DC-DC converter 300a and the DC-DC converter 300b may be the DC-DC converter 300 having the configuration illustrated in FIG. 40. The inverter 400 may be the inverter 400 having the configuration illustrated in FIG. 41.

The battery 200b and the DC-DC converter 300b may also be omitted. That is, the gate driving apparatus 100 according to the first or second embodiment can be applied to a photovoltaic system that has no electricity storage function. The solar cell 200a and the DC-DC converter 300a may also be omitted. That is, the gate driving apparatus 100 according to the first or second embodiment can be applied to an electricity storage system that has no electricity generation function.

When the motor drive system 600, the vehicle 700, or the electricity storage system 800 includes the gate driving apparatus 100 according to the first or second embodiment, the power consumption of the entire system or the entire apparatus can be reduced. In addition, the switching characteristics of the power switching elements included in the DC-DC converter 300 or the inverter 400 are maintained or enhanced. Accordingly, the operation characteristics of the entire motor drive system 600, the entire vehicle 700, or the entire electricity storage system 800 are maintained or enhanced.

The present disclosure has been described above in conjunction with the particular embodiments. The first to third embodiments are merely exemplary and illustrative. Various modified examples are possible to the components and control processes described above in conjunction with the first to third embodiments. Such modified examples are also encompassed by the present disclosure.

For example, the coil L1 can also be replaced with the parasitic inductor of a wire connected to the gate terminal. In this case, a series resonance circuit is formed.

The first recovery switch SW1 and the second recovery switch SW2 may also be implemented by a single integrated-circuit (IC) chip. The first recovery switch SW1, the second recovery switch SW2, and the coil L1 may also be implemented by a single IC chip.

The present disclosure also includes circuits that can realize the features of the present disclosure, as well as the above-described circuit configurations. For example, the present disclosure also includes a circuit in which an element, such as a switching element (a transistor), a resistance element, or a capacitance element, is connected in series or in parallel, with another element, as far as functions that are the same as or similar to those of the circuit configuration described above are realized. In other words, the expression "connected" in the present disclosure is not limited to a case in which two terminals, or two nodes, are connected in series and also includes a case in which two terminals, ore two nodes, are connected via an element, as far as the same or similar functions can be realized.

For example, a driving apparatus may drive a switching element having a control terminal and may include: a first potential line that applies a first potential; a second potential line that applies a second potential lower than the first potential; a coil having a first terminal and a second terminal, the second terminal being connected to the control terminal of the switching element; a switch connected between the first potential line and the first terminal of the coil to turn on or off an electrical connection between the first potential line and the coil; and a control circuit that outputs control signals for turning on the switch, turning off the switch before a potential of the control terminal of the switching element reaches the first potential, and turning on the switch again.

For example, a driving apparatus may drive a switching element having a control terminal and may include: a first potential line that applies a first potential; a second potential line that applies a second potential lower than the first potential; a coil having a first terminal and a second terminal, the second terminal being connected to the control terminal of the switching element; a switch connected between the second potential line and the first terminal of the coil to turn on or off an electrical connection between the first potential line and the coil; and a control circuit that outputs control signals for turning on the switch, turning off the switch before the potential of the control terminal of the switching element reaches the second potential, and turning on the switch again.

For example, a driving apparatus may drive a switching element having a control terminal and may include: a first potential line that applies a first potential; a second potential line that applies a second potential lower than the first potential; a coil having a first terminal and a second terminal, the second terminal being connected to the control terminal of the switching element; a charging switch connected between the first potential line and the first terminal of the coil to turn on or off an electrical connection between the first potential line and the coil; a clamp switch connected between the first potential line and the control terminal of the switching element to turn on or off an electrical connection between the first potential line and the control terminal of the switching element; a charging diode connected between the second potential line and the first terminal of the coil to pass current from the second potential line to the first terminal of the coil; and a control circuit that outputs a charging control signal for turning on the charging switch and the turning off the charging switch and a clamp control signal for turning on the clamp switch before the potential of the control terminal of the switching element reaches the first potential.

For example, a driving apparatus may drive a switching element having a control terminal and may include: a first potential line that applies a first potential; a second potential line that applies a second potential lower than the first potential; a coil having a first terminal and a second terminal, the second terminal being connected to the control terminal of the switching element; a discharging switch connected between the second potential line and the first terminal of the coil to turn on or off an electrical connection between the second potential line and the coil; a clamp switch connected between the second potential line and the control terminal of the switching element to turn on or off an electrical connection between the second potential line and the control terminal of the switching element; a discharging diode connected between the first potential line and the first terminal of the coil to pass current from the second potential line to the first terminal of the coil; and a control circuit that outputs a charging control signal for turning on the discharging switch and then turning off the discharging switch and a clamp control signal for turning on the clamp switch before a potential of the control terminal of the switching element reaches the second potential.

For example, a driving apparatus may drive a switching element having a control terminal and may include: a first potential line that applies a first potential; a second potential line that applies a second potential lower than the first potential; a third potential line that applies a third potential lower than the first potential and higher than the second potential; a coil having a first terminal and a second terminal, the second terminal being connected to the control terminal of the switching element; a charging switch provided between the third potential line and the first terminal of the coil to turn on or off electrical connection between the third potential line and the coil; a charging diode connected in series with the charging switch between the third potential line and the first terminal of the coil to pass current from the third potential line to the first terminal of the coil; a clamp switch connected between the first potential line and the control terminal of the switching element to turn on or off an electrical connection between the first potential line and the control terminal of the switching element; a clamp switch connected between the first potential line and the control terminal of the switching element to turn on or off an electrical connection between the first potential line and the control terminal of the switching element; and a control circuit that outputs a charging control signal for turning on the charging switch and then turning off the charging switch and a clamp control signal for turning on the clamp switch before a potential of the control terminal of the switching element reaches the first potential.

For example, a driving apparatus may drive a switching element having a control terminal and may include: a first potential line that applies a first potential; a second potential line that applies a second potential lower than the first potential; a third potential line that applies a third potential lower than the first potential and higher than the second potential; a coil having a first terminal and a second terminal, the second terminal being connected to the control terminal of the switching element; a discharging switch connected between the third potential line and the first terminal of the coil to turn on or off an electrical connection between the third potential line and the coil; and a discharging diode connected in series with the discharging switch between the third potential line and the first terminal of the coil to pass current from the first terminal of the coil to the third potential line; a clamp switch connected between the second potential line and the control terminal of the switching element to turn on or off an electrical connection between the second potential line and the control terminal of the switching element; and a control circuit that outputs a charging control signal for turning on the discharging switch and then turning off the discharging switch and a clamp control signal for turning on the clamp switch before a potential of the control terminal of the switching element reaches the second potential.

For example, a driving apparatus may drive a voltage-controlled switching element in accordance with signals generated by resonance and may input signals to a control terminal of the switching element so that an amplitude of a rise waveform of a voltage applied between the control terminal and a reference terminal having a fixed potential is smaller than a voltage obtained by subtracting the voltage applied between the control terminal and the reference terminal before start of resonance from a voltage of a resonance source, an absolute value of current flowing to the control terminal continues to increase from start of switching, the absolute value of the current reaches a maximum peak value in an increasing direction thereof before the voltage applied between the control terminal and the reference terminal reaches a fixed voltage to which that voltage is to be fixed after switching of the switching element, and the absolute value of the current has decreased to a value smaller than the maximum peak value when the voltage applied between the control terminal and the reference terminal reaches the fixed voltage.

For example, a driving apparatus may drive a voltage-controlled switching element in accordance with signals generated by resonance and may input signals to a control terminal of the switching element so that an amplitude of a fall waveform of a voltage applied between the control terminal and a reference terminal having a fixed potential is smaller than a voltage obtained by adding the voltage applied between the control terminal and the reference terminal before start of resonance to a voltage of a resonance source, an absolute value of current flowing to the control terminal continues to increase from start of switching, the absolute value of the current reaches a maximum peak value in an increasing direction thereof before the voltage applied between the control terminal and the reference terminal reaches a fixed voltage to which that voltage is to be fixed after switching of the switching element, and the absolute value of the current has decreased to a value smaller than the maximum peak value when the voltage applied between the control terminal and the reference terminal reaches the fixed voltage.

For example, the driving apparatus may input signals to the control terminal so that the absolute value of the current flowing to the control terminal decreases after reaching the maximum peak value, then increases again to a peak value smaller than the maximum peak value, and then decreases.

For example, the driving apparatus may input signals to the control terminal so that current flowing to the control terminal when the voltage applied between the control terminal and the reference terminal reaches the fixed voltage level has decreased to a value smaller than two-thirds of the maximum peak value.

For example, a driving apparatus may include: a coil connected in series with a control terminal of a voltage-controlled switching element; a first switch provided between a first potential that is one of potentials of a power source of the driving apparatus and an input-side terminal of the coil; and a first diode provided in a reverse direction between a second potential that is another potential of the power source and the input-side terminal of the coil. The driving apparatus may input signals to the control terminal so that an absolute value of current flowing to the control terminal continues to increase from start of switching, the absolute value of the current reaches a maximum peak value in an increasing direction thereof before a voltage applied between the control terminal and a reference terminal having a fixed potential reaches a fixed voltage to which that voltage is to be fixed after switching of the switching element, and the absolute value of the current has decreased to a value smaller than the maximum peak value when the voltage applied between the control terminal and the reference terminal reaches the fixed voltage.

For example, a driving apparatus may include: a coil connected in series with a control terminal of a voltage-controlled switching element; a first switch provided between a first potential that is one of potentials of a power source of the driving apparatus and an input-side terminal of the coil; a first diode provided in a reverse direction between a second potential that is another potential of the power source and the input-side terminal of the coil; and a control circuit that controls the first switch. The control circuit may turn off the first switch after turning on the first switch and before the potential of the control terminal reaches a potential that is the same as the first potential.

For example, in the driving apparatus, the control circuit may turn off the first switch at a point in time that is smaller than or equal to a half of a resonance period T defined by $2\pi (\sqrt{LC})$.

For example, the driving apparatus may further include a second diode provided in a reverse direction between the first potential and an output-side terminal of the coil and a second switch provided between the first potential and the output-side terminal of the coil, and the control circuit may turn on the second switch when a set time passes after the first switch is turned off.

For example, a driving apparatus may drive a voltage-controlled switching element in accordance with signals generated by resonance and may have a period in which resonance current and other current flowing through a path other than a path through which the resonance current flows flow simultaneously to the control terminal of the switching element when the switching element is turned on or turned off.

For example, before an absolute value of the resonance current flowing to the control terminal reaches a maximum peak in an increasing direction thereof, the driving apparatus may begin to pass the other current to the control terminal.

For example, in the driving apparatus, before the voltage of the control terminal reaches a fixed voltage to which a voltage applied between the control terminal and a reference terminal is to be fixed after switching, an absolute value of the current flowing to the control terminal may reach a maximum peak value in the increasing direction thereof.

For example, the driving apparatus may input signals to the control terminal so that a gradient of current flowing to the control terminal has a plurality of stages before the absolute value of the current reaches the maximum peak value in the increasing direction, and the gradient of the current reaches a maximum at a last one of the stages before reaching the maximum peak value.

For example, the driving apparatus may generate the resonance current by using, as a resonance source, a power source that supplies a potential that is the same as a fixed voltage level to which the voltage applied between the control terminal and the reference terminal is to be fixed after switching and may generate the other current by electrically connecting the control terminal and one end of the power source.

For example, a driving apparatus may include: a coil connected in series with a control terminal of a voltage-controlled switching element; a first switch provided between a first potential that is one of potentials of a power source of the driving apparatus and an input-side terminal of the coil; a first diode provided in a reverse direction between a second potential that is another potential of the power source and the input-side terminal of the coil; a second switch provided between the first potential and an output-side terminal of the coil; and a control circuit that controls the first switch and the second switch. The control circuit may turn on the second switch after turning off the first switch and before a voltage of the control terminal reaches the first potential.

For example, a driving apparatus may include: a coil connected in series with a control terminal of a voltage-controlled switching element; a first switch provided between a first potential that is one of potentials of a power source of the driving apparatus and an input-side terminal of the coil; a first diode provided in a reverse direction between a second potential that is another potential of the power source and the input-side terminal of the coil; a second switch provided between the first potential and an output-side terminal of the coil; and a control circuit that controls the first switch and the second switch. The control circuit may turn on the second switch before turning off the first switch and before a voltage of the control terminal reaches the first potential.

For example, the driving apparatus may fix the control terminal to a negative voltage after switching the switching element.

For example, an electric power converter may be an electric power converter that converts input electric power into output electric power and may include at least one voltage-controlled switching element and a driving apparatus that drives the voltage-controlled switching element.

The present disclosure is applicable to, for example, a driving apparatus for a power switching element used for a DC-DC converter or an inverter.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A driving apparatus that drives a switching element including a control terminal, the driving apparatus comprising:
    a first potential line that applies a first potential;
    a second potential line that applies a second potential lower than the first potential;
    a coil including a first terminal and a second terminal, the second terminal being connected to the control terminal of the switching element;
    a charging switch, connected between the first potential line and the first terminal of the coil, to turn on or off an electrical connection between the first potential line and the coil;
    a clamp switch, connected between the first potential line and the control terminal of the switching element, to turn on or off an electrical connection between the first potential line and the control terminal of the switching element;
    a charging diode, connected between the second potential line and the first terminal of the coil, to pass current from the second potential line to the first terminal of the coil; and
    a control circuit that outputs a charging control signal for turning on or off the charging switch and a clamp control signal for turning on or off the clamp switch,
    wherein the charging control signal turns on the charging switch, and then turns off the charging switch before a potential of the control terminal of the switching element reaches the first potential, and
    the clamp control signal turns on the clamp switch after the charging switch is turned on.

2. The driving apparatus according to claim 1, wherein the clamp control signal turns on the clamp switch before a potential of the control terminal of the switching element reaches the first potential.

3. The driving apparatus according to claim 1, wherein the clamp control signal turns on the clamp switch before the charging switch is turned off.

4. The driving apparatus according to claim 1, wherein the clamp control signal turns on the clamp switch after the charging switch is turned off.

5. The driving apparatus according to claim 1, wherein electrical charge is supplied to the control terminal of the switching element through a path via the charging diode and the coil.

6. The driving apparatus according to claim 1, wherein the control circuit provides a period in which current flowing from the first potential line via the clamp switch and current flowing from the coil flow simultaneously to the control terminal of the switching element.

7. The driving apparatus according to claim 1, wherein the switching element further includes a first conductive terminal, a second conductive terminal, and a capacitor between the control terminal and the first conductive terminal; and
    the coil and the capacitor generates resonance current flowing therebetween.

8. The driving apparatus according to claim 7, wherein a relationship given by $t_{ON} < \pi(LC)^{1/2}$ satisfied,
    where C indicates a capacitance of the capacitor, L indicates an inductance of the coil, and $t_{ON}$ indicates a period from when the charging switch is turned on until the charging switch is turned off.

9. The driving apparatus according to claim 1, wherein the switching element further comprises a first conductive terminal and a second conductive terminal; and
    the second potential line is connected to the first conductive terminal of the switching element.

10. The driving apparatus according to claim 1, wherein the switching element further comprises a first conductive terminal and a second conductive terminal; and
    the driving apparatus further comprises an auxiliary power source, provided between the second potential line and the first conductive terminal of the switching element, to set a potential of the first conductive terminal of the switching element higher than a potential of the second potential line.

11. The driving apparatus according to claim 1, wherein the clamp switch is a first clamp switch;
the clamp control signal is a first clamp control signal;
the driving apparatus further comprises
  a discharging switch, connected between the second potential line and the first terminal of the coil, to turn on or off an electrical connection between the second potential line and the coil,
  a second clamp switch, connected between the second potential line and the control terminal of the switching element, to turn on or off an electrical connection between the second potential line and the control terminal of the switching element, and
  a discharging diode, connected between the first potential line and the first terminal of the coil, to pass current from the second potential line to the first terminal of the coil; and
the control circuit further outputs a discharging control signal for turning on or off the discharging switch and a second clamp control signal for turning on or off the second clamp switch,
wherein the discharging control signal turns on the discharging switch, and then turns off the discharging switch before the potential of the control terminal of the switching element reaches the second potential, and
the second clamp control signal turns on the second clamp switch after the discharging switch is turned on.

12. The driving apparatus according to claim 11, wherein the second clamp control signal turns on the second clamp switch before the potential of the control terminal of the switching element reaches the second potential.

13. The driving apparatus according to claim 11, wherein the second clamp control signal turns on the second clamp switch before the discharging switch is turned off.

14. The driving apparatus according to claim 11, wherein the second clamp control signal turns on the second clamp switch after the discharging switch is turned off.

15. An electric power converter that converts input electric power into output electric power, the converter comprising:
  a switching element; and
  the driving apparatus according to claim 1, the driving apparatus driving the switching element.

16. A driving apparatus that drives a switching element including a control terminal, the driving apparatus comprising:
  a first potential line that applies a first potential;
  a second potential line that applies a second potential lower than the first potential;
  a coil including a first terminal and a second terminal, the second terminal being connected to the control terminal of the switching element;
  a discharging switch, connected between the second potential line and the first terminal of the coil, to turn on or off an electrical connection between the second potential line and the coil;
  a clamp switch, connected between the second potential line and the control terminal of the switching element, to turn on or off an electrical connection between the second potential line and the control terminal of the switching element;
  a discharging diode, connected between the first potential line and the first terminal of the coil, to pass current from the second potential line to the first terminal of the coil; and
  a control circuit that outputs a discharging control signal for turning on or off the discharging switch and a clamp control signal for turning on or off the clamp switch,
wherein the discharging control signal turns on the discharging switch, and then turns off the discharging switch before a potential of the control terminal of the switching element reaches the second potential, and
the clamp control signal turns on the clamp switch after the discharging switch is turned on.

17. A driving apparatus that drives a switching element including a control terminal, a first conductive terminal, and a second conductive terminal, the driving apparatus comprising:
  an output terminal connected to the control terminal of the switching element;
  a reference terminal connected to one of the first conductive terminal and the second conductive terminal of the switching element;
  a resonance unit including a power source for resonance; and
  a clamp unit that applies a fixed voltage between the output terminal and the reference terminal,
wherein an amplitude of a rise waveform of a voltage applied between the control terminal and the reference terminal of the switching element is smaller than an absolute value of a voltage obtained by subtracting a voltage applied between the control terminal and the reference terminal before starting of resonance from a voltage of the power source for resonance, and
an absolute value of output current flowing to the output terminal begins to increase when an absolute value of an output voltage applied between the output terminal and the reference terminal begins to increase, the absolute value of the output current reaches a maximum peak before the output voltage reaches the fixed voltage, and the absolute value of the output current decreases to a value smaller than a value of the maximum peak when the output voltage reaches the fixed voltage.

* * * * *